United States Patent [19]
Watanabe et al.

[11] Patent Number: 5,715,684
[45] Date of Patent: Feb. 10, 1998

[54] THERMOELECTRIC CONVERTER

[75] Inventors: Hideo Watanabe, Kawasaki; Yoshihiko Ogawa, Sapporo; Motohiro Sakai, Yokohama; Fumio Hisano, Noboribetsu; Hirohusa Tezuka, Noboribetsu; Fumikazu Kiya, Noboribetsu, all of Japan

[73] Assignee: Thermovonics Co., Ltd., Kanagawa, Japan

[21] Appl. No.: 610,347

[22] Filed: Mar. 4, 1996

[30] Foreign Application Priority Data

Mar. 2, 1995 [JP] Japan ................... 7-043169

[51] Int. Cl.$^6$ ................... F25B 21/02
[52] U.S. Cl. ................... 62/3.2; 62/190; 62/3.7
[58] Field of Search ................... 62/3.2, 3.3, 3.7, 62/190

[56] References Cited

U.S. PATENT DOCUMENTS

| | | |
|---|---|---|
| 3,097,027 | 7/1963 | Mims et al. |
| 3,162,531 | 12/1964 | Yamano et al. |
| 3,635,037 | 1/1972 | Hubert . |
| 3,681,929 | 8/1972 | Schering . |
| 4,634,803 | 1/1987 | Mathiprakasam . |
| 4,828,627 | 5/1989 | Connery . |
| 4,929,282 | 5/1990 | Brun et al. |
| 5,006,505 | 4/1991 | Skertic . |
| 5,040,381 | 8/1991 | Hazen . |
| 5,168,339 | 12/1992 | Yokotani et al. |
| 5,246,504 | 9/1993 | Ohta et al. |
| 5,316,858 | 5/1994 | Higashigaki et al. |
| 5,362,983 | 11/1994 | Yamamura et al. ........ 62/3.3 |
| 5,409,547 | 4/1995 | Watanabe et al. ........ 62/3.7 |

FOREIGN PATENT DOCUMENTS

| | | |
|---|---|---|
| 0 176 671 | 4/1986 | European Pat. Off. . |
| 0 335 213 | 10/1989 | European Pat. Off. . |
| 2-198179 | 8/1990 | Japan . |
| 3-187280 | 8/1991 | Japan . |
| 3-263382 | 11/1991 | Japan . |
| 2 119 170 | 11/1983 | United Kingdom . |

OTHER PUBLICATIONS

Electronics and Communications in Japan, Part 2, vol. 76, No. 1, 1993, pp. 68–79, "Some Considerations on Thermoelectric Cooling Device", Yoshihiko OGAWA et al. (as English translation from Japanese text), (1969).

Energy Conversion, vol. 9, pp. 107–117, "Development of a Modified Cascade Thermoelectric Heat Pump", Peter W. Cowling et al.

Proceedings of the 25th Intersociety Energy Conversion Engineering Conference, vol. 1, (Aug. 12–17, 1990), pp. 192–197, "SP-100 Converter Multicouple Thermoelectric Cell", Richard A. Kull et al.

J. Phys. D: Appl. Phys., vol. 11, 1978, pp. 1319–1329, "Rectangular Monolithic Infinite-Cascade Thermojunctions", T. Lund.

*Primary Examiner*—John M. Sollecito
*Attorney, Agent, or Firm*—Evenson, McKeown, Edwards & Lenahan, P.L.L.C.

[57] ABSTRACT

A thermoelectric converter is composed of a number of p-type semiconductor chips and n-type semiconductor chips arranged side by side and electrically connected in series, a heat-absorbing-side heat conductor arranged on a heat-absorbing side of the p-type and n-type semiconductor chips, a heat-dissipating-side heat conductor arranged on a heat-dissipating side of the p-type and n-type semiconductor chips, and a device for feeding a current to the p-type and n-type semiconductor chips. The current feeding device feeds a current of a density in a current density range selected depending on a thickness of said p-type and n-type semiconductor chips.

9 Claims, 55 Drawing Sheets

THERMOELECTRIC CONVERTER

BACKGROUND OF THE INVENTION a) Field of the Invention

This invention relates to a thermoelectric converter suitable for use in, for example, a thermoelectric cooling device of a thermoelectric refrigerator, a dehumidifier or an air conditioner.

b) Description of the Related Art

Among thermoelectric devices, those capable of cooling a desired object or item upon input of electric energy are called Peltier devices or thermoelectric cooling devices and are used, for example, in compact cool boxes or the like. They are capturing interests as cooling means which do not use any cooling medium, for example, a chlorofluorocarbon such as "Freon" or "Flon".

A conventional thermoelectric cooling device is constructed as illustrated in FIG. 56. Namely, a heat-absorbing-side electrode 102 is arranged above a heat-absorbing-side insulating substrate 100 made of alumina or the like via a heat-absorbing-side solder layer 101. On the heat-absorbing-side electrode 102, a p-type semiconductor chip 103 and an n-type semiconductor chip 104 are both formed.

A heat-dissipating-side electrode 105 is formed so that the p-type semiconductor chip 103 and the n-type semiconductor chip 104 are connected to each other. Above the heat-dissipating-side electrode 105, a heat-dissipating-side insulating substrate 107 made of alumina or the like is provided via a heat-dissipating-side solder layer 106.

A number of such p-type semiconductor chips 103 and n-type semiconductor chips 104 are alternately interposed between the heat-absorbing-side insulating substrate 100 and the heat-dissipating-side insulating substrate 107 and are electrically connected in series.

Feeding of a predetermined current in a predetermined direction across the thermoelectric cooling device causes absorption of heat on a side of the heat-absorbing-side insulating substrate 100 so that cooling takes place around the heat-absorbing-side insulating substrate 100.

On the other hand, dissipation of heat takes place on a side of the heat-dissipating-side insulating substrate 107. External dissipation of heat by heat-sinks or the like therefore induces transfer of heat.

The heat pumping capacity by the thermoelectric cooling device has heretofore been expressed by the following formula (i):

$$Q_{ab} = nST_C I - (\tfrac{1}{2}) I^2 R - K \cdot \Delta T \quad (i)$$

where $Q_{ab}$: Heat pumping capacity (W)

n: Number of semiconductor chips (pieces)

S: Seebeck coefficient (V/K)

$T_C$: Cold side temperature of the semiconductor chips (K)

I: Value of current fed across the thermoelectric cooling device (A)

R: Internal resistance of thermoelectric cooling device (Ω)

K: Coefficient of heat transmission across the thermoelectric cooling device (W/K)

The above formula (i) was however derived from qualitative consideration, and its concept is based on the presumption that the temperature distribution within the chip is linear. Moreover, it is a thermal calculation focused solely on the thermoelectric cooling device, thereby failing to permit the evaluation of performance of the entire system including the thermoelectric cooling device (for example, the system as a thermoelectric refrigerator).

Further, the correlation between the figure of merit (Z) of the thermoelectric cooling device and the maximum value $\phi_{max}$ of the coefficient of performance has been defined by the following formula (ii):

$$\phi_{max} = [T_C/2 - \Delta T/(Z \cdot T_C)]/T_H \quad (ii)$$

where $\phi_{max}$: Maximum of coefficient of performance $T_C$: Cold side temperature of the semiconductor chip (K)

$T_H$: Hot side temperature of the semiconductor chip (K)

Z: Figure of merit of the semiconductor $$Z = S^2 \sigma / k$$

S: Seebeck coefficient

σ: Electrical conductivity k: Thermal conductivity

ΔT: Temperature difference between the cold side and the hot side of the semiconductor chip (K)

Based on the formula (ii), thermoelectric cooling and other cooling systems have been compared in terms of coefficient of performance (COP) as shown in FIG. 57 [see Technical Report (II) of Electric Society of Japan, No. 43]. In the diagram, the coefficients of performance of compression refrigeration, heat absorption system and direct drive heat pump (DDHP) refrigeration are compared assuming that their condensation temperatures and evaporation temperatures are equivalent to the temperatures at the hot and cold junctions of a thermoelectric cooling device.

The diagram however shows nothing more than the upper limit of the theoretical value of coefficient of performance, which the thermoelectric cooling device can take as a discrete device, in other words, under the prerequisite to infinite exchange of heat. The diagram cannot permit the evaluation of performance of the entire system including the thermoelectric cooling device.

In the conventional thermoelectric cooling device, the insulating substrates 100,107 themselves have a large thermal resistance because, as described above, it is made of ceramics such as alumina or the like.

Further, there are a variety of thermal resistances, including the contact thermal resistances at contact interfaces between an heat-absorbing-side heat conductor such as fins (not illustrated) and the heat-absorbing-side insulating substrate 100, the heat-absorbing-side insulating substrate 100 and the heat-absorbing-side solder layer 101, the heat-absorbing-side solder layer 101 and the heat-absorbing-side electrodes 102, the heat-absorbing-side electrodes 102 and the p-type and n-type semiconductor chips 103,104, the p-type and n-type semiconductor chips 103,104 and the heat-dissipating-side electrodes 105, the heat-dissipating-side electrodes 105 and the heat-dissipating-side solder layer 106, the heat-dissipating-side solder layer 106 and the heat-dissipating-side insulating substrate 107, and the heat-dissipating-side insulating substrate 107 and a heat-dissipating-side heat conductor such as fins (not illustrated) as well as thermal resistances of the heat-absorbing-side and heat-dissipating-side heat conductors themselves. The internal temperature difference of the semiconductor chip therefore becomes large beyond necessity, so that the cooling performance and the coefficient of performance are reduced significantly. The coefficient of actual cooling performance is therefore about 50% of the theoretical upper limit shown in FIG. 57 or smaller.

A manufacturer of thermoelectric cooling devices, that is, a device maker is manufacturing a wide variety of thermoelectric cooling devices of various dimensions. Upon designing a thermoelectric refrigerator, for example, it has heretofore been the practice for a user, which designs the thermoelectric refrigerator, to purchase thermoelectric cooling devices of an appropriate dimension and then to calculate inter alia the value of a current to be fed across the commercial thermoelectric devices while using them in combination with other members.

Such conventional thermal calculations do not involve such a design concept that in a system, for example, a thermoelectric refrigerator, heat-related aspects are taken in toto as a transfer (flow) of heat. As mentioned above, the device maker side manufactures thermoelectric cooling chips of various dimensions by conducting their thermal calculations while taking them as discrete thermoelectric cooling devices, while the user side chooses desired ones from such commercial thermoelectric cooling devices and independently performs thermal calculations of the thermoelectric cooling devices so chosen. Accordingly, there has not been any design concept to provide thermoelectric cooling chips which are required to permit most efficient operation of a thermoelectric cooling device as a system. As a consequence, it has not been possible to provide a thermoelectric converter which is suited for use in a system from the standpoint of efficiency.

SUMMARY OF THE INVENTION

An object of the present invention is to eliminate the above-described drawbacks of the conventional art and to provide a thermoelectric converter which can surely obtain a high coefficient of performance (COP) and can facilitate designing of a system.

To achieve the above-described object, the present invention provides a thermoelectric converter composed of a number of p-type semiconductor chips and n-type semiconductor chips arranged side by side and electrically connected in series, a heat-absorbing-side heat conductor arranged on a heat-absorbing side of the p-type and n-type semiconductor chips, a heat-dissipating-side heat conductor arranged on a heat-dissipating side of the p-type and n-type semiconductor chips, and means for feeding a current to the p-type and n-type semiconductor chips, wherein the current feeding means feeds a current of a density in a current density range selected depending on a thickness of the p-type and n-type semiconductor chips. In a preferred embodiment, the current feeding means makes the density of the current higher within the selected current density range when the thickness of the p-type and n-type semiconductor chips is small but makes the density of the current lower within the selected current density range when the thickness of the p-type and n-type semiconductor chips is large.

The present inventors have found the existence of a correlation among three parameters, that is, the thickness of semiconductor chips, the density of a current fed to the semiconductor chips and COP. Based on this finding, it has become possible to surely provide a thermoelectric converter having a high level of efficiency, that is, of 0.6 or greater in terms of COP by feeding a current of a density in a current density range selected depending on a thickness of the p-type and n-type semiconductor chips, specifically, by making the density of the current higher within the selected current density range when the thickness of the p-type and n-type semiconductor chips is small but by making the density of the current lower within the selected current density range when the thickness of the p-type and n-type semiconductor chips is large.

According to the present invention, it is possible to easily determine the thickness of semiconductor layers and the density of a current required to obtain a desired COP as a thermoelectric converter by ascertaining the relationship among the thickness of the semiconductor chips, the density of the current fed to the semiconductor chips and COP. This has made it simpler to design a system, thereby enabling to perform designing with economy in view.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE INVENTION AND PREFERRED EMBODIMENTS

Figure 5:
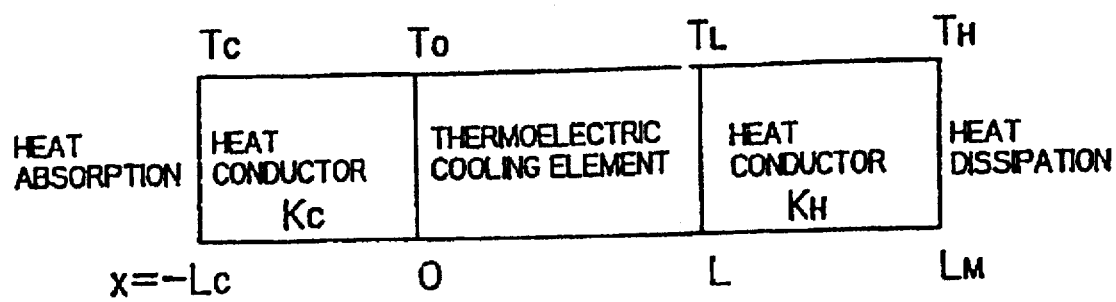
FIG. 5 is a block diagram showing an outline construction of the thermoelectric converter.

FIG. 5 is a block diagram showing a basic construction of a thermoelectric converter. As is illustrated in this drawing, the thermoelectric converter is constructed of a thermoelectric cooling device, and a heat-absorbing-side heat conductor (the heat conductor on the left-hand side as viewed in the direction toward the drawing) and a heat-dissipating-side heat conductor (the heat conductor on the right-hand side as viewed in the direction toward the drawing) joined to opposite sides of the thermoelectric cooling device, respectively. The thermoelectric converter is designed to absorb heat on the left-hand side and to dissipate heat on the right-hand side by using the Peltier effect.

It is now assumed that in the construction as described above, the cross-sectional area of the thermoelectric cooling device is used as a unit cross-sectional area (1 cm$^2$) and also that the respective heat conductors have thermal conductances ($K_C$ on the heat-absorbing side, $K_H$ on the heat-dissipating side) per unit cross-sectional area of the semiconductor.

Assuming also that the temperatures at the respective positions along x-axis in the drawing are as follows:

$T_C$ at $\chi = -L_C$,
$T_O$ at $\chi = 0$,
$T_L$ at $\chi = L$, and
$T_H$ at $\chi = L_H$.

the heat conduction formula in a steady state is given by:

$$\kappa(d^2T/d\chi^2) = J \cdot [d(\alpha T)/d\chi] - J^2/\sigma - d\kappa/d\chi \cdot dT/d\chi \quad (1)$$

and the heat flux $J_Q$ ($\chi$) is given by:

$$J_Q(\chi) = \alpha JT - \kappa(dT/d\chi) \quad (2)$$

where $\chi$: Thermal conductivity [W/(cm·deg)]
$\alpha$: Seebeck coefficient (V/deg) (negative in the case of n-type but positive in the case of p-type)
$\sigma$: Electrical conductivity (S/cm)
J: Current density (A/cm$^2$) (negative in the case of n-type)

Assuming further that in formula (1), $$\alpha T = -(\beta T + |E_F/q|) \quad (3)$$

($\beta = 2k_B/|q|$, $E_F$: Fermi energy, $k_B$: Boltzmann's constant, q: electron charge) and also that $\kappa$ and $\sigma$ are constant, the formula (1) can be converted to the following linear differential equation:

$$\kappa(d^2T/d\chi^2) = \beta J_O dT/d\chi - J_O^2/\sigma, \quad (4)$$

where $J_O = -J$

The general solution of the equation (4) can be expressed by the following formula:

$$T = \kappa/(\beta^2\sigma) + J_O\chi/(\beta\sigma) - C_1\kappa/(\beta J_O) + C_2 exp\ (\beta J_O\chi/\kappa) \quad (5)$$

where $C_1, C_2$: integration constants.

On the other hand, formula (2) can be rewritten as follows:

$$J_Q(\chi) = -\alpha J_O T - \kappa J_O/(\beta\sigma) - C_2\beta J_O exp(\beta J_O\chi/\kappa) \quad (6)$$

For a passive heat conductor portion, the following formulae can be established:

$$\kappa(d^2T/d\chi^2) = 0 \quad (7)$$

$$J_Q(\chi) = -\kappa(dT/d\chi) \quad (8)$$

The following general solutions are obtained by using $C_3$ and $C_4$ as integration constants:

$$T = C_3\chi + C_4 \quad (9)$$

$$J_Q(\chi) = -\kappa C_3 \quad (10)$$

Boundary conditions will then be introduced. Assuming $\kappa = \kappa_C$ when $-L_C \leq \chi \leq 0$, $$T = (T_O - T_C)\chi/L_C + T_O \quad (11)$$

$$J_Q(0) = \kappa_C(T_C - T_O)/L_C \quad (12)$$

Assuming $\kappa = \kappa_H$ when $L \leq \chi \leq L_H$, $$T = \{(T_H - T_L)\chi - T_HL + T_LL_H\}/(L_H - L) \quad (13)$$

$$J_Q(L) = \kappa_H(T_L - T_H)/(L_H - L) \quad (14)$$

When $0 \leq \chi \leq L$, $$T_O = \kappa/(\beta^2\sigma) - C_1\kappa/(\beta J_O) + C_2 \quad (15)$$

$$T_L = \kappa/(\beta^2\sigma) + J_OL/(\beta\sigma) - C_1\kappa/(\beta J_O) + C_2 exp(\beta J_OL/\kappa) \quad (16)$$

$$J_Q(0) = -\{\alpha T_O + \kappa/(\beta\sigma) + C_2\beta\} \times J_O \text{ heat pumping capacity} \quad (17)$$

$$J_Q(L) = -J_O\{\alpha T_L + \kappa/(\beta\sigma) + C_2\beta exp(\beta J_OL/\kappa)\} \quad (18)$$

From formulas (15) and (16), $$C_2 = B\{T_L - T_O - J_OL/(\beta\sigma)\},$$

where $B = 1/\{exp\ (\beta J_OL/\kappa) - 1\}$ $$C_1 = \beta J_O/\kappa\{\kappa/(\beta^2\sigma) + C_2 - T_O\} \quad (19)$$

Now assuming $$F_O = (-\alpha + B\beta)J_O + \kappa_C/L_C$$

$$G_o = \kappa_c T_c/L_c + J_o\{\kappa/(\beta\sigma) - BJ_oL/\sigma\}$$

$$F_L = \{-\alpha - \beta(1+B)\}J_o - \kappa_H/(L_H-L)$$

$$G_L = -\kappa_H T_H/(L_H-L) + J_o\{\kappa/(\beta\sigma) - J_oL(1+B)/\sigma\} \quad (20)$$

The temperatures at the opposite ends of the thermoelectric cooling element can be expressed as follows:

$$D = F_o F_L + (\beta J_o)^2 B(1+B)$$

$$T_o = (F_L G_o + B\beta J_o G_L)/D$$

$$T_L = (F_o G_L - (1+B)\beta J_o G_o)/D \quad (21)$$

The input power density P is represented by the following formula:

$$P = J_o^2 L/\sigma + |\alpha|J_o(T_L - T_o) \quad (22)$$

The COP is expressed as follows:

$$COP = J_Q(0)/P \quad (23)$$

whereby various necessary values can be determined.

It was then confirmed whether a temperature determined in accordance with formula (5) was in conformity with an actual value. Semiconductor chips of 3×3 mm² in cross-sectional area and 10 mm in height were assembled in a π (pi) form and the current density J was controlled at 44.4 A/cm². The temperature on a side wall of the semiconductor chip was then measured by a non-contact thermometer of the infrared detection type.

The followings are conditions such as physical properties of the semiconductors used:

| | |
|---|---|
| Seebeck coefficient: | 205 µV/K |
| Thermal conductivity: | 0.0115 W/(cm · K) |
| Electrical conductivity: | 600 S/cm |
| $K_C$: | 0.1 W/(°C · cm²) |
| $K_H$: | 1 W/(°C · cm²) |
| $T_C$: | 4.18° C. |
| $T_H$: | 35° C. |

Figure 6:
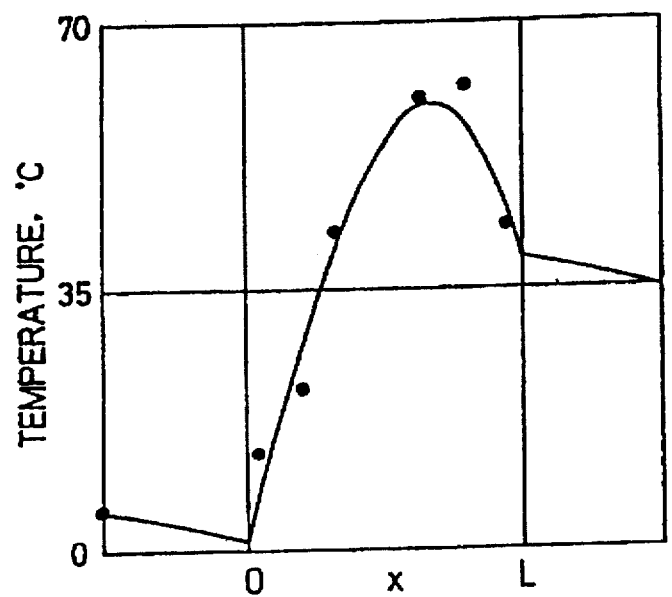
FIG. 6 is a characteristic diagram illustrating a simulated temperature distribution in comparison with an actually-measured temperature distribution with respect to the thermoelectric converter.

The results of the above comparison are diagrammatically shown in FIG. 6, in which the solid curve indicates the temperature distribution inside the thermoelectric cooling chip as simulated in accordance with the formula (5) and the dots are plots of values actually measured. It is envisaged that the present theory conforms well with the actual measurement values.

$K_C$ and $K_H$ in the above-described model are defined as will be described next.

$K_C, K_H$: The thermal conductances of the heat conductors arranged on the heat-absorbing and heat-dissipating sides, respectively. These conductances are conductances per unit cross-sectional area of semiconductors of a thermoelectric cooling device. For example, where the conductance of whole fins between the low-temperature side of the heat-absorbing-side heat conductor and the external air is 5 W/°C. and the total cross-sectional area of the semiconductor chips is 2 cm², $K_C$ is 2.5 (=5/2) W/(°C.·cm² ).

The efficiency employed in a thermoelectric converter system is the coefficient of performance (COP). This COP is defined by the ratio of the heat pumping capacity $J_Q$ achieved by a cooling portion to input power P as indicated above by formula (23) [COP=$J_Q$/P].

In a conventional domestic electric refrigerator of the compressor type which uses "Flon" gas as a cooling medium and has a capacity of 90 liters, the input power and the heat pumping capacity are 70.5 W and 42.3 W, respectively, on average under severe conditions in summer that the ambient temperature of the refrigerator is 30° C. The coefficient of performance, COP, is therefore 42.3/70.5=0.6. In winter that the ambient temperature of the refrigerator is 15° C., the heat pumping capacity is 19.9 W, that is, smaller than a half of the heat pumping capacity in summer. The refrigerator therefore requires less input power, so that it is sufficient to choose, as a target, COP=0.6—which is the value for summer during which the ambient conditions are severe—or greater.

If the coefficient of performance COP is 0.6 or greater in the thermoelectric cooling device, the thermoelectric cooling device can be used as a replacement cooling system for a compressor electric refrigerator which uses "Flon" gas. This replacement cooling system has the advantages that the use of "Flon" becomes no longer necessary and a refrigerator reduced in dimensions, weight, noise and the like can be provided.

Suitable examples of processes for obtaining semiconductors include conventional sintering processes including unidirectional cold pressing and subsequent sintering, spark plasma sintering, cold isostatic pressing (CIP) and subsequent sintering; crystallization by zone melting; crystallization by the Czochralski method; crystallization by the Bridgemann method; and extrusion. These processes make it possible to provide an average figure of merit Z of 2.5×10⁻³ (/K) or greater.

The thickness (average value) t of the semiconductors may suitably range from about 0.03 to 0.5 cm as will be demonstrated subsequently in Examples. Although the upper and lower limits of this thickness t are not strict, thicknesses smaller than about 0.03 cm tend to result in cracking and/or chipping upon fabrication or handling of semiconductors. Thicknesses greater than about 0.5 cm, on the other hand, lead to higher fabrication cost and are hence not preferred.

Certain specific embodiments of the present invention will next be described with reference to the corresponding drawings.

The thermoelectric refrigerator making use of the thermoelectric cooling devices according to the first embodiment of the present invention will first be described with reference to FIG. 1 to FIG. 4.

Figure 1:
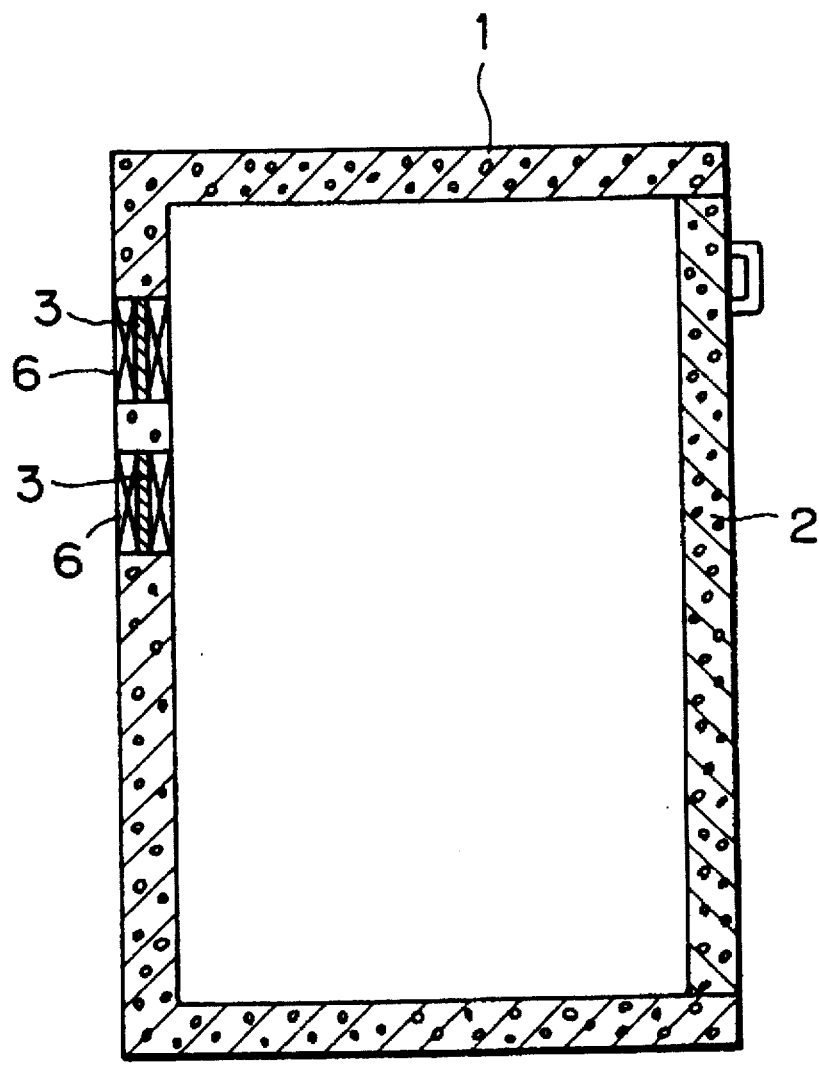
FIG. 1 is a simplified cross-sectional view of a thermoelectric refrigerator making use of thermoelectric converters according to a first embodiment of the present invention.

As is depicted in FIG. 1, the thermoelectric refrigerator is equipped with a cabinet 1, which is made of a heat-insulating material such as foamed urethane resin, and a door 2 made of a similar heat-insulating material and openably arranged in a side wall of the cabinet 1. In a part of an upper rear wall of the cabinet 1, there are accommodated the thermoelectric converters which pertain to the first embodiment of the present invention and are designated at numeral 3.

Figure 2:
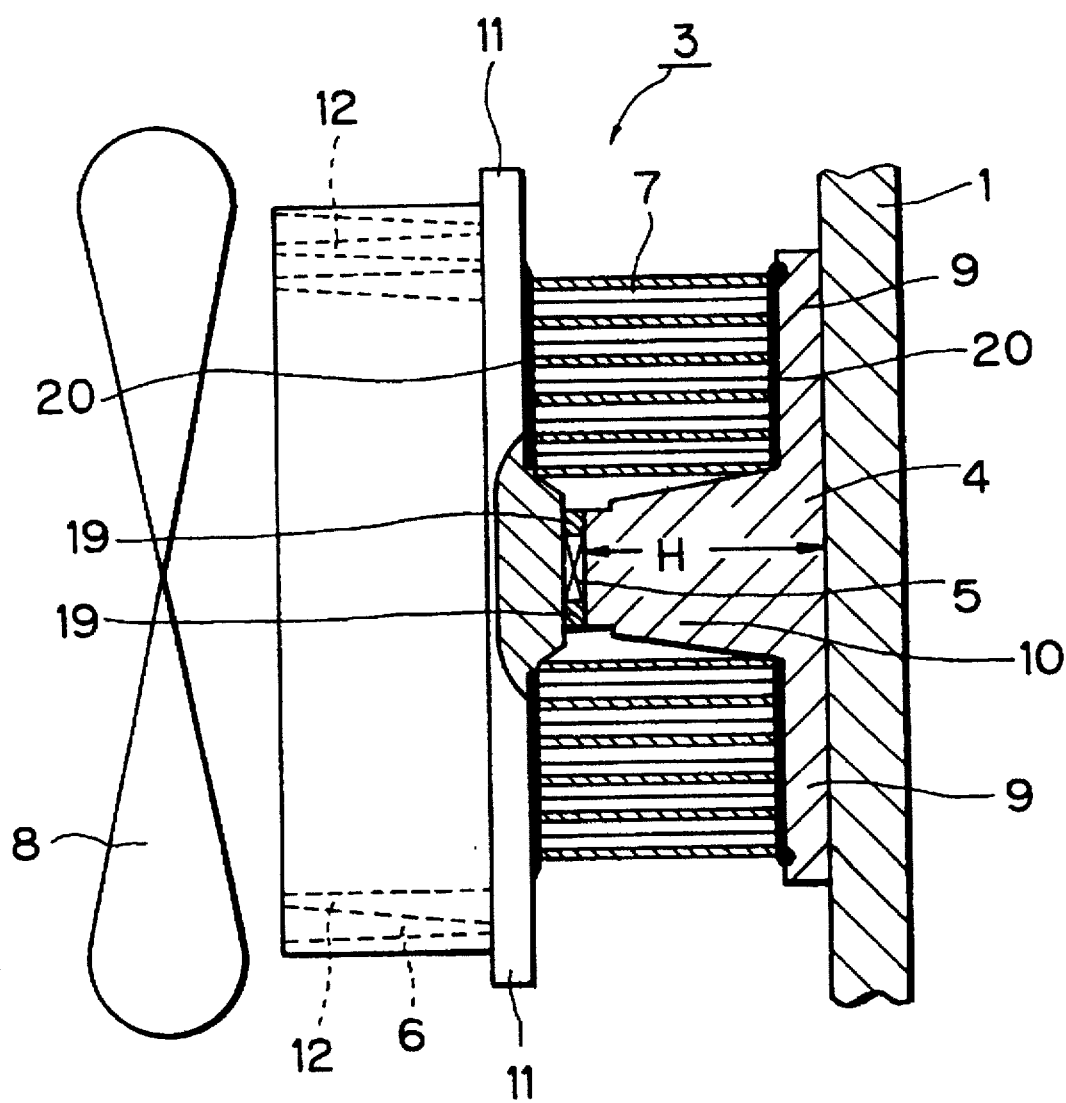
FIG. 2 is an enlarged fragmentary cross-sectional view of one of the thermoelectric converters.

Each thermoelectric converter 3 is, as shown in FIG. 2, constructed primarily of a heat absorber 4, heatsinks 6, a series of thermoelectric cooling chips 5 interposed between the heat absorber 4 and the heatsinks 6, a support 7 and a fan 8.

The heat absorber 4 is made of aluminum and, to form a large area of contact with the side of the cabinet 1, is provided with flange portions 9 on opposite sides thereof. A trapezoidal portion 10 is centrally formed to permit mounting of the thermoelectric cooling element series 5 thereon. To minimize return of a stream of heat from the heatsinks 6 by convection and/or radiation, the heat absorber 4 has a predetermined height H so that the above-described flange portion 9 is located apart from the flange portions 11 of the heatsinks 6.

The flange portions 11 are arranged on the side of the heatsinks 6 and are provided on a side of the fan 8 with fins 12 which have been formed by bending a metal sheet in a zig-zag pattern and extend at right angles relative to the flange portions, whereby a sufficient heat-dissipating area is provided.

Figure 3:
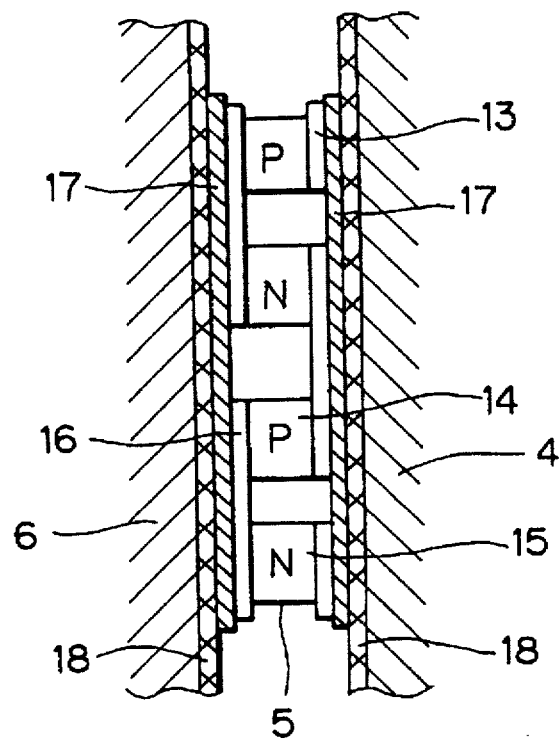
FIG. 3 is an enlarged cross-sectional view of a series of thermoelectric cooling devices used in the thermoelectric converter.
Figure 4:
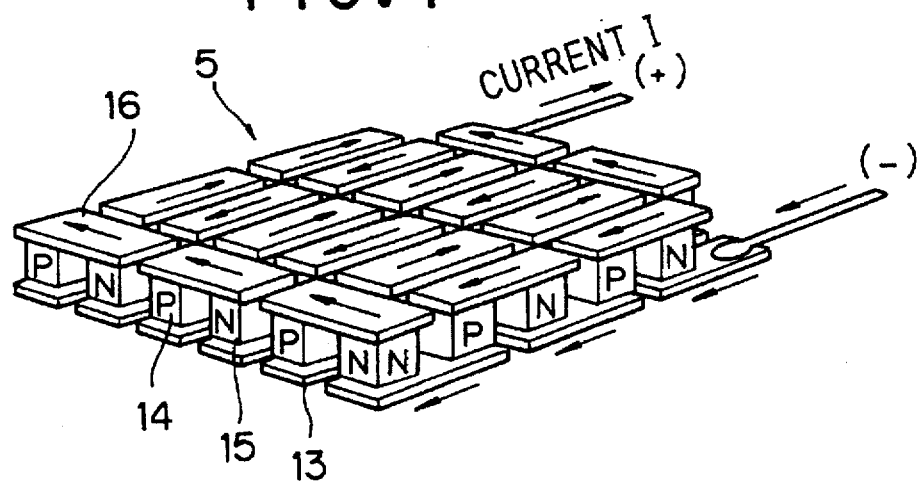
FIG. 4 is an enlarged perspective view of the thermoelectric cooling device (chip series) used in the thermoelectric converter.

The thermoelectric cooling chip series 5 is constructed, as depicted in FIG. 3 and FIG. 4, of heat-absorbing-side electrodes 13 arranged at predetermined intervals, p-type semiconductor chips 14 and n-type semiconductor chips 15 formed, for example, in the form of bulks or films (thick films or thin films) on the electrodes, and heat-dissipating-side electrodes 16 connecting the p-type semiconductor chips 14 and the n-type semiconductor chips 15 together. The numerous p-type semiconductor chips 14 and n-type semiconductor chips 15 are thermally arranged in parallel and are electrically connected in series as depicted in FIG. 4.

As has been described above, insulating substrates such as those made of alumina ceramics are not used in the first embodiment, and the heat-absorbing-side electrodes 16 are exposed on one side and the heat-dissipating-side electrodes 13 on the other side.

High thermal-conductivity silicone grease layers 17,17 are formed between the individual thermoelectric cooling element series 5 and the heat absorber 4 and between the individual thermoelectric cooling chip series 5 and the heatsinks 6, respectively, as shown in FIG. 3.

The silicone grease of the silicone grease layers 17 can suitably be a silicone grease formed of a base oil and not smaller than 50 wt. % of a fine filler consisting of fine particles (average particle size: 10 µm or smaller) of an inorganic compound such as silica, alumina or zinc oxide or a metal such as silver, copper or aluminum. The thermal conductivity of each silicone grease layer 17 in which a filler is dispersed and contained at such a high content is as high as $6.0 \times 10^{-3}$ cal/(cm·sec·°C.) or more and, compared with $3 \times 10^{-4}$ cal/(cm·sec·°C.) of ordinary silicone grease, is higher by decimal placing or even more. The silicone grease layers 17 retain good elasticity and stickiness over a wide temperature range of from −55° C. to 200° C.

An extremely thin (for example, about 3 to 20 µm), electric insulating layer 18 made of anodized aluminium is formed on at least one side of each of the heat absorber 4 and heatsinks 6, said one side facing the thermoelectric cooling chip series 5.

Anodized aluminium is generally formed by anodization or the like. Numerous concave holes are formed extending from a surface of the electric insulating layer (alumite layer) 18 toward the inside thereof. Although the insulating property of the electrical insulating layer 18 is not lowered to any substantial extent even after the concave holes are formed in a large number, the existence of the concave holes as are is practically equivalent to the formation of air layers between the heat absorber 4 and heatsinks 6 and the thermoelectric cooling chip series 5, respectively, so that the thermal resistance becomes extremely high, resulting in a low thermal conductivity.

To overcome this problem, a sealant such as nickel acetate is caused to penetrate into the concave holes in this embodiment so that the thermal conductivity is improved. Preferably, the concave holes should entirely be filled up by the sealant. Penetration of the sealant into the concave holes to a certain extent can substantially reduce the air layers so that improvements in thermal conductivity can be observed. Further, formation of a film of the sealant on the surface of each electric insulating layer 18 (alumite layer) assures close contact with the associated silicone grease layer 17 so that the thermal conductivity is improved further.

Instead of each of silicone grease layers 17, it is also possible to interpose an adhesive having good thermal conductivity, for example, a heat-conducting filler compound such as a silicone-base heat-conducting gel produced by Dow Corning Toray Silicone Co., Ltd. [thermal conductivity: $1.8 \times 10^{-3}$ cal/(cm·sec·°C.), for example].

As is illustrate in FIG. 2, each thermoelectric chip series 5 held between the heat absorber 4a and the heatsinks 6 is circumferentially sealed gas and liquid tight by a sealant layer 19. Usable examples of the sealant for the sealant layer 19 include epoxy resins, vinyl resins, amide resins, fluorocarbon resins, silicone resins and rubbers. Employed in the first embodiment is an epoxy resin containing 20–65 wt. % (preferably 30–60 wt. %) of fine hollow glass beads dispersed uniformly therein. These fine hollow glass beads have a diameter of 20–130 µm, a wall thickness of 0.5–2 µm and an average specific gravity of 0.1–0.4. The epoxy resin containing the fine hollow glass beads has a very low thermal conductivity of $1 \times 10^{-4}$ cal/(cm·sec·°C.).

Between the flange portions 9 of the heat absorber 4 and the flange portions 11 of the heatsinks 6, the support 7 is interposed. The support 7 has a honeycomb structure and is made of a material having practically no elasticity and low thermal conductivity, for example, a water-repellant-treated paper, a synthetic resin or a ceramic. The support 7 and the flange portions 9,11 are integrally bonded by adhesive layers 20, respectively. Usable illustrative adhesives for the adhesive layers 20 include those of the epoxy resin, vinyl resin, amide resin, polyester resin, and rubber types. In this embodiment, an adhesive of the epoxy resin type is used.

FIG. 7 through FIG. 33 diagrammatically illustrate areas of 0.6 and greater in COP determined through experiments by changing $K_C$ and the density of a current to be fed to the semiconductor layer in the thermoelectric converter shown in FIG. 2.

In these experiments, the following conditions were all kept unchanged.

| Material of the semiconductors | Bi-Te base material |
|---|---|
| Cross-section of each semiconductor (chip) | 0.14 cm × 0.14 cm |
| Number of used semiconductors (chips) | 1,106 (chips, 508 pairs) |
| Seebeck coefficient (S) | 205 µV/deg |
| Electrical conductivity (σ) | 1,020 S/cm |
| Thermal conductivity (κ) | 0.0144 W/(cm · deg) |
| Average figure of merit of semiconductors (Z) | $3.0 \times 10^{-3}$/K |
| Heat-absorbing-side temperature (inside-air temperature of the refrigerator) ($T_C$) | 5° C. |
| Heat-dissipating-side temperature (ambient temperature) ($T_H$) | 30° C. |

FIG. 7 through FIG. 11 each diagrammatically shows an area of 0.6 and greater in COP by shading as determined by setting the thickness t of semiconductors (chips) at 0.03 cm (FIG. 7), 0.08 cm (FIG. 8), 0.16 cm (FIG. 9), 0.3 cm (FIG. 10) or 0.5 cm (FIG. 11) in a thermoelectric converter (hereinafter abbreviated as "the A-type thermoelectric converter") with heat-exchanging capacity, which had been reduced on a heat-absorbing side by setting a heat-dissipating-side thermal conductance ($K_H$) at a value 0.53 times as much as a heat-absorbing-side thermal conductance ($K_C$), and empirically determining a relationship between the thermal conductance ($K_C$) of the heat-absorbing-side heat conductor per cm² semiconductor cross-sectional area and the density of a current (J) fed to the semiconductors.

FIG. 12 through FIG. 16 each diagrammatically shows an area of 0.6 and greater in COP by shading as determined by setting the thickness t of semiconductors (chips) at 0.03 cm (FIG. 12), 0.08 cm (FIG. 13), 0.16 cm (FIG. 14), 0.3 cm (FIG. 15) or 0.5 cm (FIG. 16) in a thermoelectric converter (hereinafter abbreviated as "the B-type thermoelectric converter") with a heat-dissipating-side thermal conductance ($K_H$) set at a value 2.67 times as much as a heat-absorbing-side thermal conductance ($K_C$) and determining a relationship between the thermal conductance ($K_C$) of the heat-absorbing-side heat conductor and the density of a current (J) fed to the semiconductors.

FIG. 17 through FIG. 21 each diagrammatically shows an area of 0.6 and greater in COP by shading as determined by setting the thickness t of semiconductors (chips) at 0.03 cm (FIG. 17), 0.08 cm (FIG. 18), 0.16 cm (FIG. 19), 0.3 cm (FIG. 20) or 0.5 cm (FIG. 21) in a thermoelectric converter (hereinafter abbreviated as "the C-type thermoelectric converter") with heat-exchanging capacity, which had been enhanced on a heat-dissipating side by setting a heat-dissipating-side thermal conductance ($K_H$) at a value 13.4 times as much as a heat-absorbing-side thermal conductance ($K_C$), and determining a relationship between the thermal conductance ($K_C$) of the heat-absorbing-side heat conductor and the density of a current (J) fed to the semiconductors.

Figure 7:
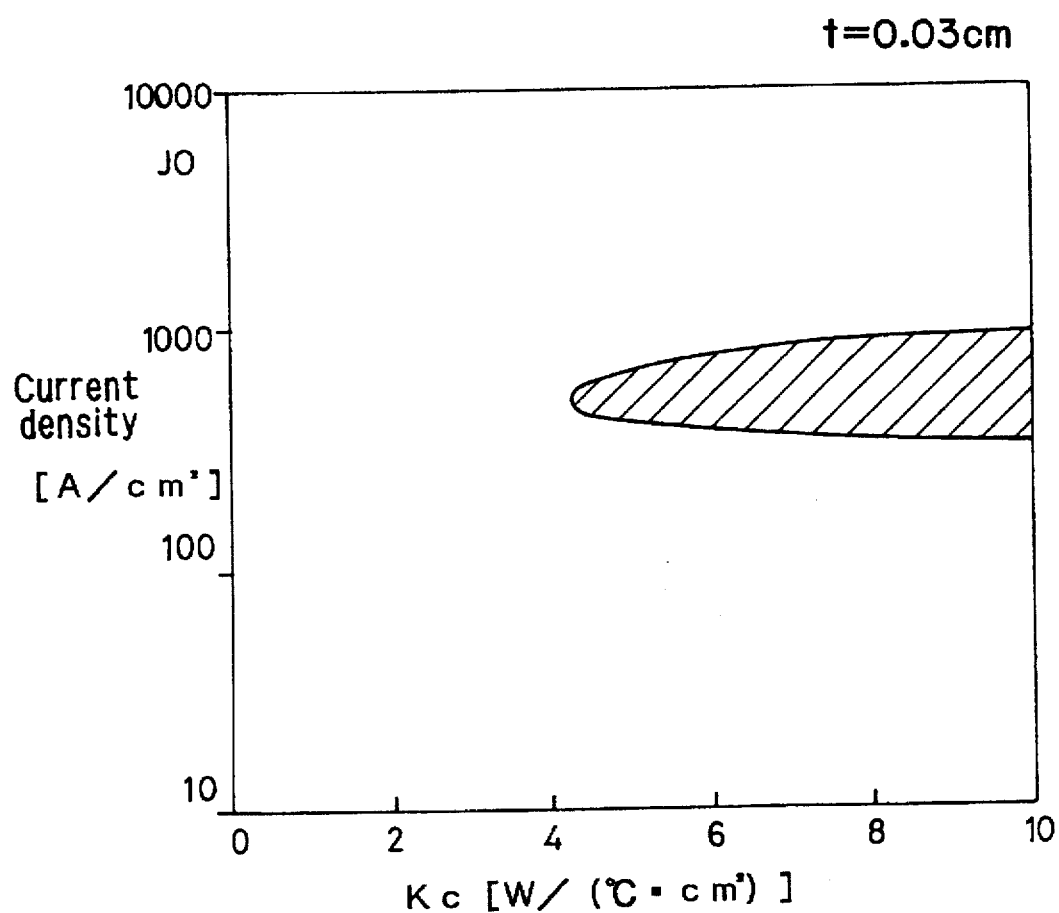
FIG. 7 is a characteristic diagram showing a relationship between $K_C$ and current density at a semiconductor thickness of 0.03 cm in an A-type thermoelectric converter.

As is evident in FIG. 7, for example, a current density of 200 A/cm² gives a COP smaller than 0.6 even if semiconductors having a thickness (t) of 0.03 cm are used and $K_C$ of a thermoelectric converter is 6 W/(°C.·cm²). When the current density is raised to 400 to 800 A/cm², COP surely increases to 0.6 or greater. A further rise in the current density however results in a COP smaller than 0.6.

Figure 8:
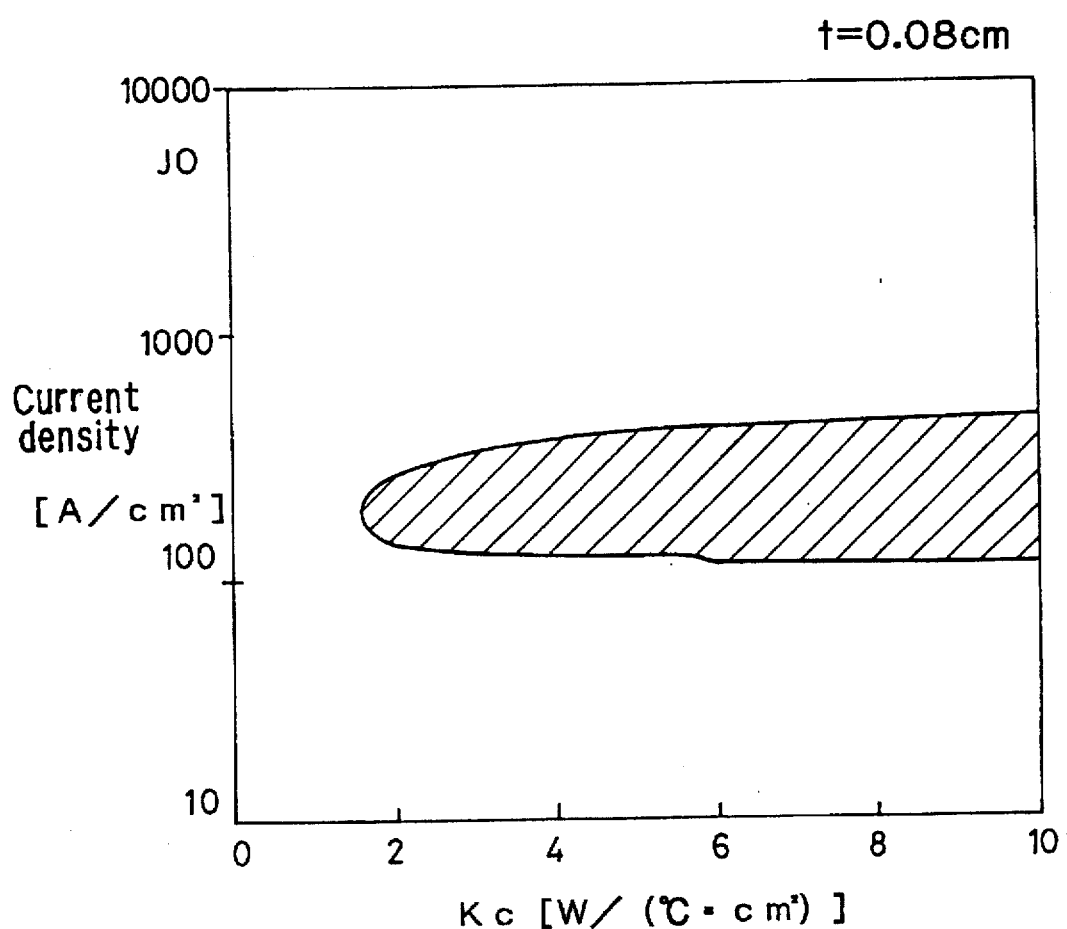
FIG. 8 is a characteristic diagram showing a relationship between $K_C$ and current density at a semiconductor thickness of 0.08 cm in the A-type thermoelectric converter.
Figure 9:
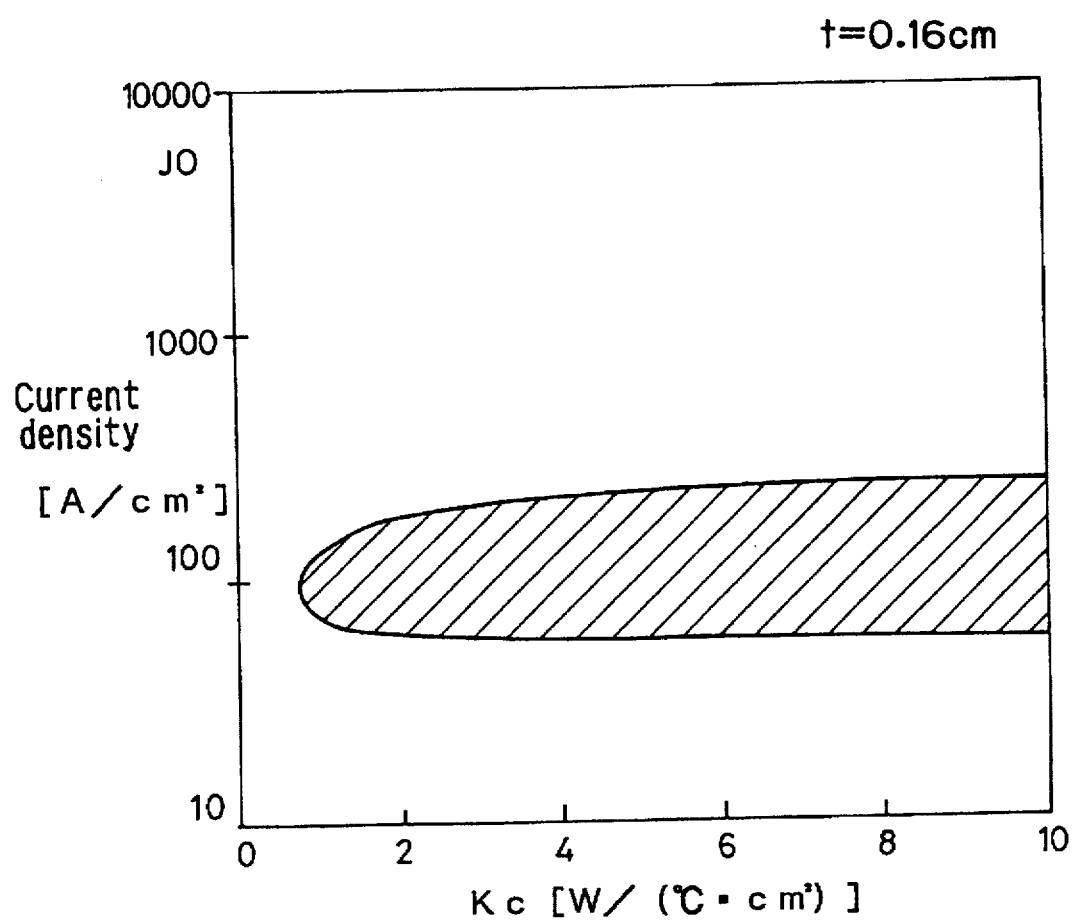
FIG. 9 is a characteristic diagram showing a relationship between $K_C$ and current density at a semiconductor thickness of 0.16 cm in the A-type thermoelectric converter.
Figure 10:
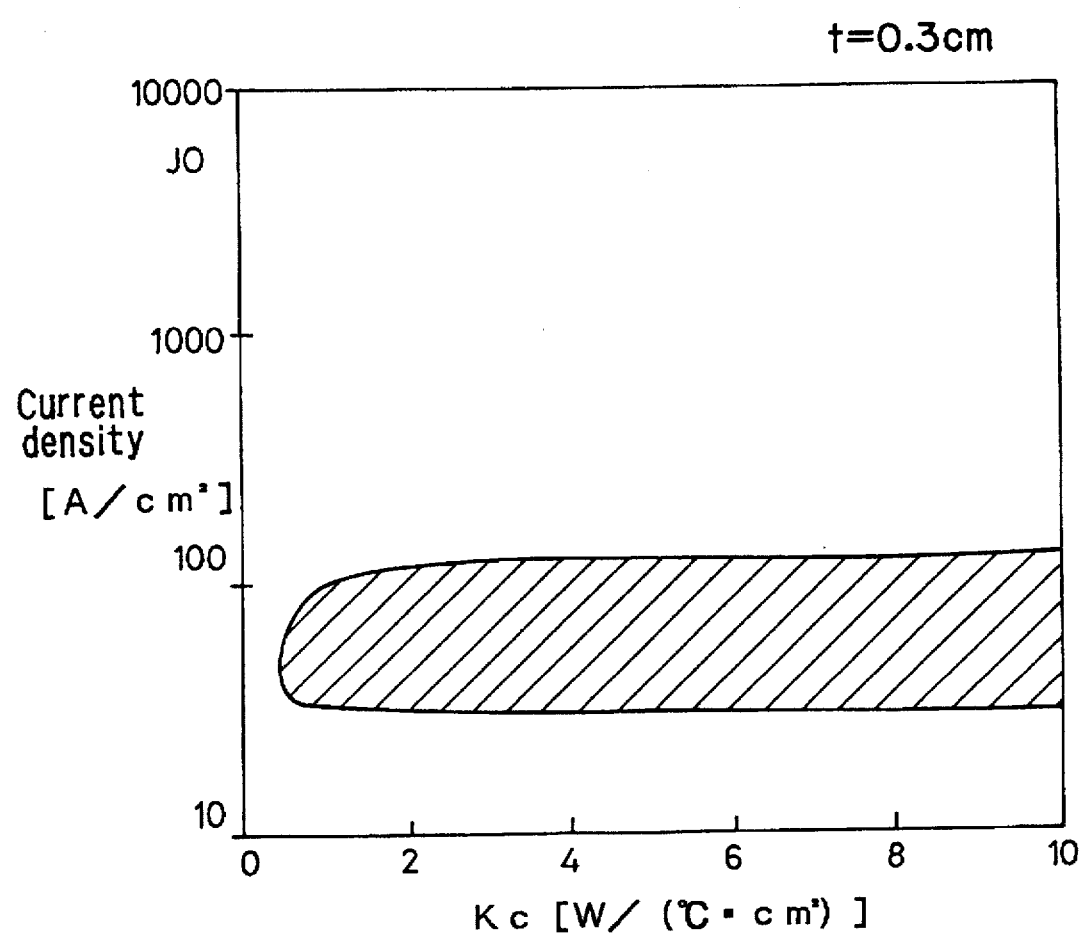
FIG. 10 is a characteristic diagram showing a relationship between $K_C$ and current density at a semiconductor thickness of 0.3 cm in the A-type thermoelectric converter.
Figure 11:
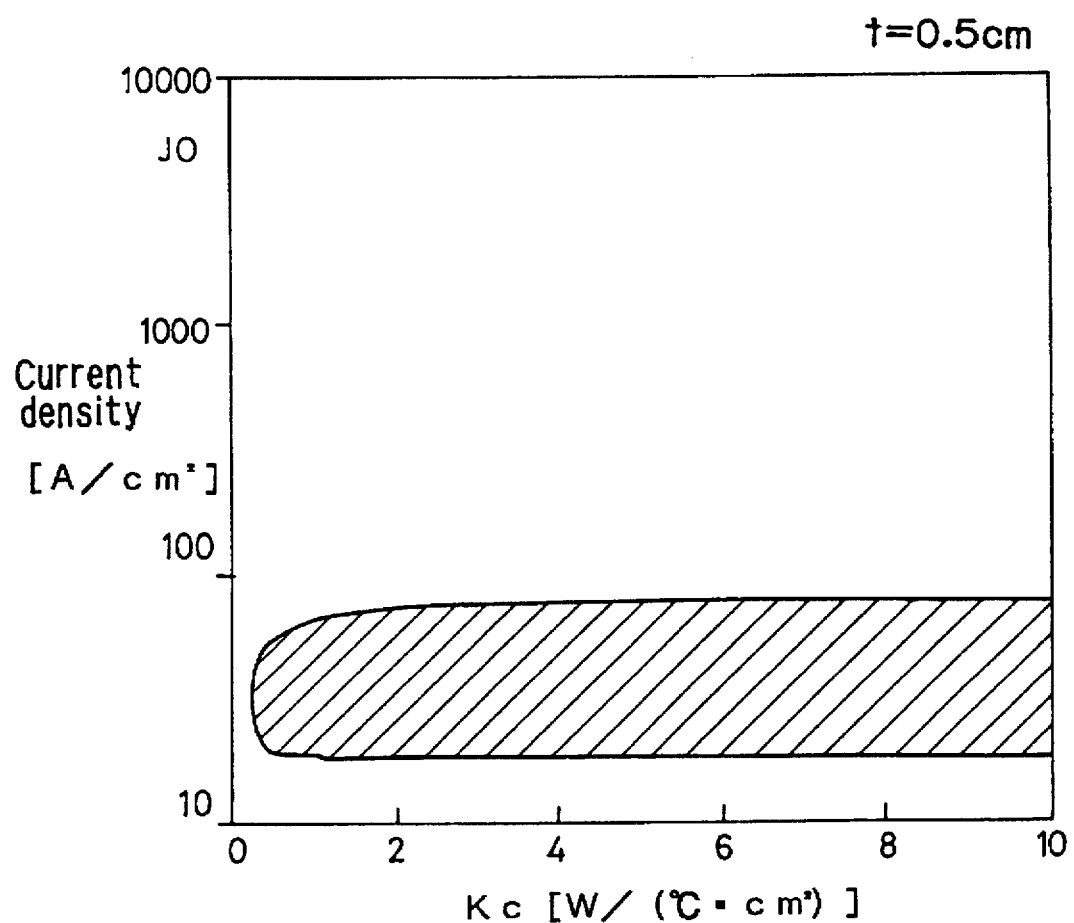
FIG. 11 is a characteristic diagram showing a relationship between $K_C$ and current density at a semiconductor thickness of 0.5 cm in the A-type thermoelectric converter.
Figure 12:
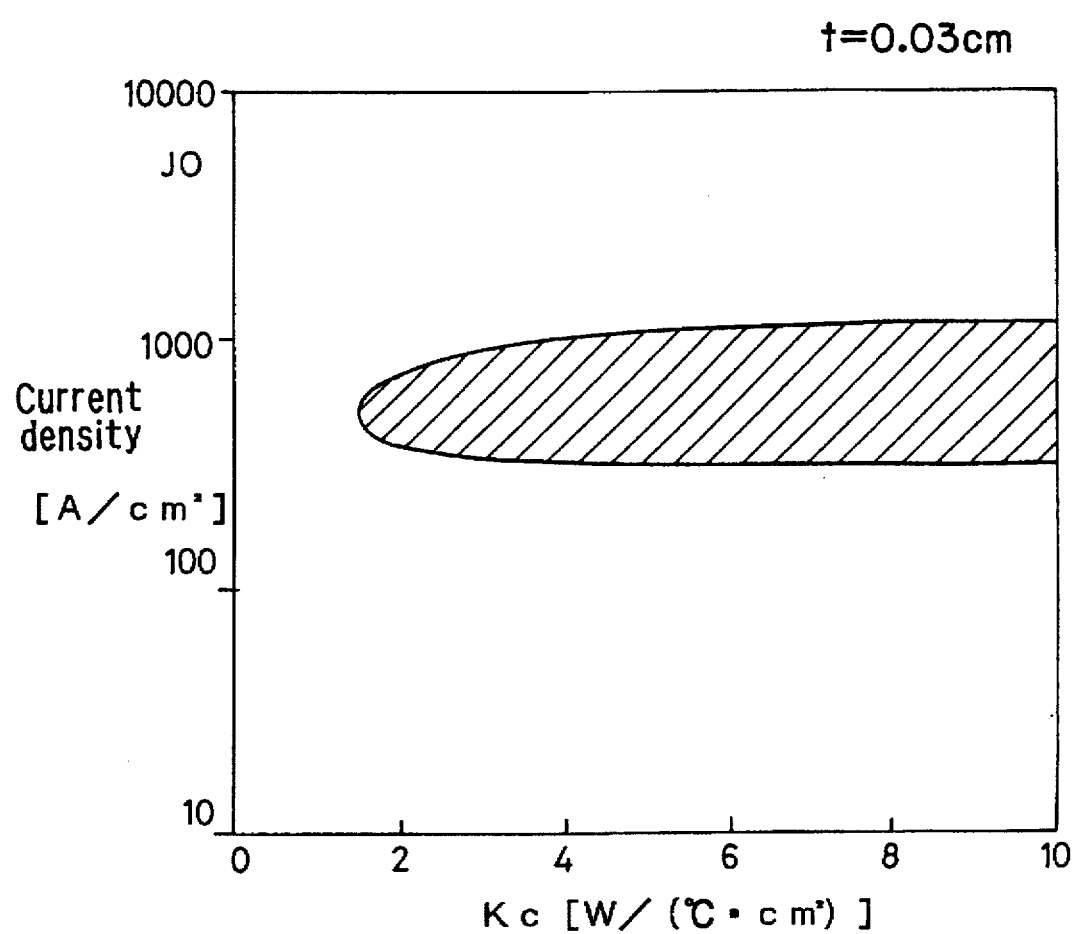
FIG. 12 is a characteristic diagram showing a relationship between $K_C$ and current density at a semiconductor thickness of 0.03 cm in a B-type thermoelectric converter.
Figure 13:
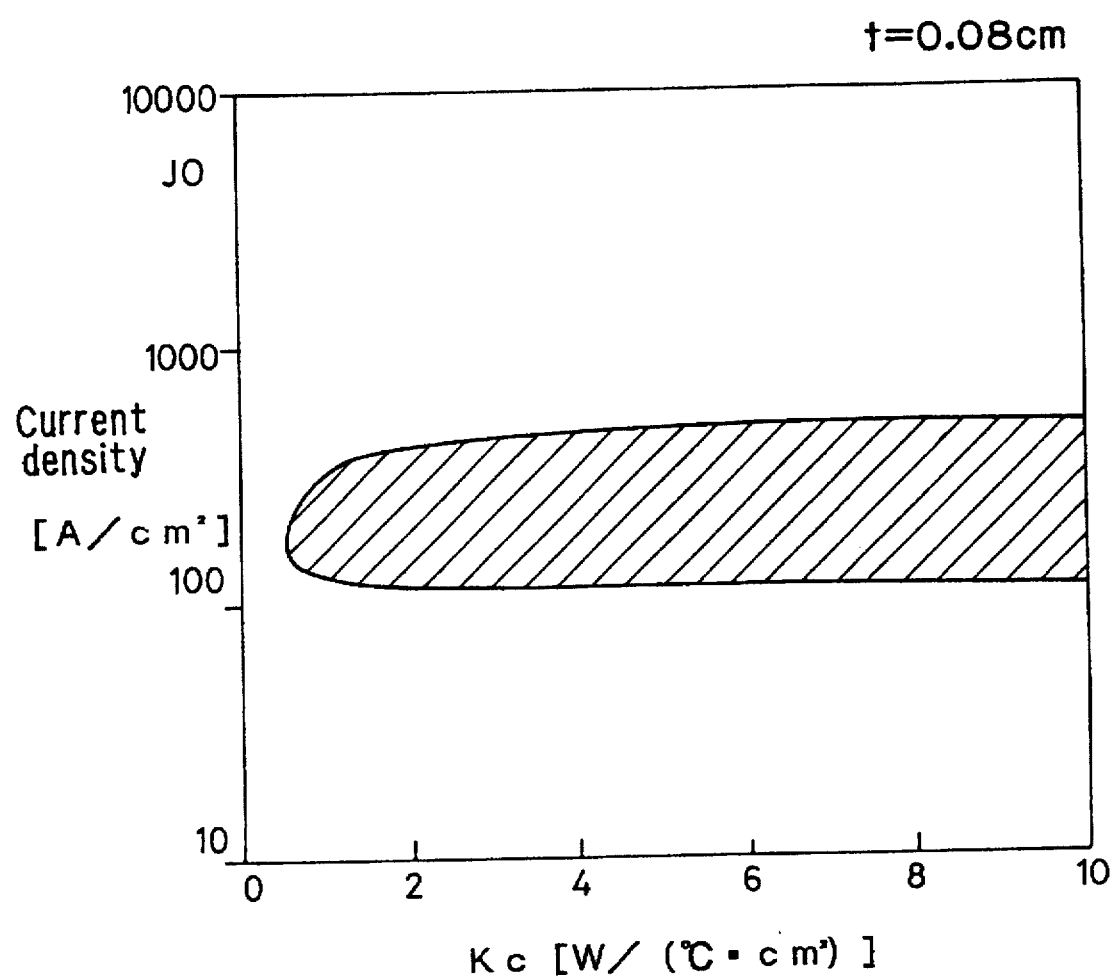
FIG. 13 is a characteristic diagram showing a relationship between $K_C$ and current density at a semiconductor thickness of 0.08 cm in the B-type thermoelectric converter.
Figure 14:
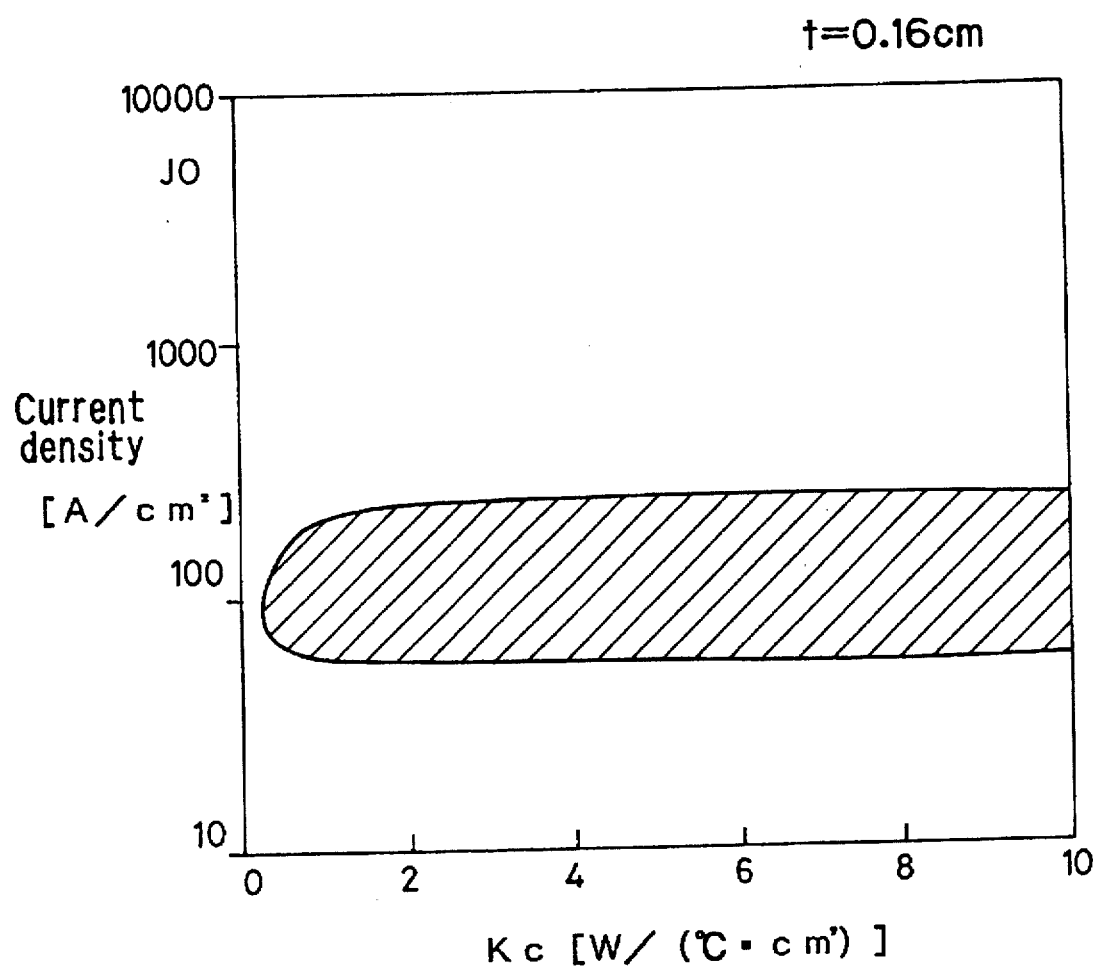
FIG. 14 is a characteristic diagram showing a relationship between $K_C$ and current density at a semiconductor thickness of 0.16 cm in the B-type thermoelectric converter.
Figure 15:
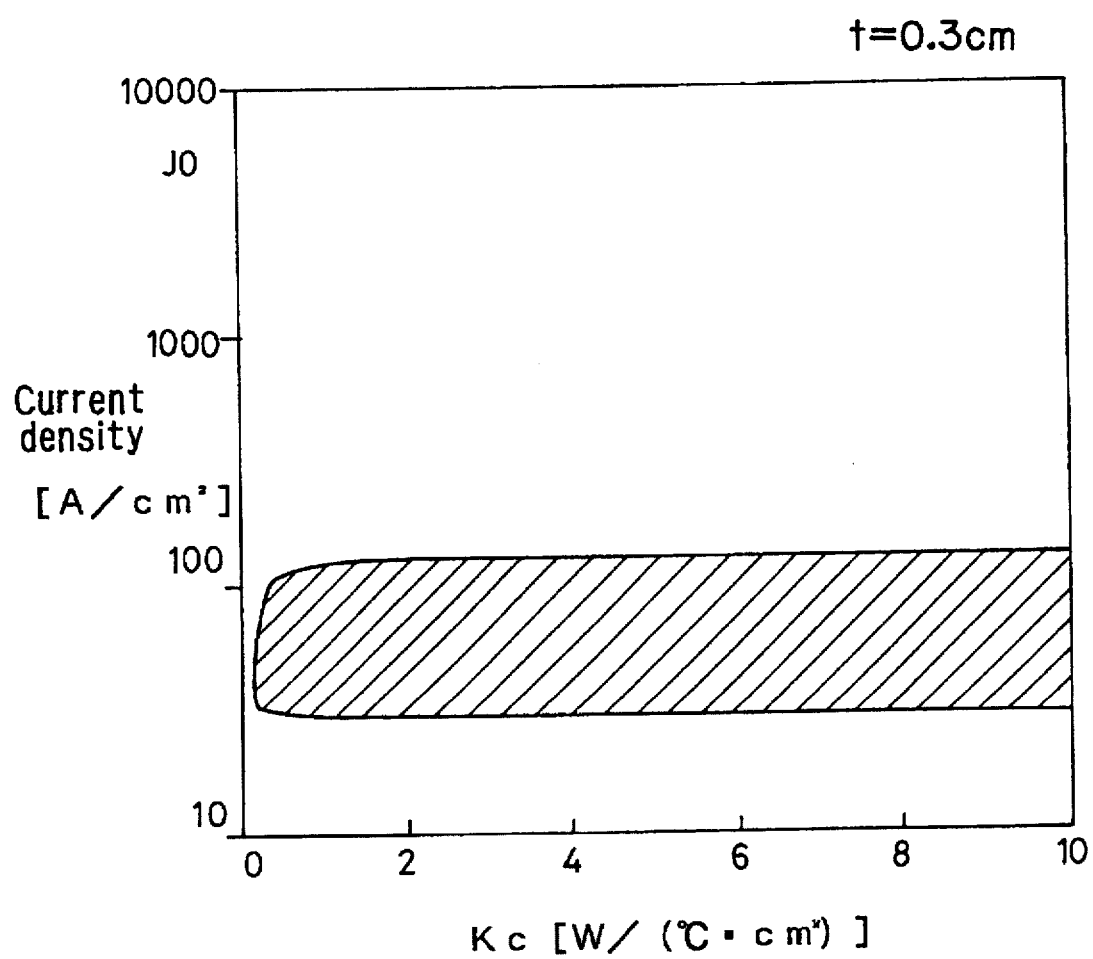
FIG. 15 is a characteristic diagram showing a relationship between $K_C$ and current density at a semiconductor thickness of 0.3 cm in the B-type thermoelectric converter.
Figure 16:
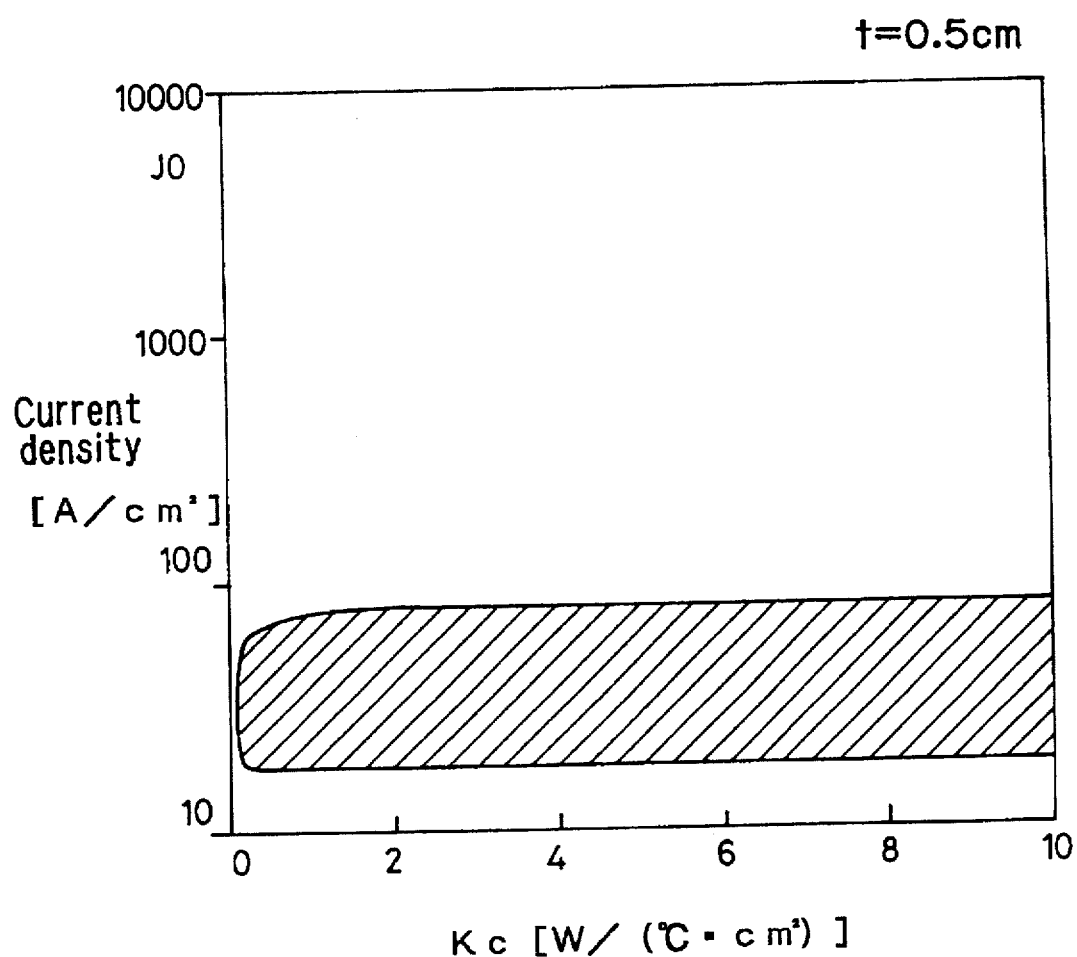
FIG. 16 is a characteristic diagram showing a relationship between $K_C$ and current density at a semiconductor thickness of 0.5 cm in the B-type thermoelectric converter.
Figure 17:
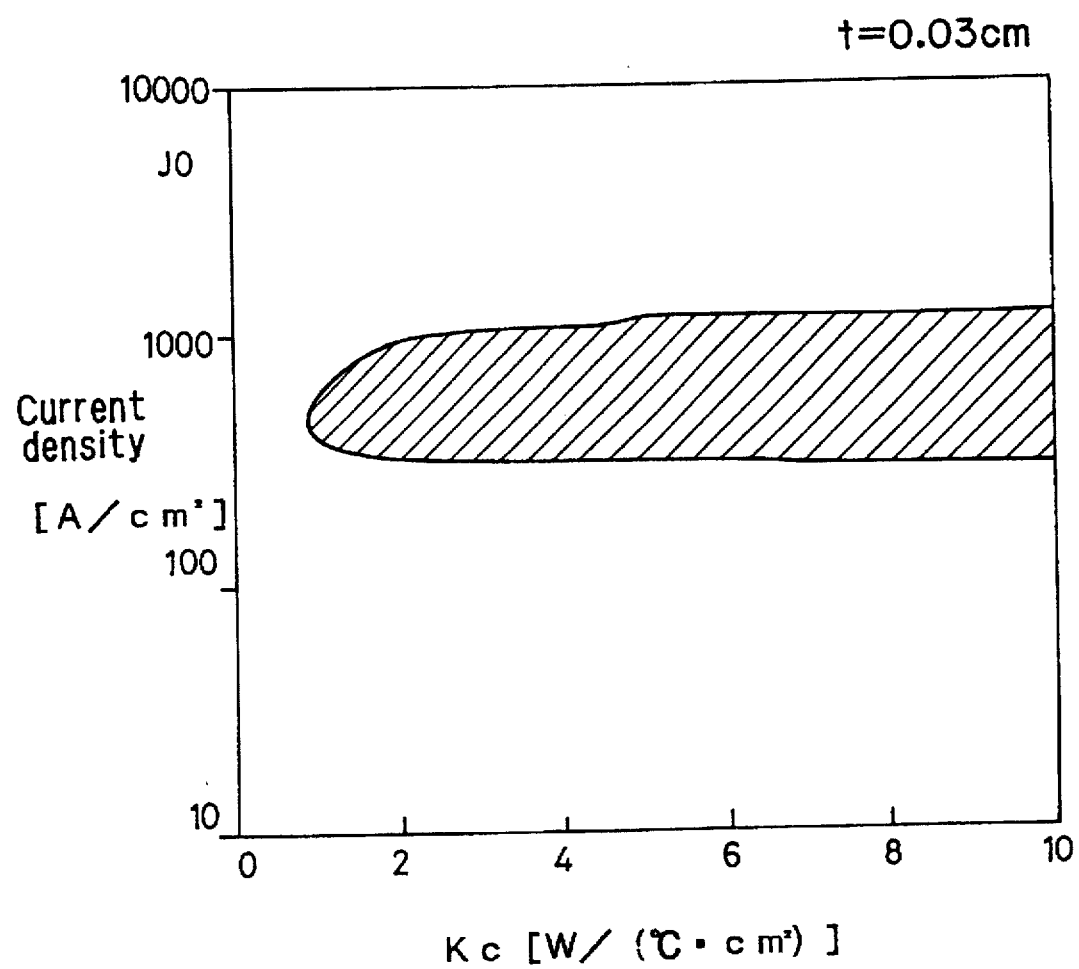
FIG. 17 is a characteristic diagram showing a relationship between $K_C$ and current density at a semiconductor thickness of 0.05 cm in a C-type thermoelectric converter.
Figure 18:
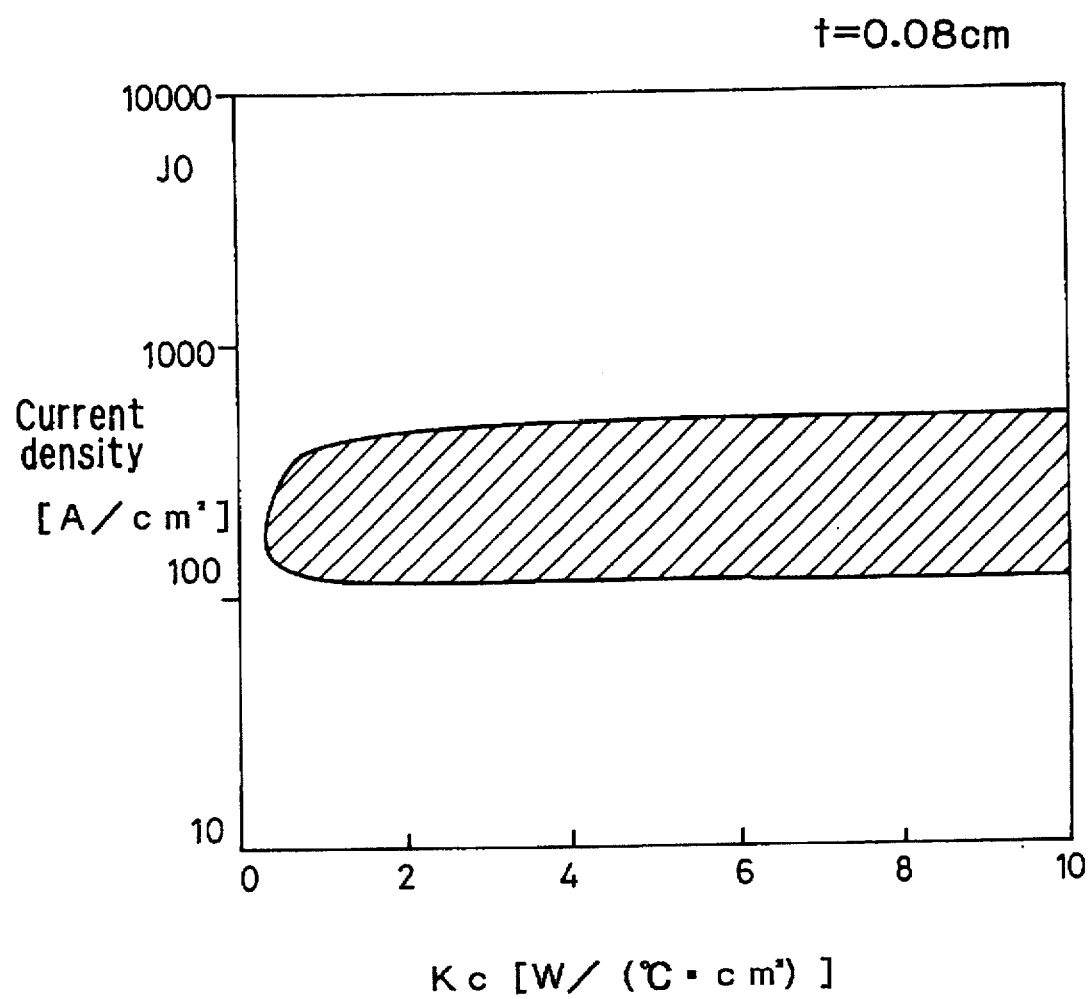
FIG. 18 is a characteristic diagram showing a relationship between $K_C$ and current density at a semiconductor thickness of 0.08 cm in the C-type thermoelectric converter.
Figure 19:
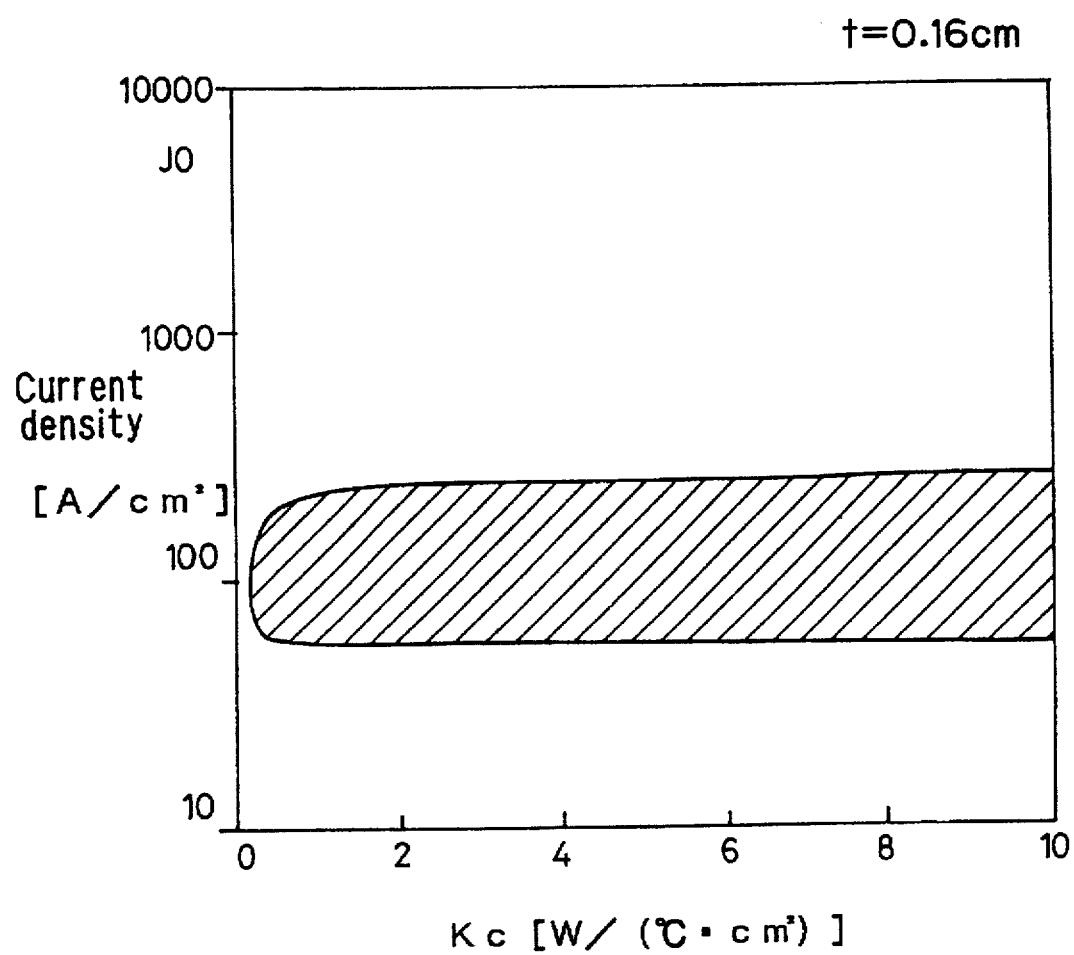
FIG. 19 is a characteristic diagram showing a relationship between $K_C$ and current density at a semiconductor thickness of 0.16 cm in the C-type thermoelectric converter.
Figure 20:
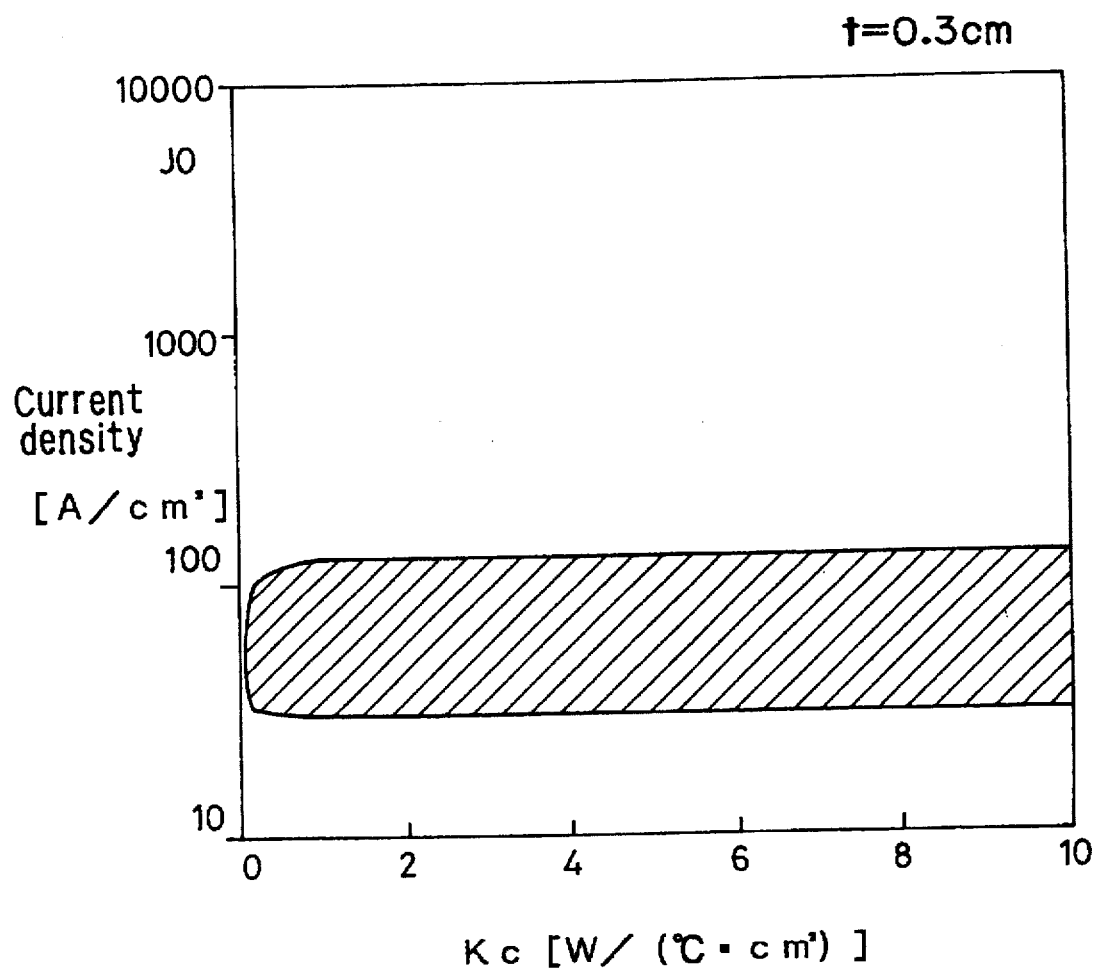
FIG. 20 is a characteristic diagram showing a relationship between $K_C$ and current density at a semiconductor thickness of 0.3 cm in the C-type thermoelectric converter.
Figure 21:
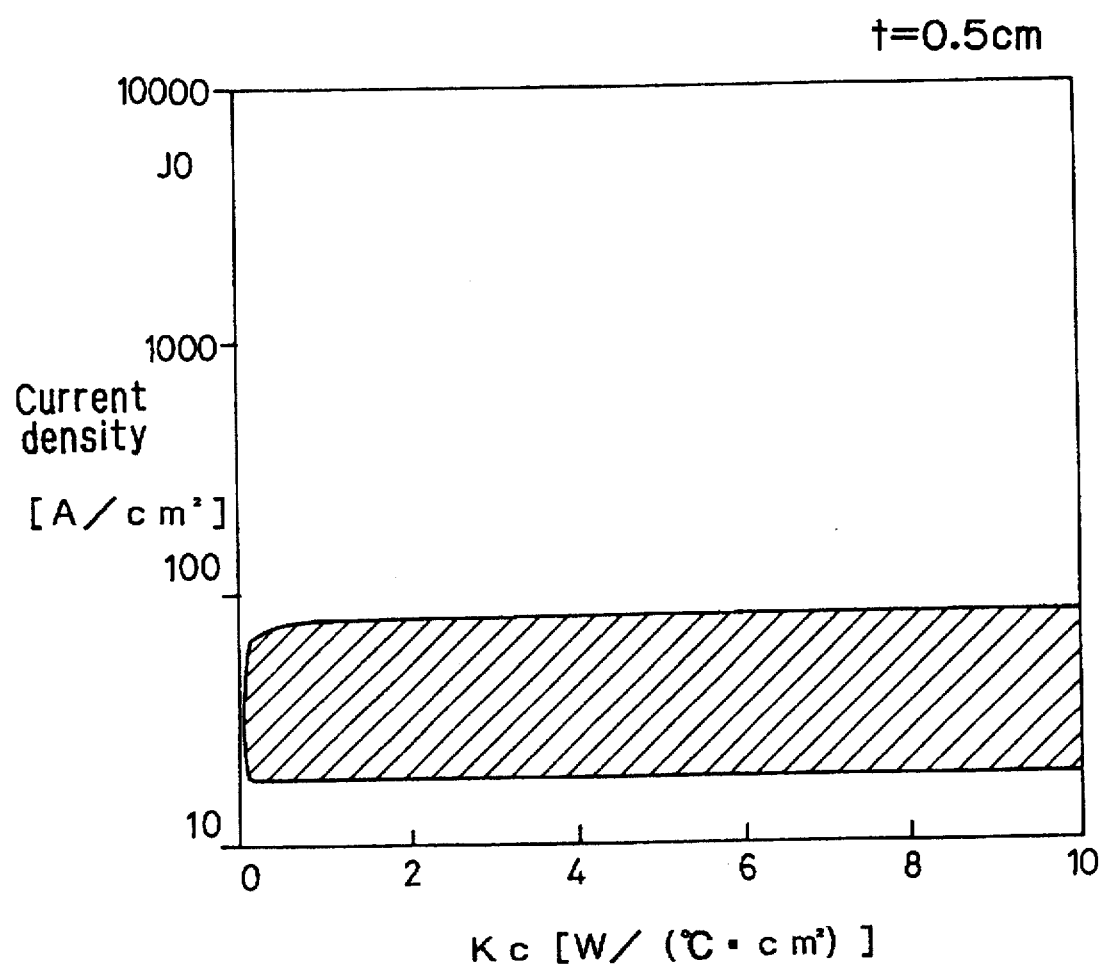
FIG. 21 is a characteristic diagram showing a relationship between $K_C$ and current density at a semiconductor thickness of 0.5 cm in the C-type thermoelectric converter.

From a comparison between FIG. 7 and FIG. 8, it is understood that, when the thickness (t) of semiconductors increases from 0.03 cm to 0.08 cm, COP surely increases to 0.6 or greater by setting the current density at 200 A/cm² even in a thermoelectric converter having a $K_C$ of 6 W/(°C.·cm²).

Although the position of an area of 0.6 and greater in COP (i.e., a shaded areas) varies somewhat depending on the above-mentioned type of the thermoelectric converter (A-type, B-type or C-type), the area of 0.6 and greater in COP tends to become available more readily as the thickness (t) of the semiconductors become greater even if the current density is lowered. It is therefore understood that there is a correlation among the thickness (5) of semiconductors, the current density and COP.

Although the above-described FIG. 7 through FIG. 21 are characteristic diagrams showing the areas of 0.6 and greater in COP, FIG. 22 through FIG. 43 to be described next are characteristic diagrams showing areas of 0.6 and greater in COP in the B-type thermoelectric converter.

Figure 22:
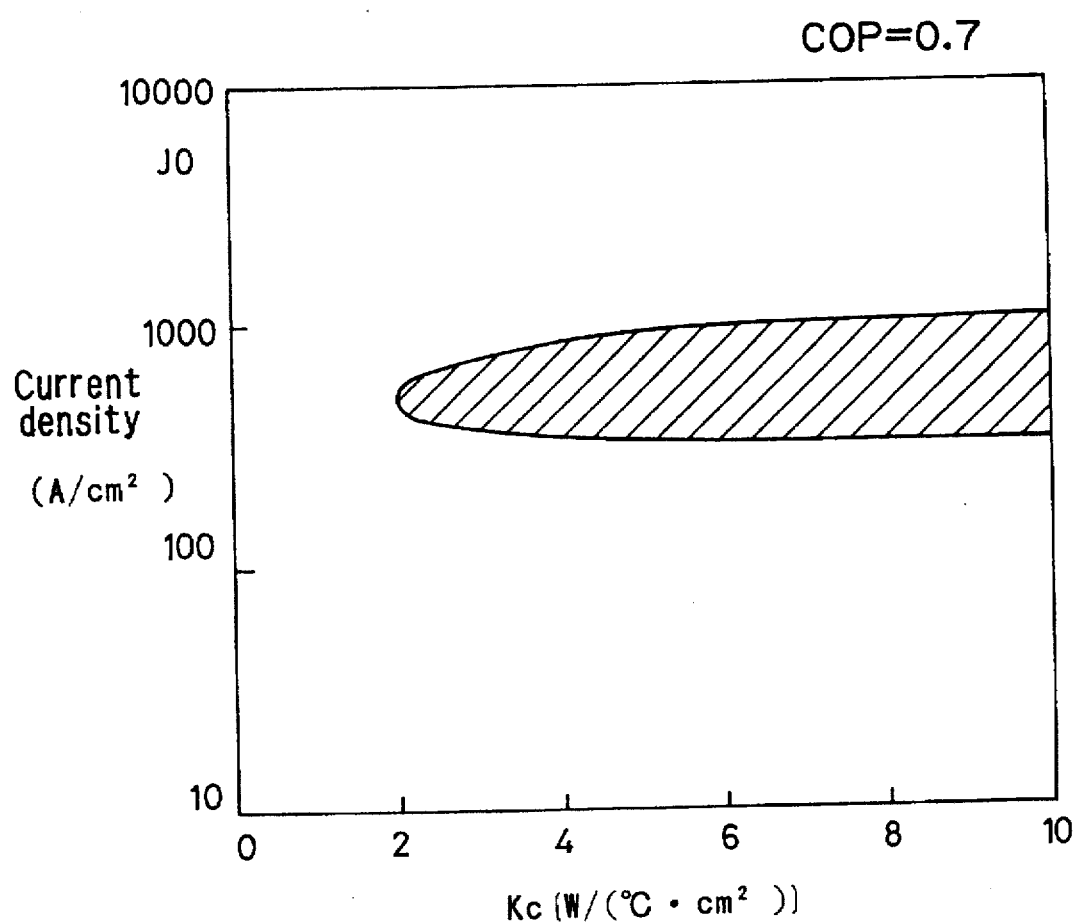
FIG. 22 is a characteristic diagram showing a relationship between $K_C$ and current density at a semiconductor thickness of 0.03 cm and at COPs of 0.7 and greater in the B-type thermoelectric converter.
Figure 23:
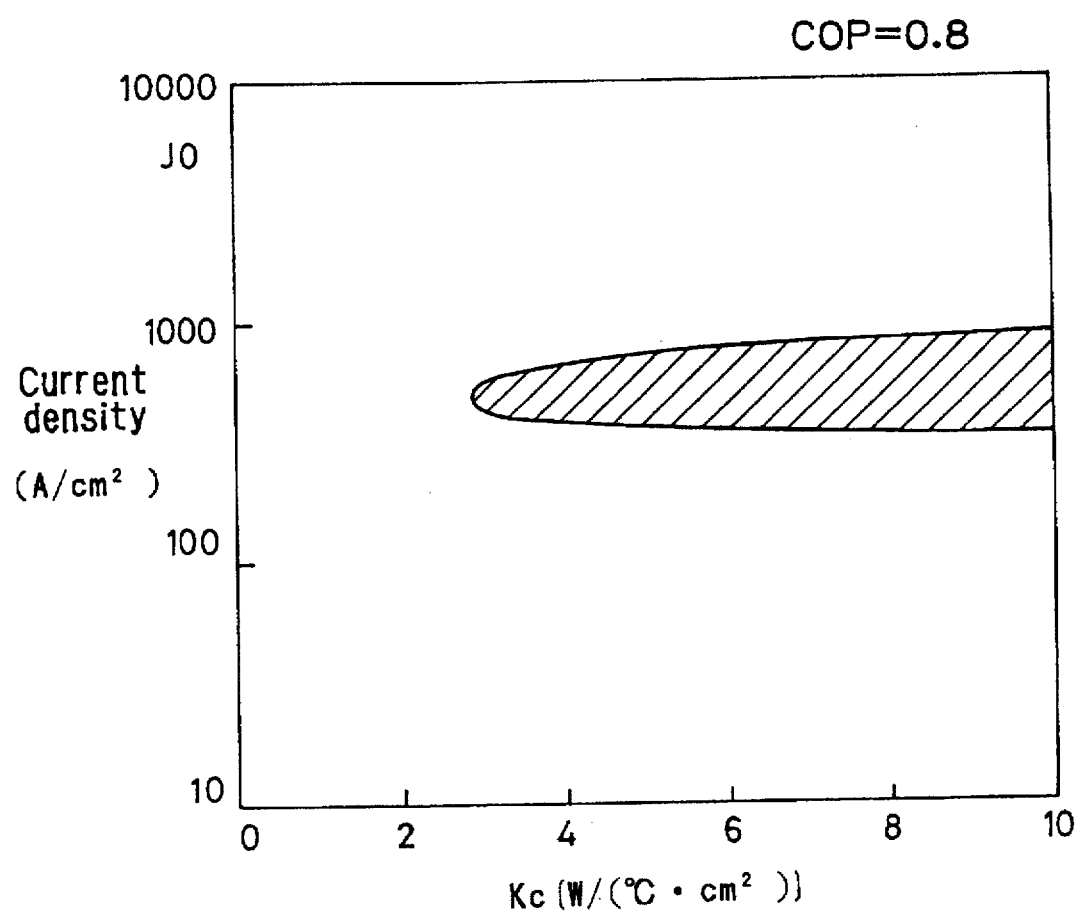
FIG. 23 is a characteristic diagram showing a relationship between $K_C$ and current density at a semiconductor thickness of 0.03 cm and at COPs of 0.8 and greater in the B-type thermoelectric converter.
Figure 24:
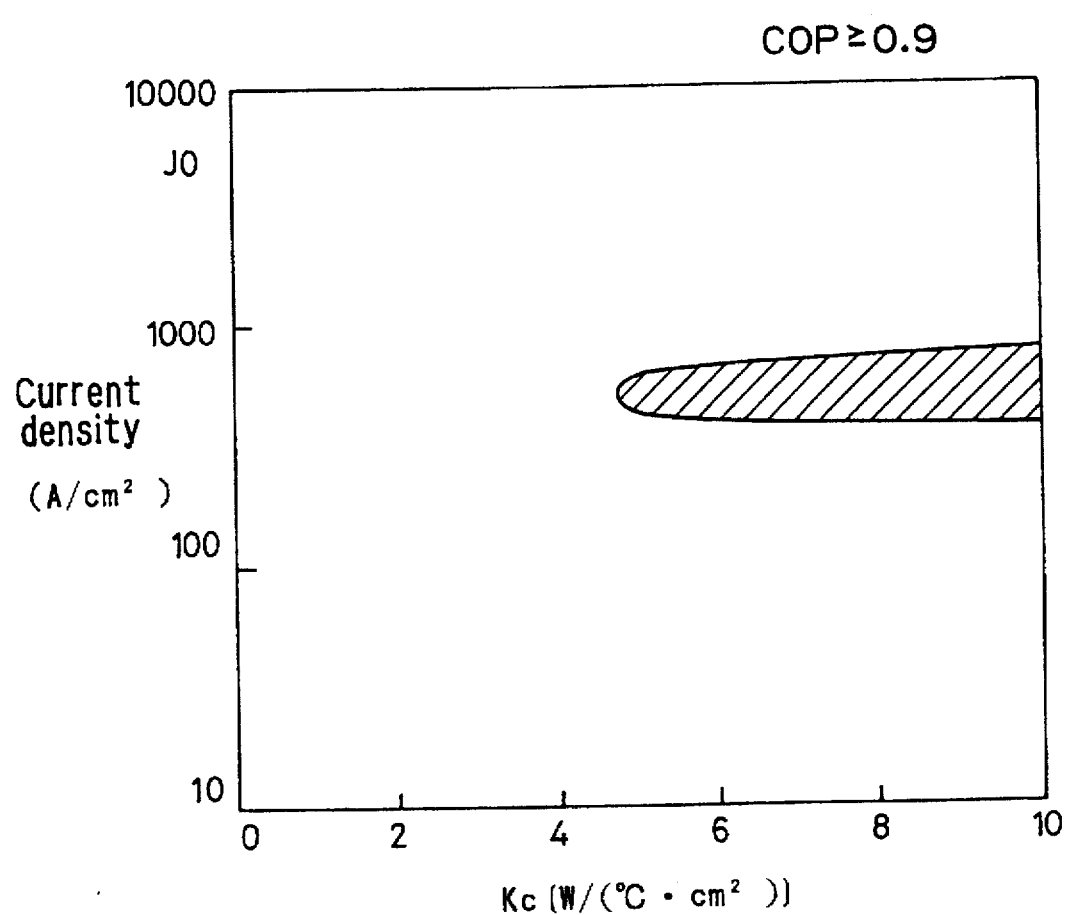
FIG. 24 is a characteristic diagram showing a relationship between $K_C$ and current density at a semiconductor thickness of 0.03 cm and at COPs of 0.9 and greater in the B-type thermoelectric converter.
Figure 25:
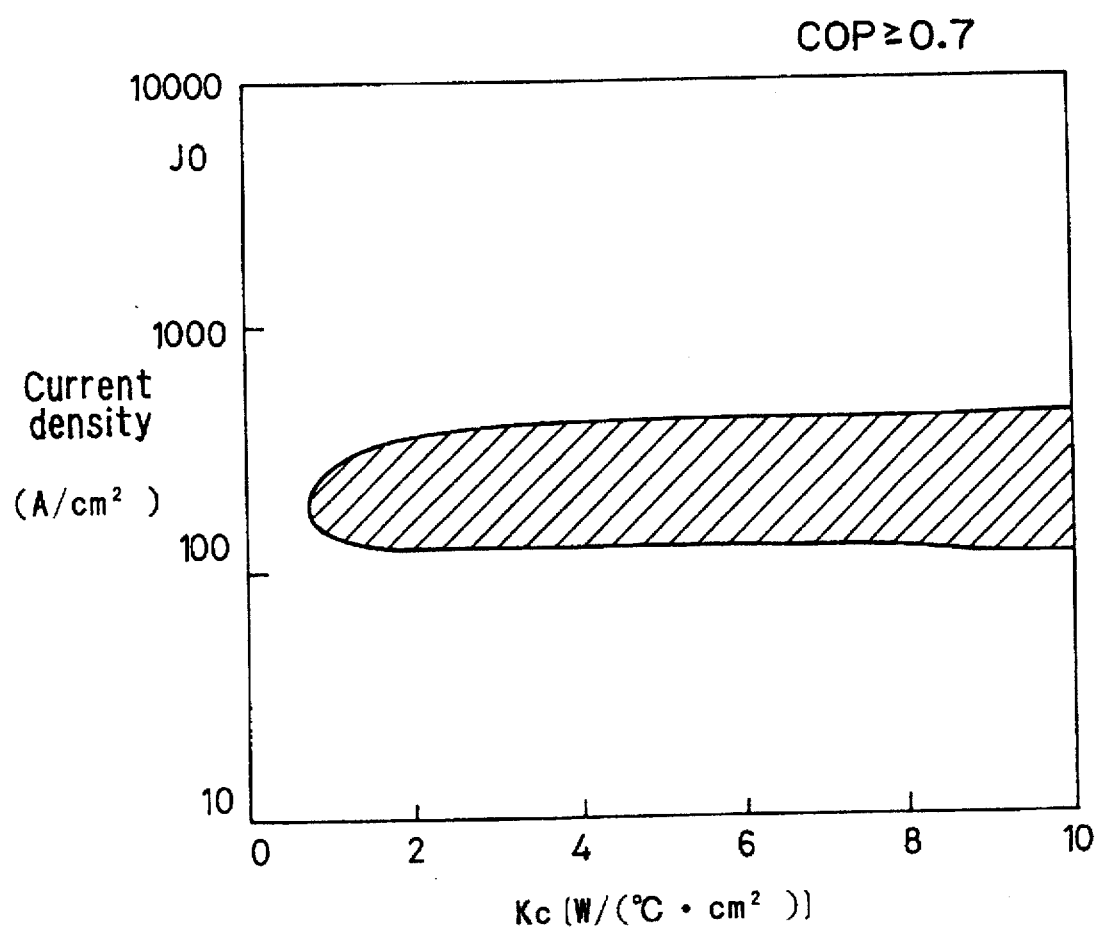
FIG. 25 is a characteristic diagram showing a relationship between $K_C$ and current density at a semiconductor thickness of 0.08 cm and at COPs of 0.7 and greater in the B-type thermoelectric converter.
Figure 26:
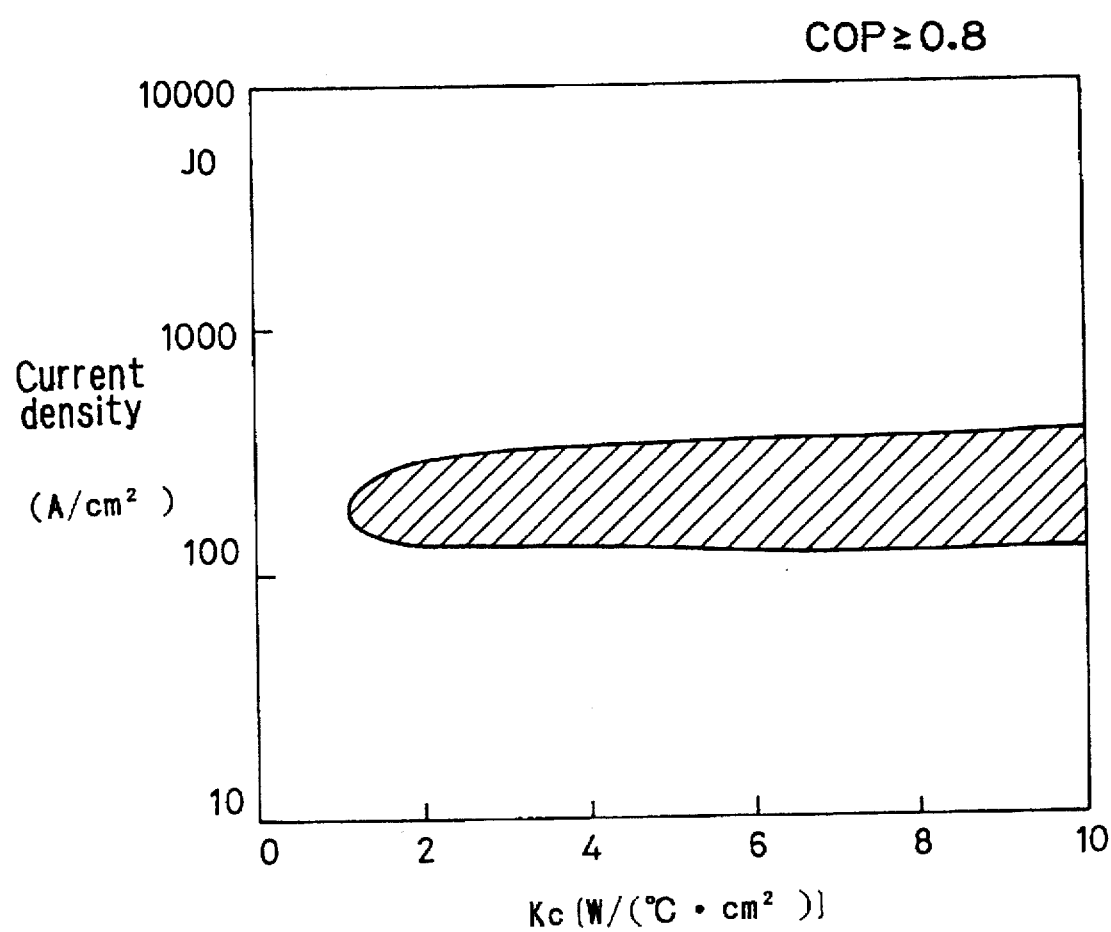
FIG. 26 is a characteristic diagram showing a relationship between $K_C$ and current density at a semiconductor thickness of 0.08 cm and at COPs of 0.8 and greater in the B-type thermoelectric converter.
Figure 27:
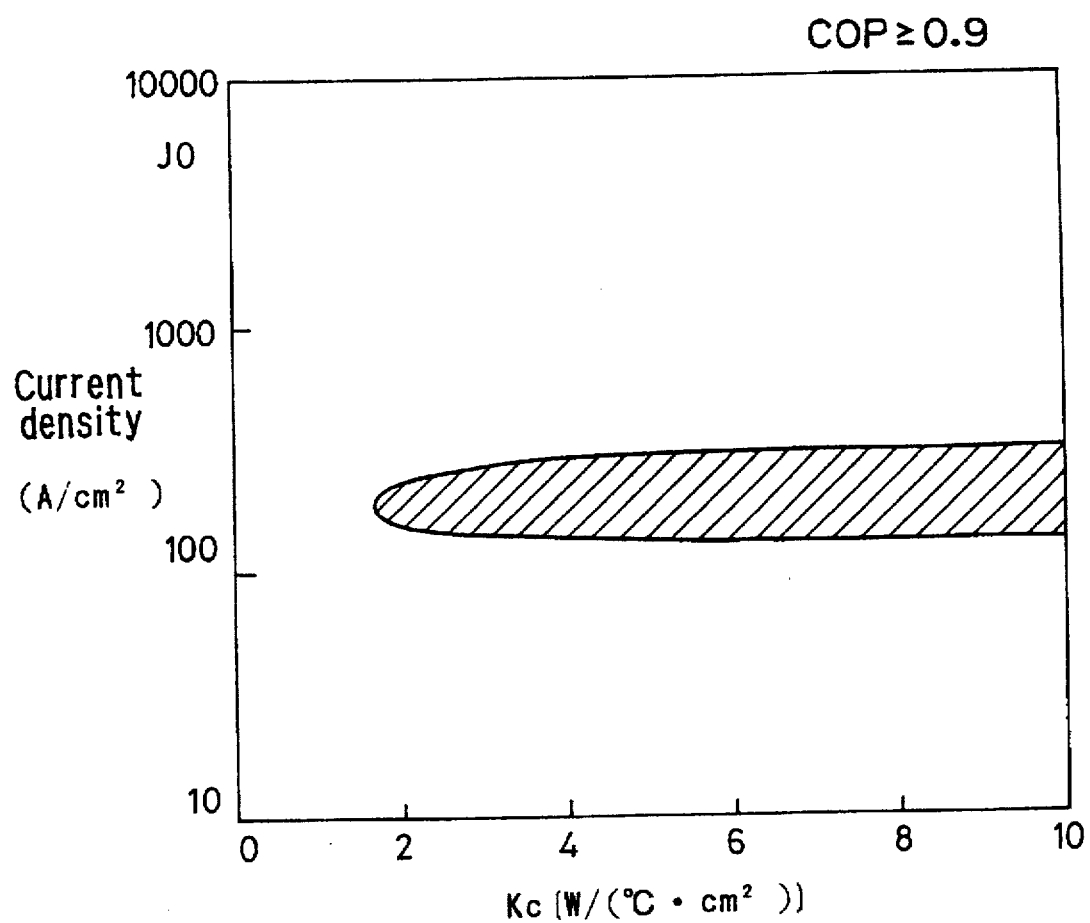
FIG. 27 is a characteristic diagram showing a relationship between $K_C$ and current density at a semiconductor thickness of 0.08 cm and at COPs of 0.9 and greater in the B-type thermoelectric converter.
Figure 28:
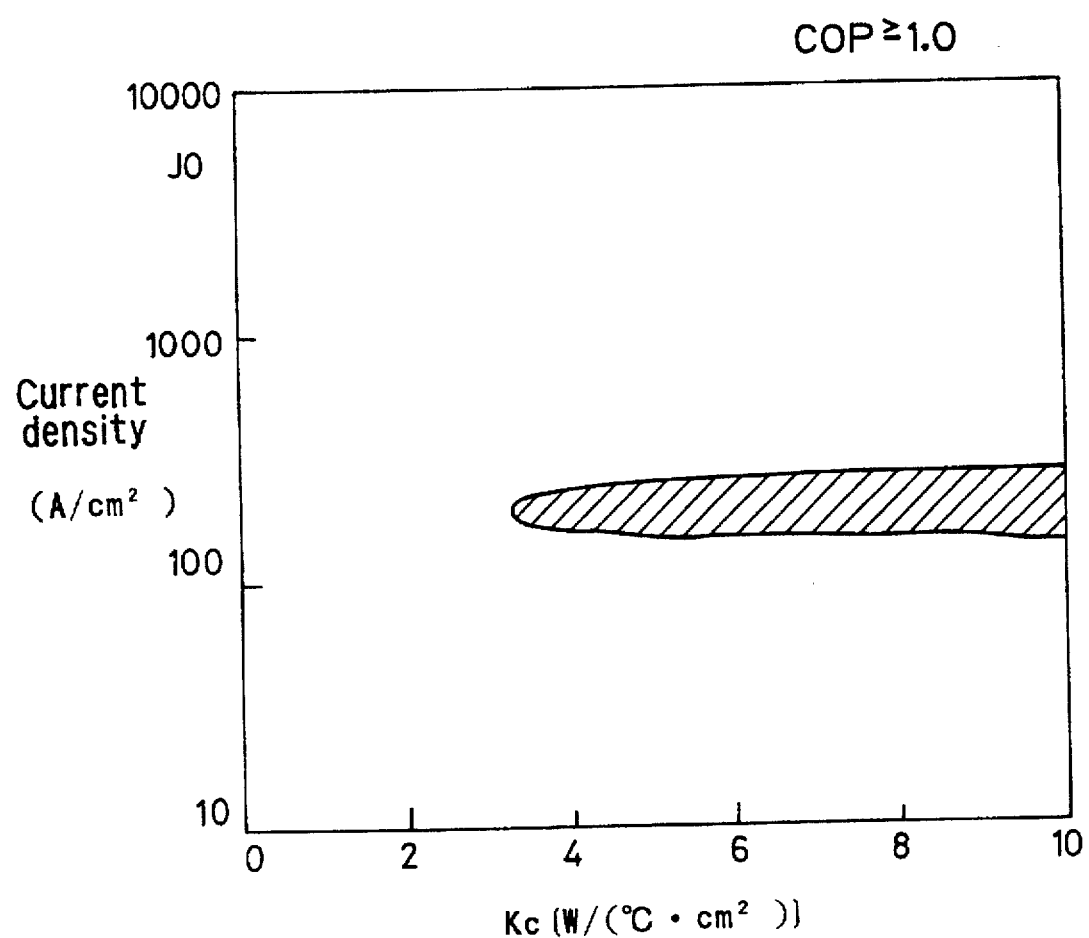
FIG. 28 is a characteristic diagram showing a relationship between $K_C$ and current density at a semiconductor thickness of 0.08 cm and at COPs of 1.0 and greater in the B-type thermoelectric converter.
Figure 29:
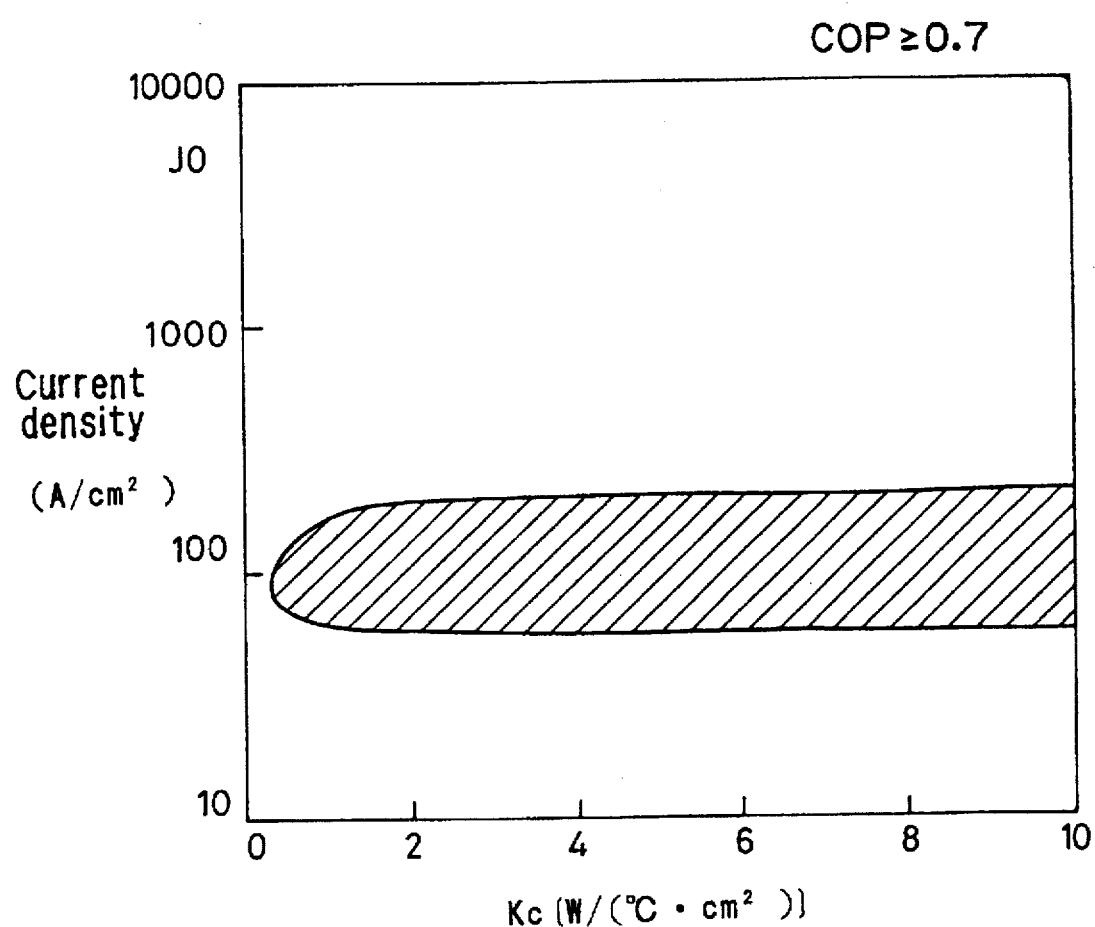
FIG. 29 is a characteristic diagram showing a relationship between $K_C$ and current density at a semiconductor thickness of 0.16 cm and at COPs of 0.7 and greater in the B-type thermoelectric converter.
Figure 30:
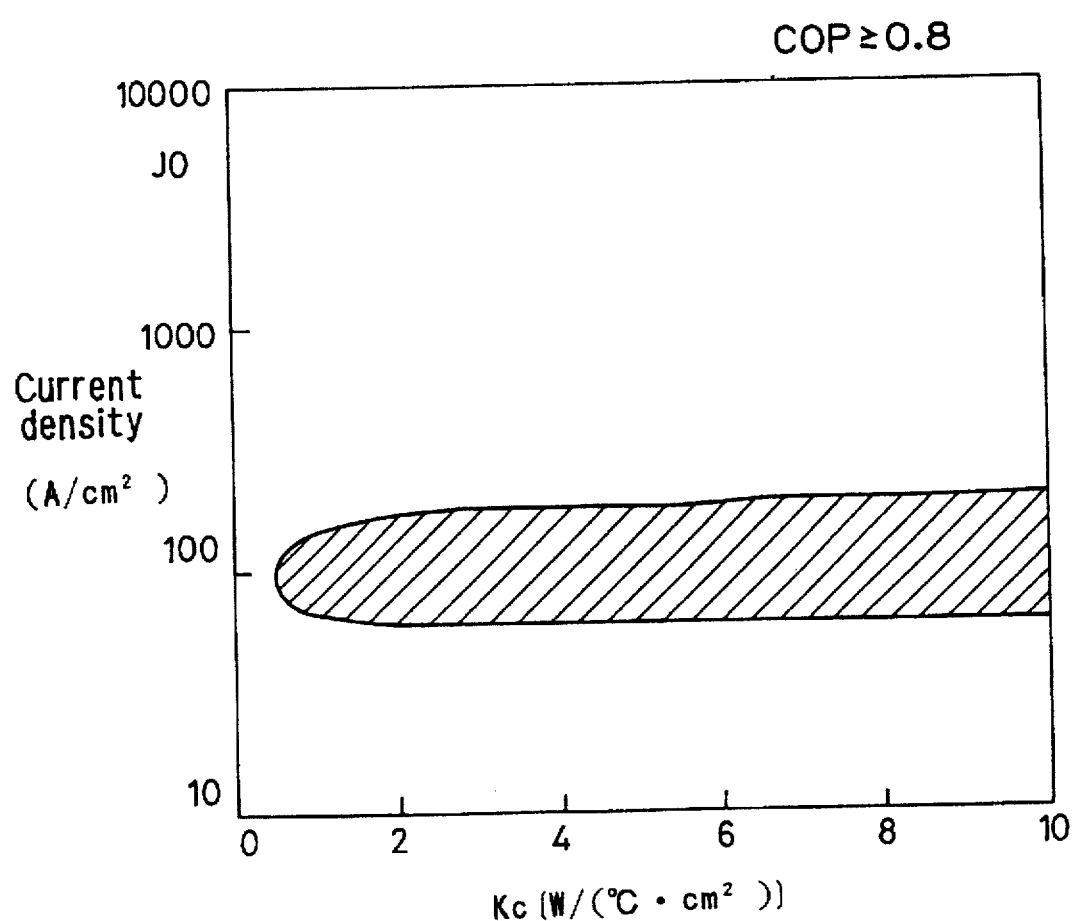
FIG. 30 is a characteristic diagram showing a relationship between $K_C$ and current density at a semiconductor thickness of 0.16 cm and at COPs of 0.8 and greater an the B-type thermoelectric converter.
Figure 31:
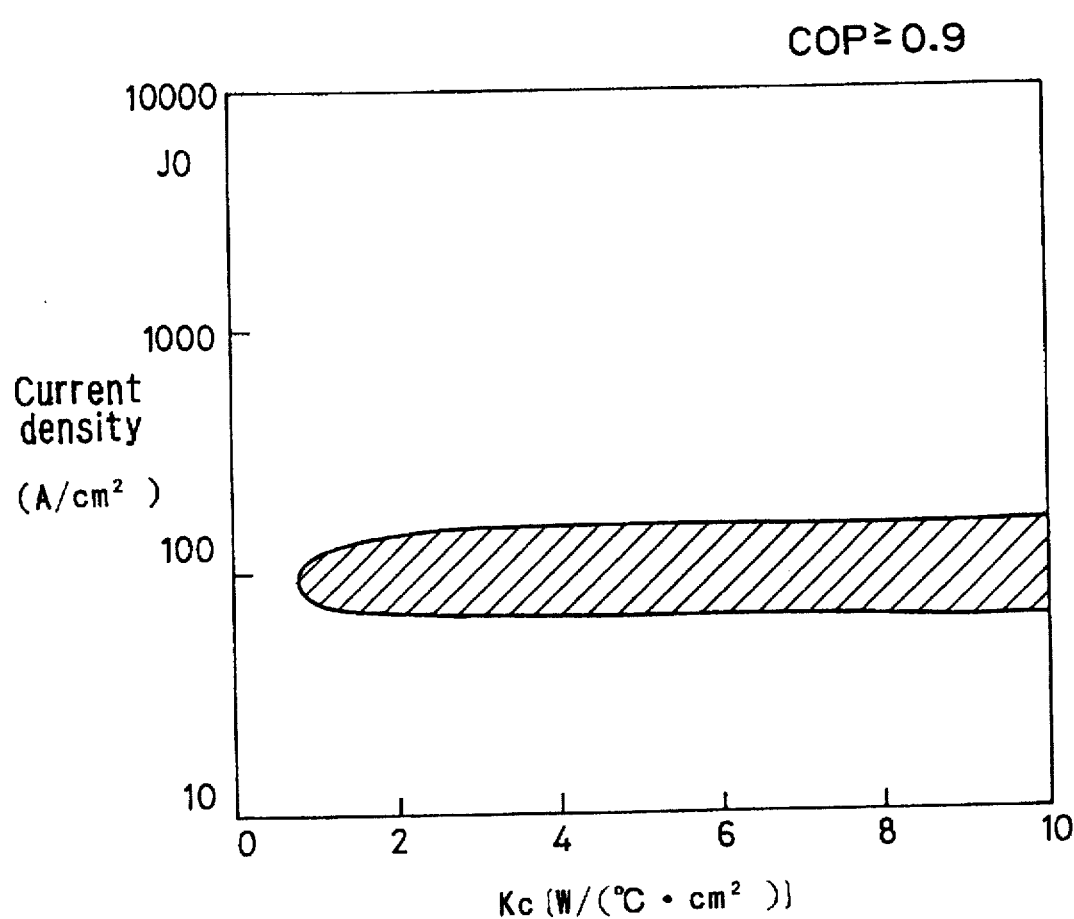
FIG. 31 is a characteristic diagram showing a relationship between $K_C$ and current density at a semiconductor thickness of 0.16 cm and at COPs of 0.9 and greater in the B-type thermoelectric converter.
Figure 32:
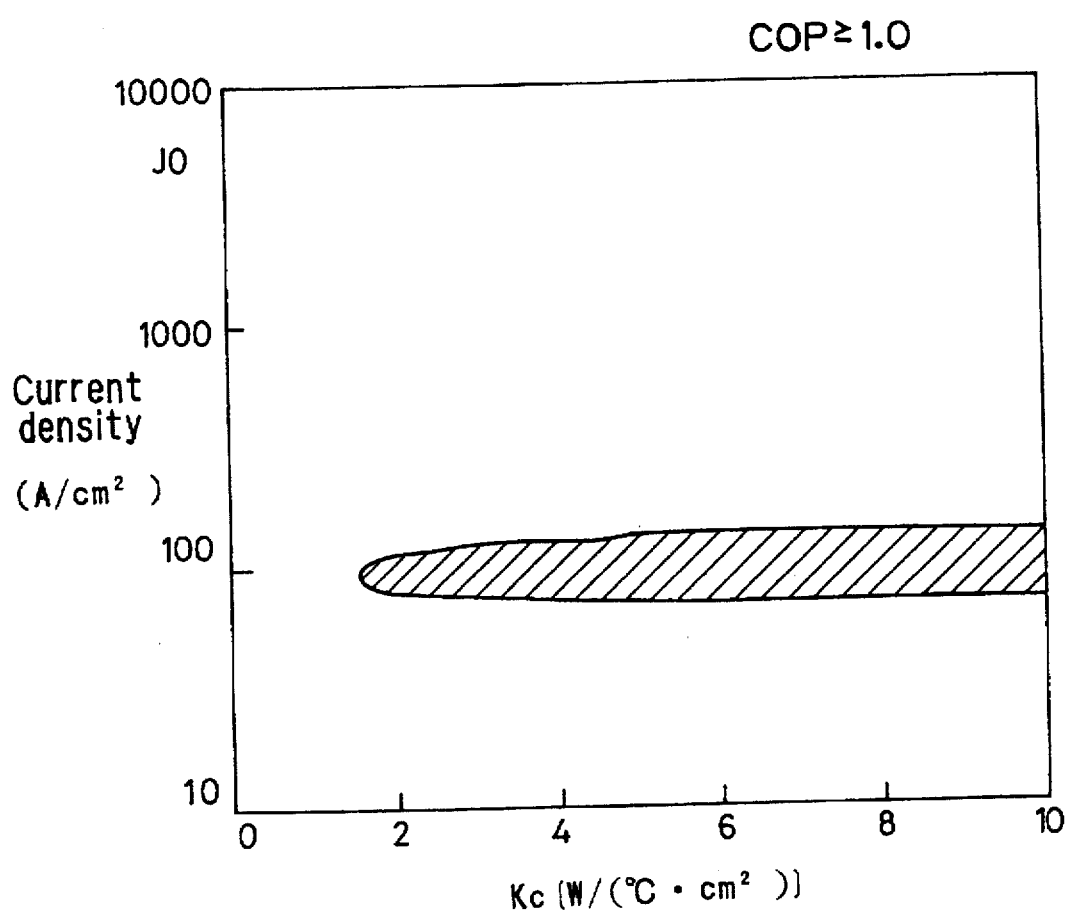
FIG. 32 is a characteristic diagram showing a relationship between $K_C$ and current density at a semiconductor thickness of 0.16 cm and at COPs of 1.0 and greater in the B-type thermoelectric converter.
Figure 33:
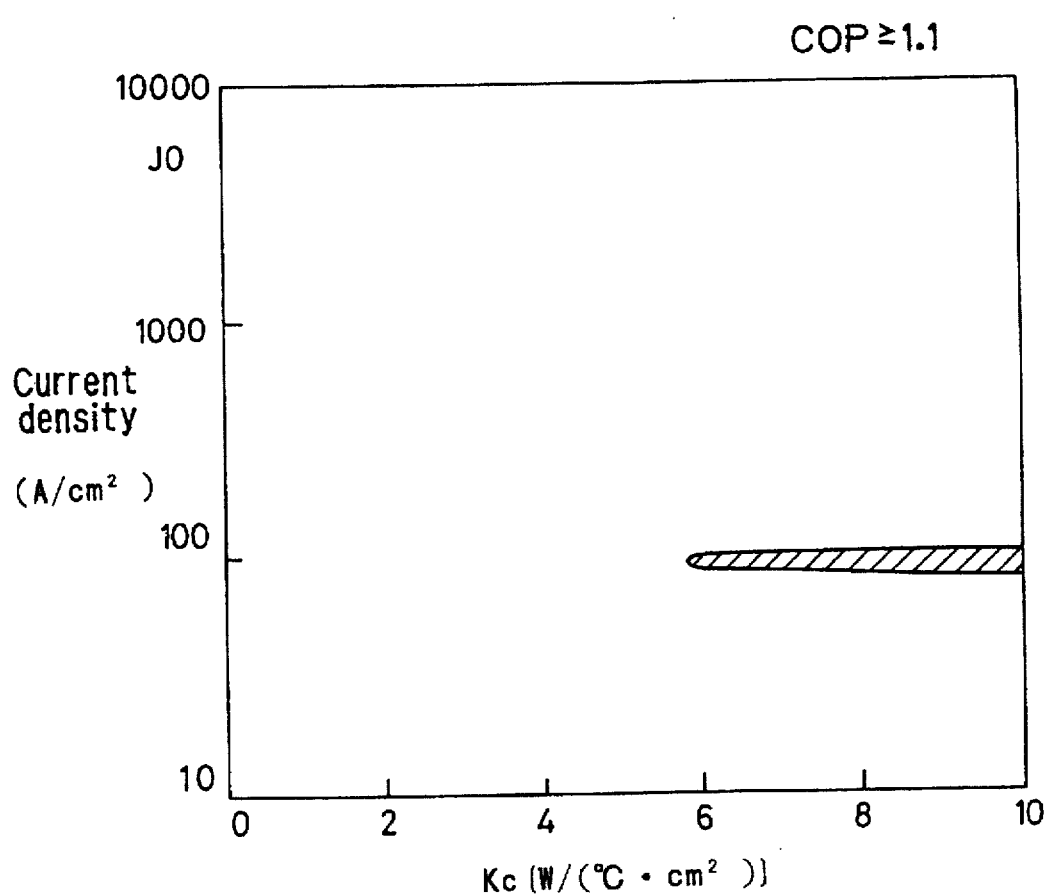
FIG. 33 is a characteristic diagram showing a relationship between $K_C$ and current density at a semiconductor thickness of 0.16 cm and at COPs of 1.1 and greater in the B-type thermoelectric converter.
Figure 34:
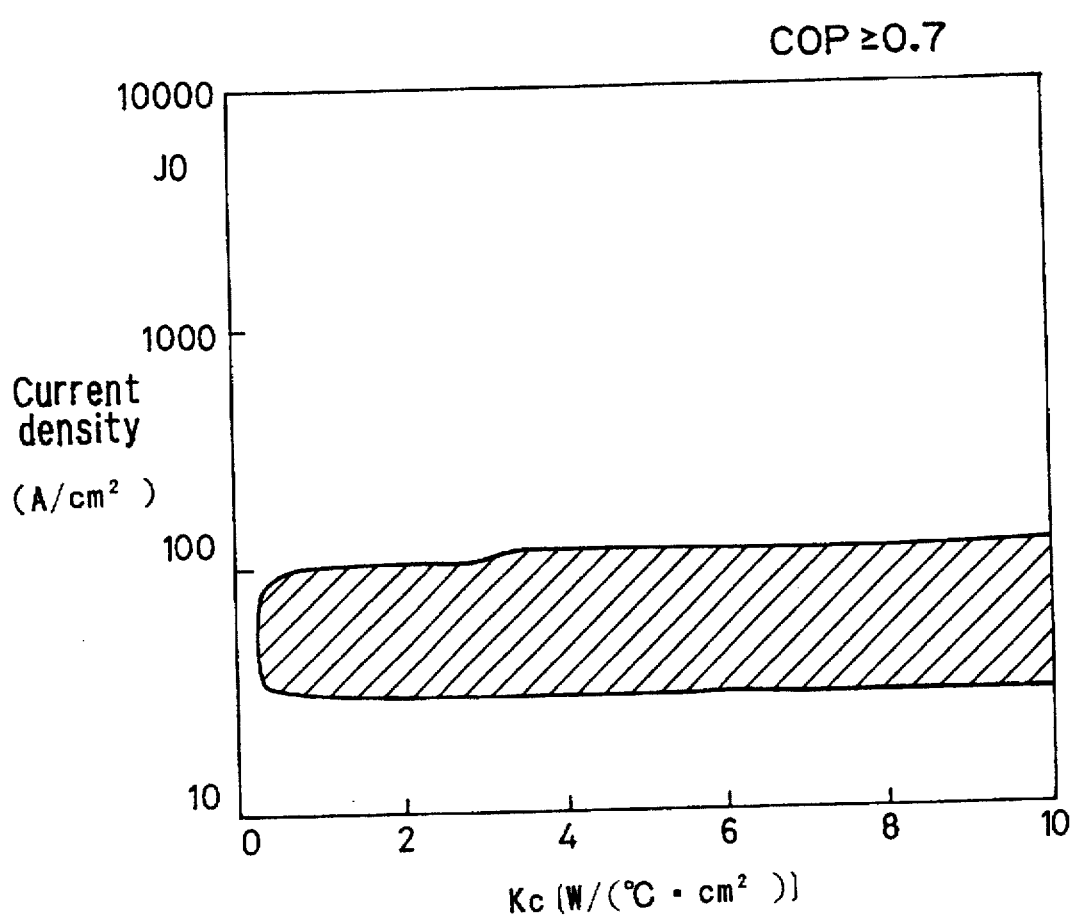
FIG. 34 is a characteristic diagram showing a relationship between $K_C$ and current density at a semiconductor thickness of 0.3 cm and at COPs of 0.7 and greater in the B-type thermoelectric converter.
Figure 35:
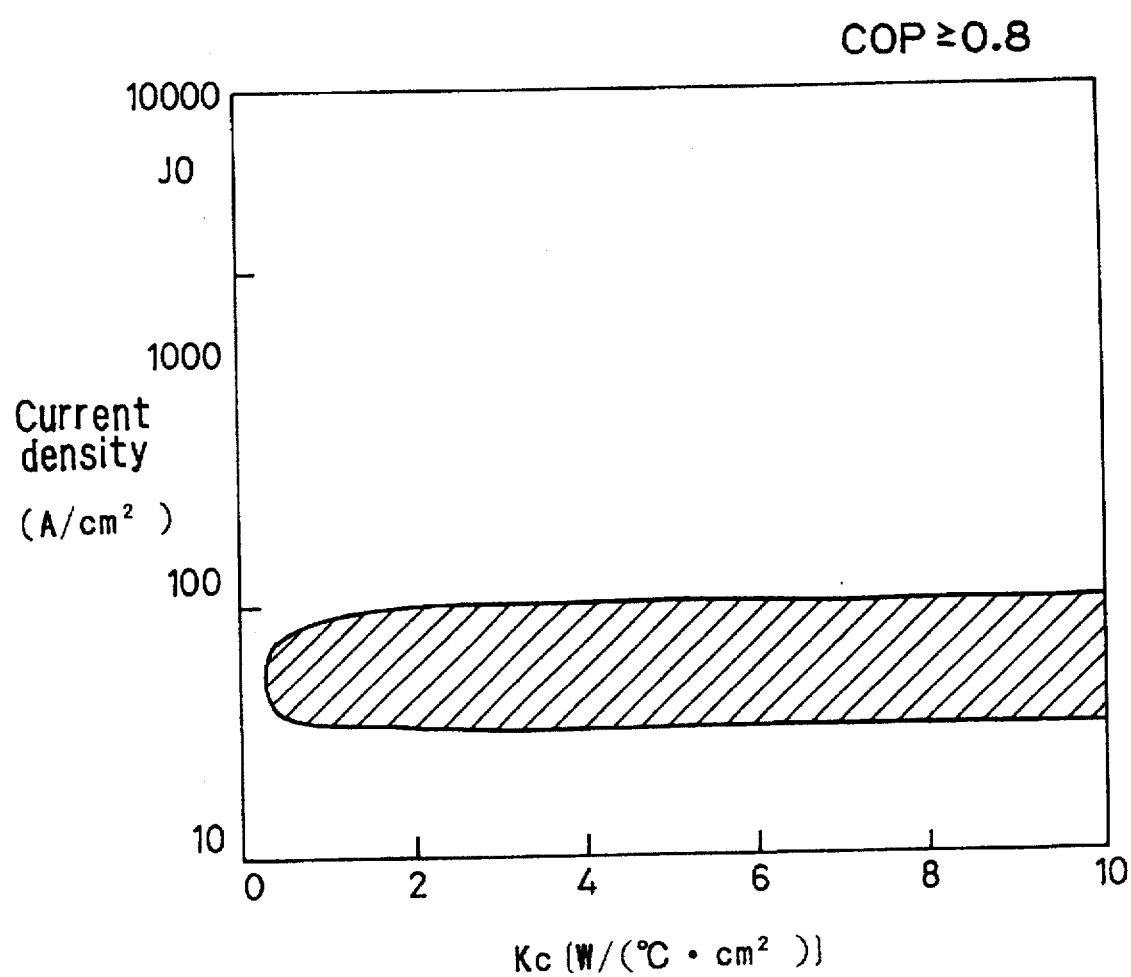
FIG. 35 is a characteristic diagram showing a relationship between $K_C$ and current density at a semiconductor thickness of 0.3 cm and at COPs of 0.8 and greater in the B-type thermoelectric converter.
Figure 36:
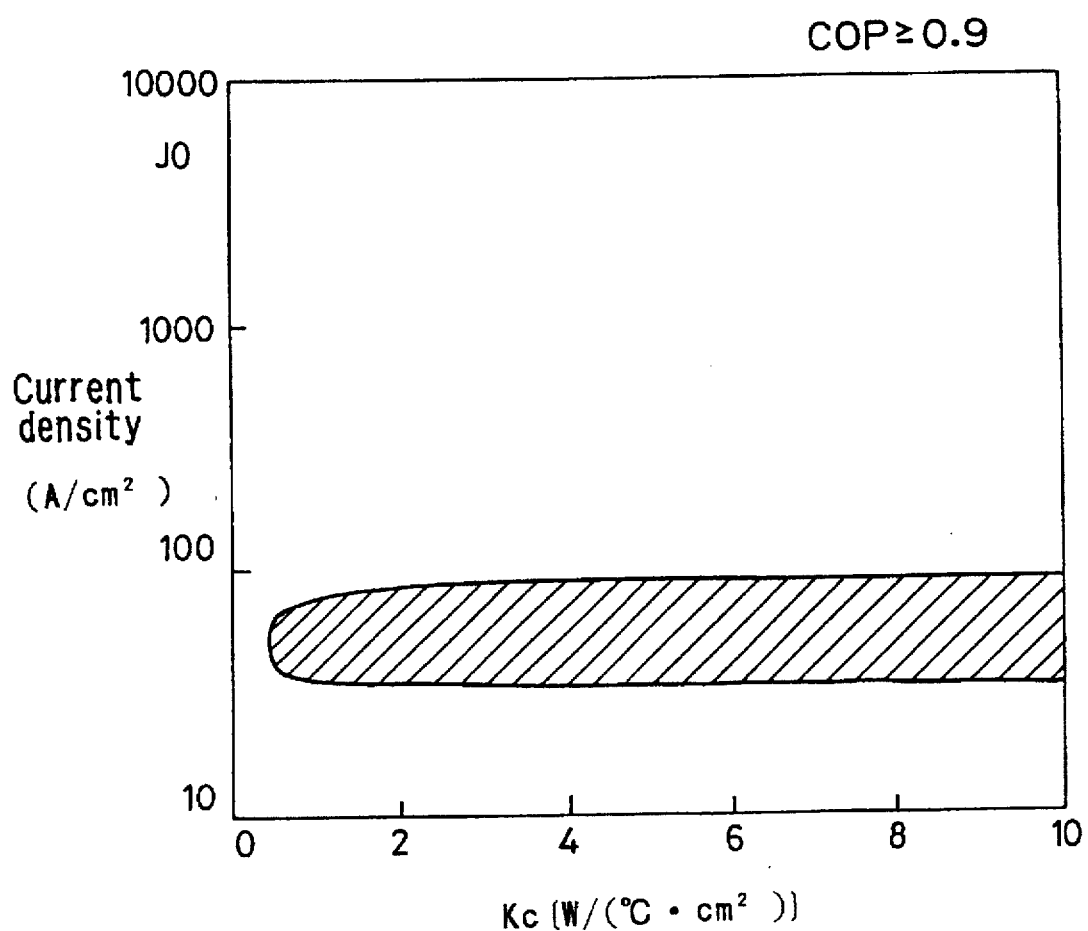
FIG. 36 is a characteristic diagram showing a relationship between $K_C$ and current density at a semiconductor thickness of 0.3 cm and at COPs of 0.9 and greater in the B-type thermoelectric converter.
Figure 37:
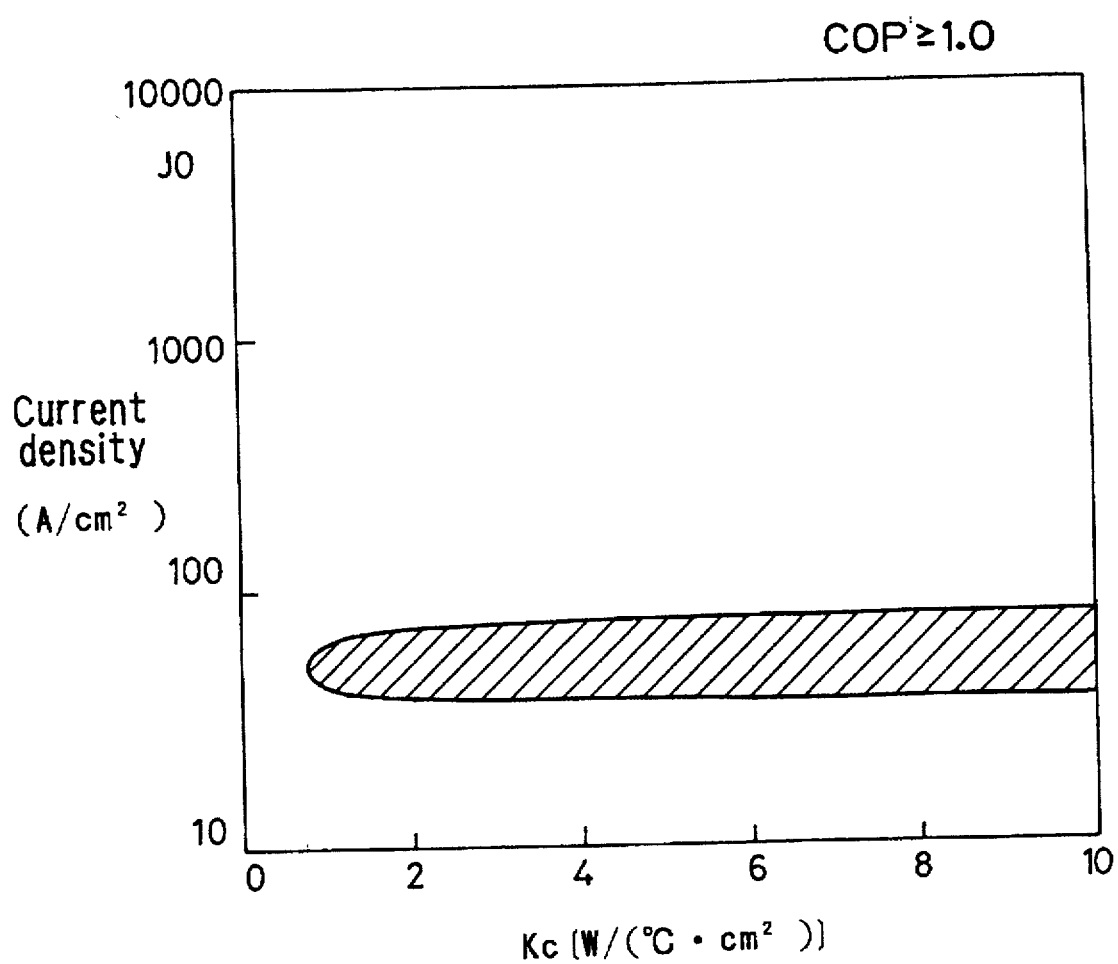
FIG. 37 is a characteristic diagram showing a relationship between $K_C$ and current density at a semiconductor thickness of 0.3 cm and at COPs of 1.0 and greater in the B-type thermoelectric converter.
Figure 38:
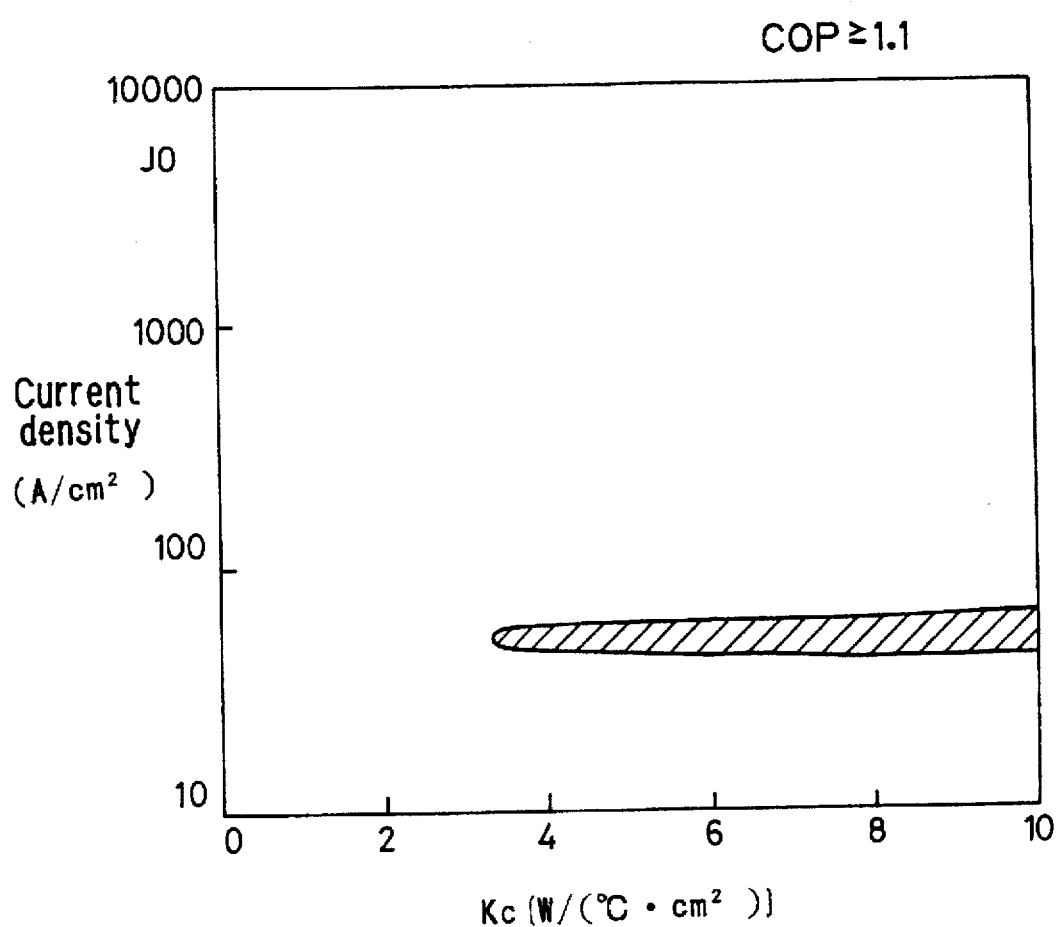
FIG. 38 is a characteristic diagram showing a relationship between $K_C$ and current density at a semiconductor thickness of 0.3 cm and at COPs of 1.1 and greater in the B-type thermoelectric converter.
Figure 39:
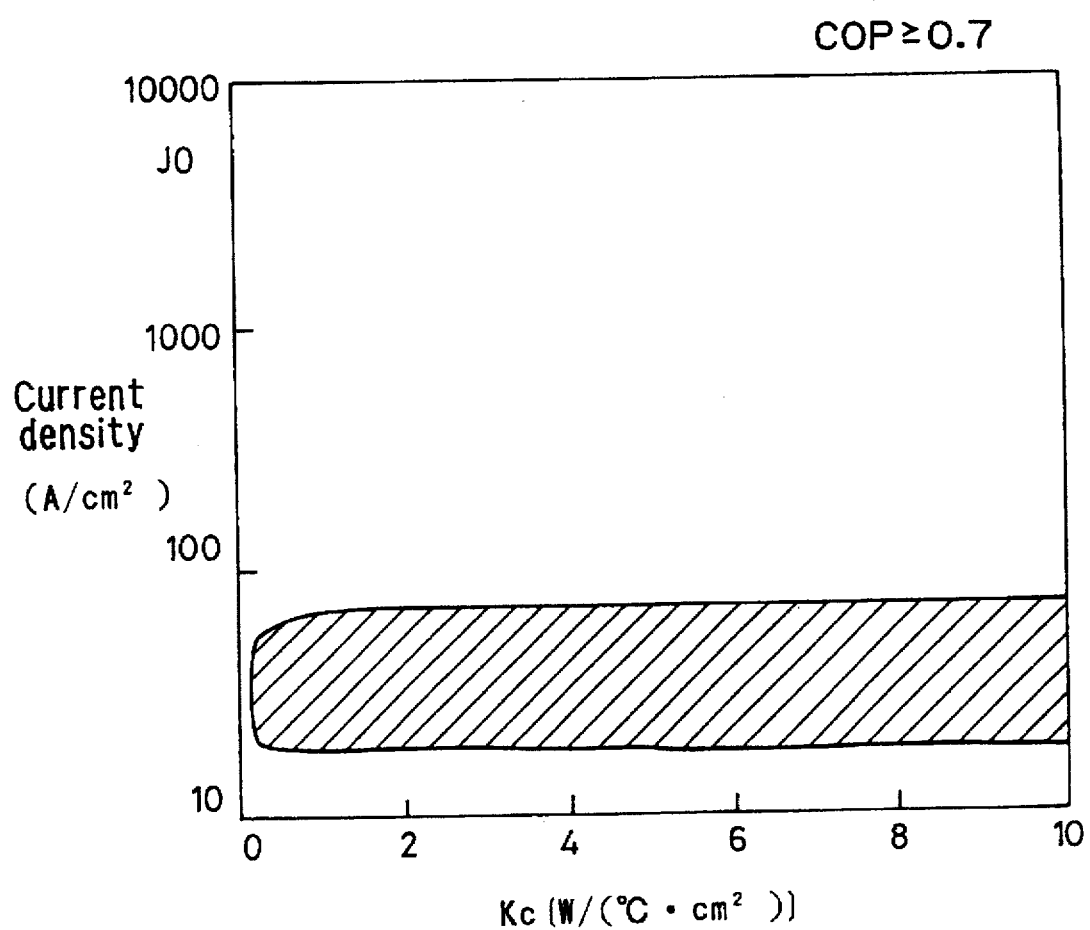
FIG. 39 is a characteristic diagram showing a relationship between $K_C$ and current density at a semiconductor thickness of 0.5 cm and at COPs of 0.7 and greater in the B-type thermoelectric converter.
Figure 40:
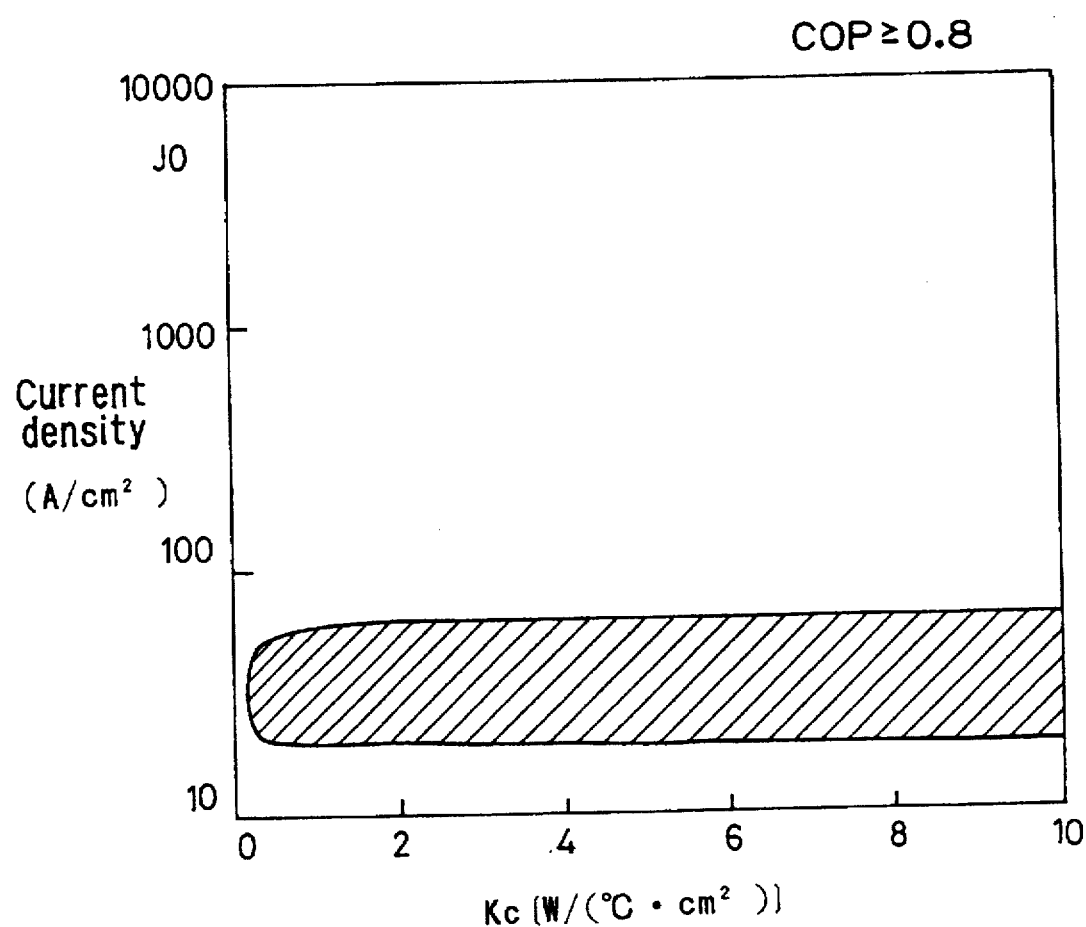
FIG. 40 is a characteristic diagram showing a relationship between $K_C$ and current density at a semiconductor thickness of 0.5 cm and at COPs of 0.8 and greater in the B-type thermoelectric converter.
Figure 41:
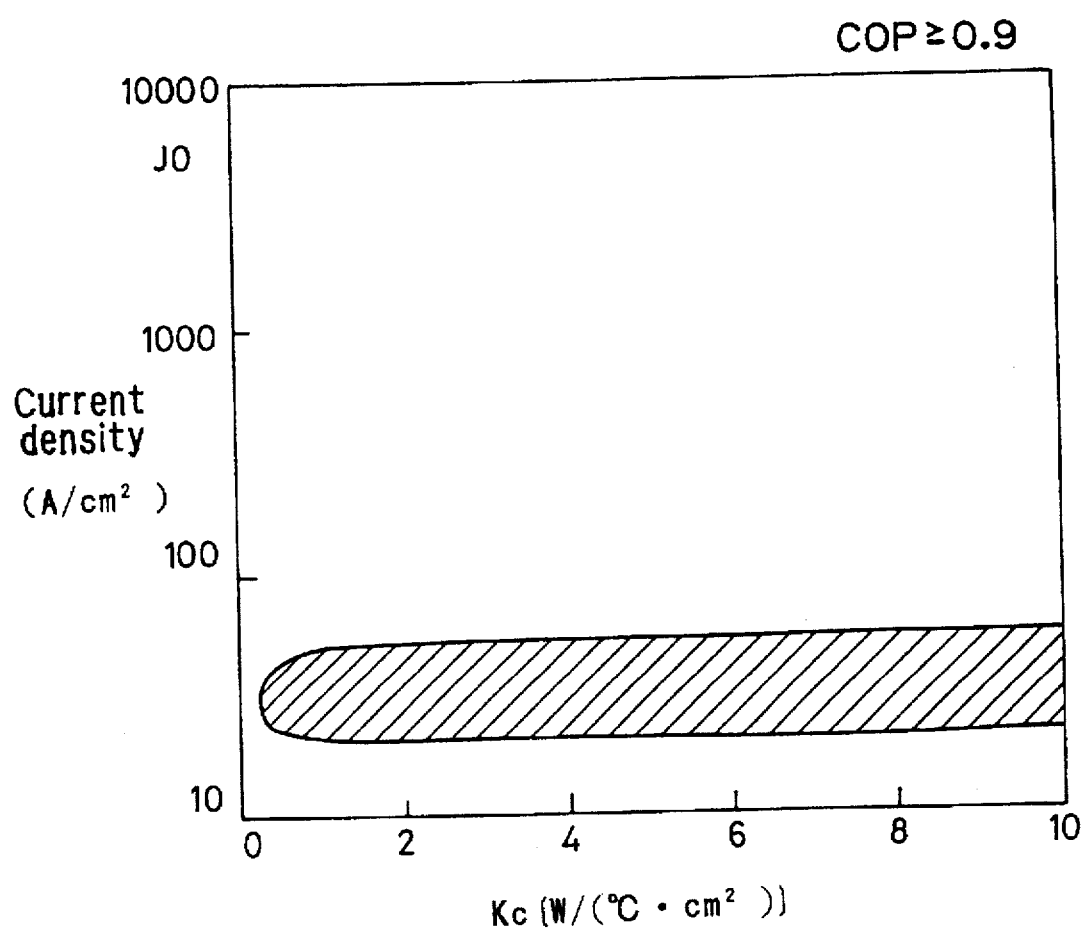
FIG. 41 is a characteristic diagram showing a relationship between $K_C$ and current density at a semiconductor thickness of 0.5 cm and at COPs of 0.9 and greater in the B-type thermoelectric converter.
Figure 42:
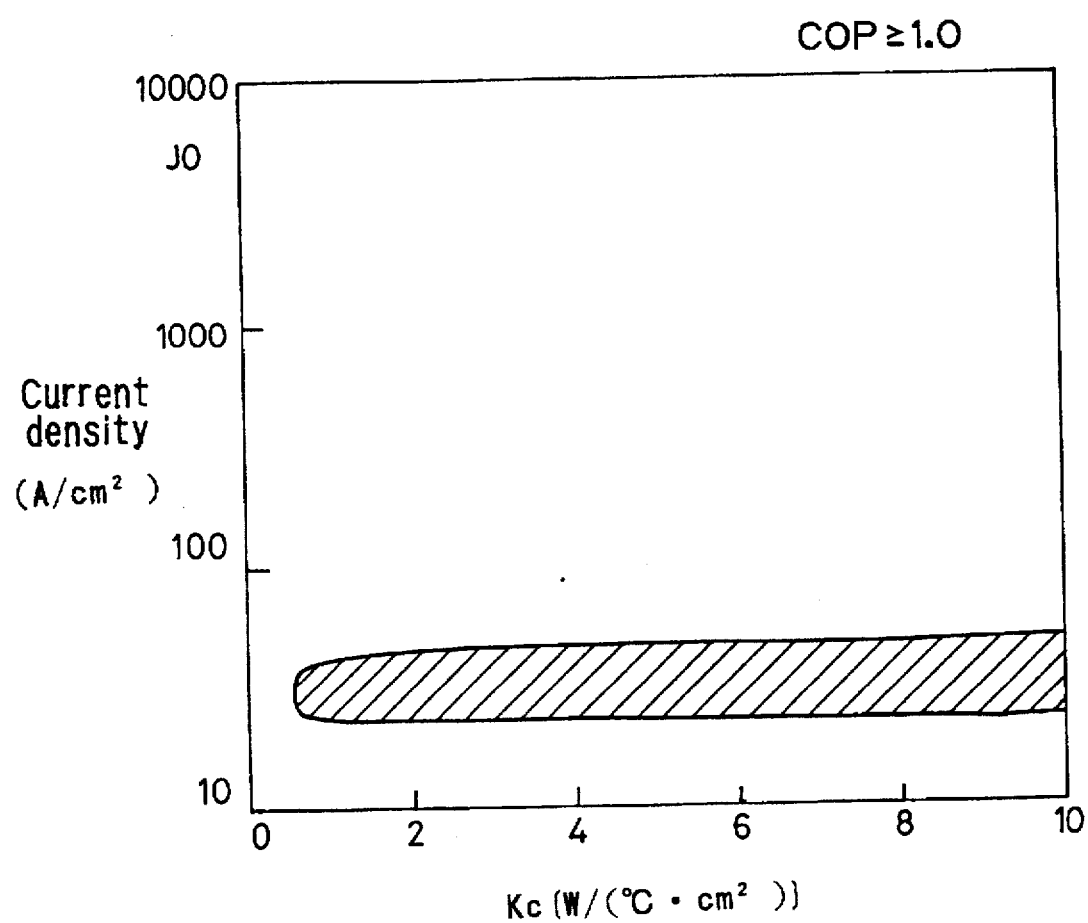
FIG. 42 is a characteristic diagram showing a relationship between $K_C$ and current density at a semiconductor thickness of 0.5 cm and at COPs of 1.0 and greater in the B-type thermoelectric converter.
Figure 43:
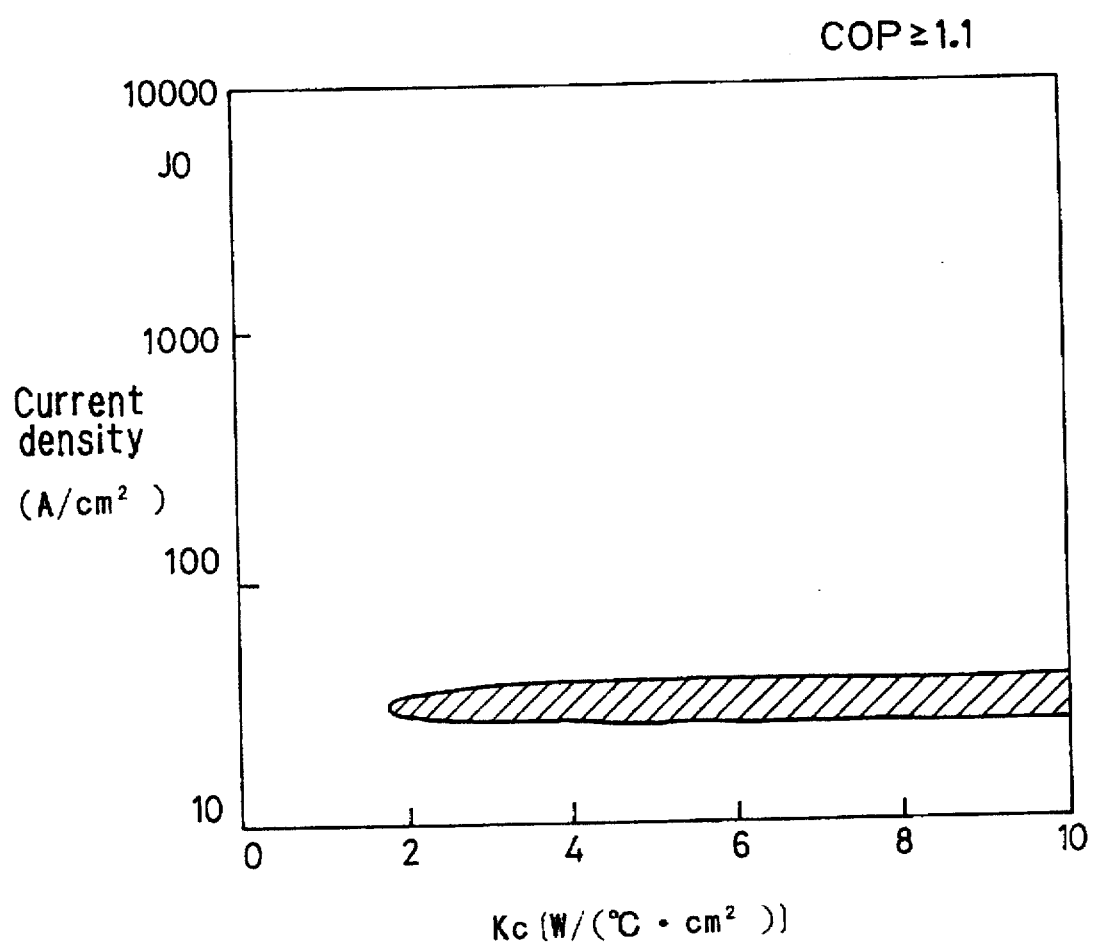
FIG. 43 is a characteristic diagram showing a relationship between $K_C$ and current density at a semiconductor thickness of 0.5 cm and at COPs of 1.1 and greater in the B-type thermoelectric converter.
Figure 44:
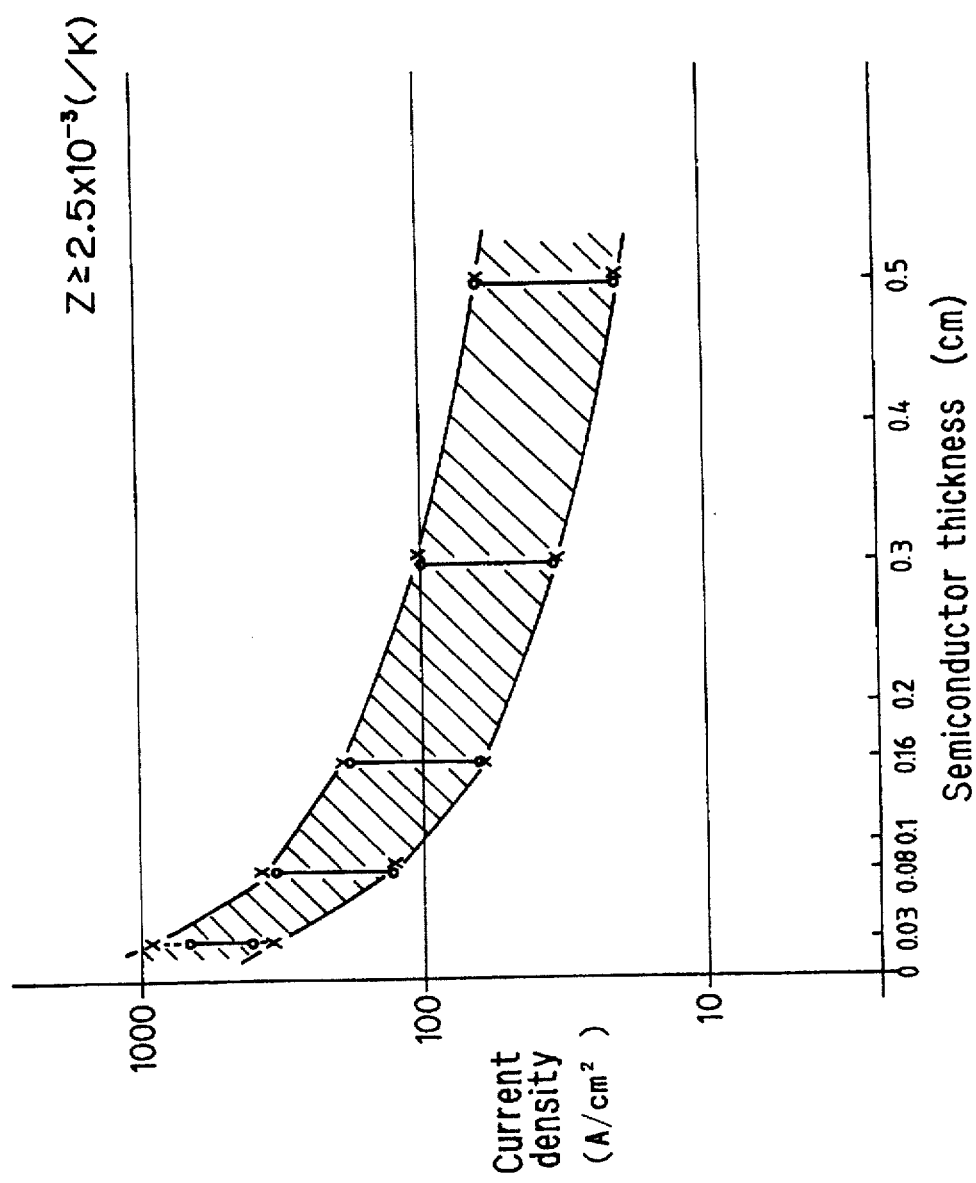
FIG. 44 is a characteristic diagram showing a relationship between semiconductor thickness and current density at an average figure of merit Z of $2.5 \times 10^{-3}$ (/K) in the B-type thermoelectric converter, in which an area of 0.6 and greater in COP is indicated by shading.
Figure 45:
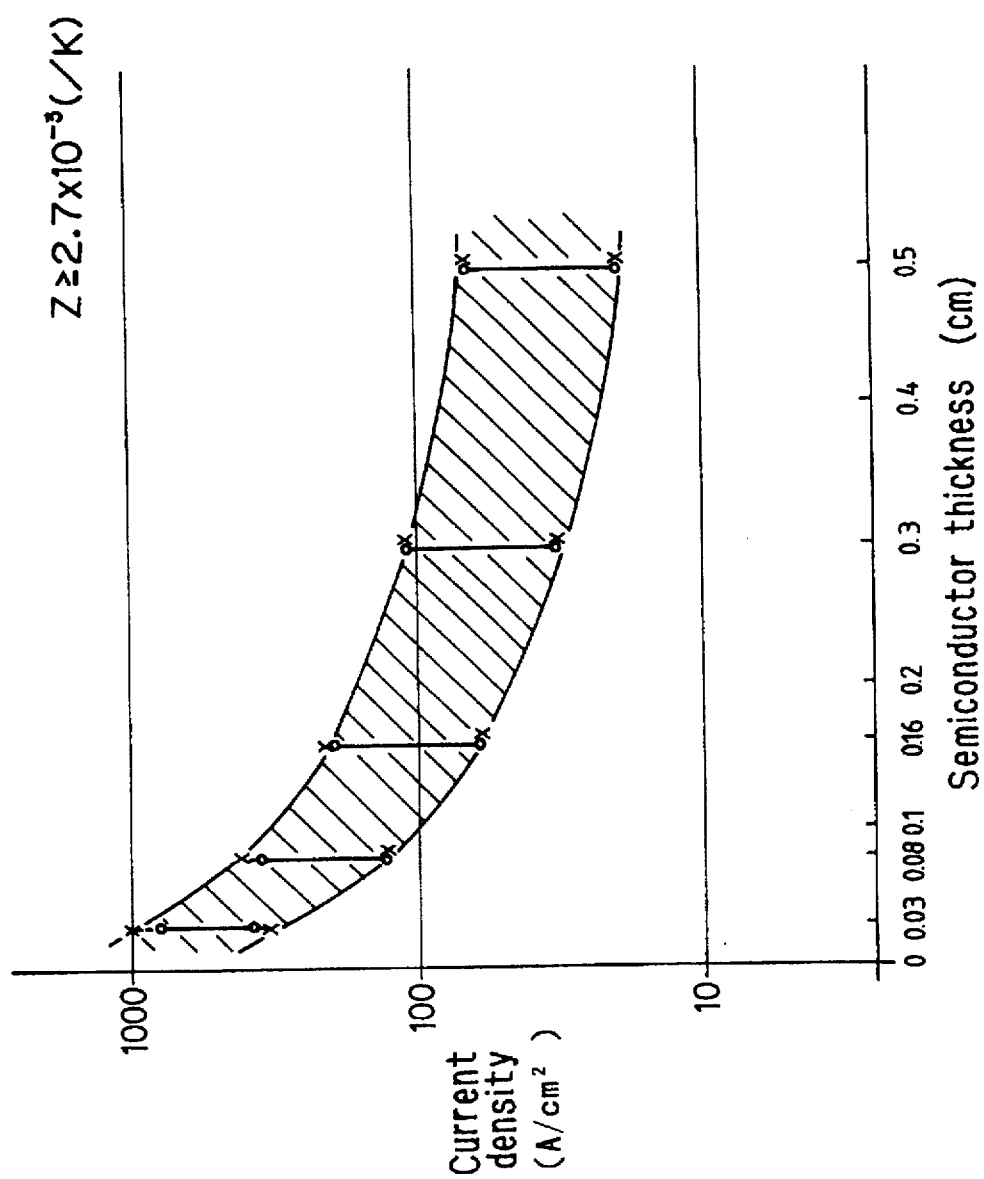
FIG. 45 is a characteristic diagram showing a relationship between semiconductor thickness and current density at an average figure of merit Z of $2.7 \times 10^{-3}$ (/K) in the B-type thermoelectric converter, in which an area of 0.6 and greater in COP is indicated by shading.

FIG. 22 through FIG. 24 show an area of 0.7 and greater in COP (FIG. 22), an area of 0.8 and greater in COP (FIG. 23) and an area of 0.9 and greater in COP (FIG. 24) as determined by using semiconductors having a thickness (t) of 0.03 cm.

FIG. 25 through FIG. 28 show an area of 0.7 and greater in COP (FIG. 25), an area of 0.8 and greater in COP (FIG. 26), an area of 0.9 and greater in COP (FIG. 27) and an area of 1.0 and greater (FIG. 28) as determined by using semiconductors having a thickness (t) of 0.08 cm.

FIG. 29 through FIG. 33 show an area of 0.7 and greater in COP (FIG. 29), an area of 0.8 and greater in COP (FIG. 30), an area of 0.9 and greater in COP (FIG. 31), an area of 1.0 and greater (FIG. 32) and an area of 1.1 and greater (FIG. 33) as determined by using semiconductors having a thickness (t) of 0.16 cm.

FIG. 34 through FIG. 38 show an area of 0.7 and greater in COP (FIG. 34), an area of 0.8 and greater in COP (FIG. 35), an area of 0.9 and greater in COP (FIG. 36), an area of 1.0 and greater (FIG. 37) and an area of 1.1 and greater (FIG. 38) as determined by using semiconductors having a thickness (t) of 0.3 cm.

FIG. 39 through FIG. 43 show an area of 0.7 and greater in COP (FIG. 39), an area of 0.8 and greater in COP (FIG. 40), an area of 0.9 and greater in COP (FIG. 41), an area of 1.0 and greater (FIG. 42) and an area of 1.1 and greater (FIG. 43) as determined by using semiconductors having a thickness (t) of 0.5 cm.

As is appreciated from these diagrams, the shaded area becomes narrower and the value of $K_C$ is more limited, as the value of COP becomes gradually higher.

FIG. 44 through FIG. 48 are characteristic diagrams, which show areas of 0.6 and greater in COP by shading as obtained by determining relationships between the thickness (t) of semiconductors and the current density at varied average figures of merit (Z). The characteristic diagram of FIG. 44 corresponds to $2.5 \times 10^{-3}$/K as Z, that of FIG. 45 to $2.7 \times 10^{-3}$/K as Z, that of FIG. 46 to $3.0 \times 10^{-3}$/K, that of FIG. 47 to $3.5 \times 10^{-3}$/K, and that of FIG. 48 to $4.0 \times 10^{-3}$/K.

In the individual diagrams, circles (○) indicate the A-type thermoelectric converter while crosses (X) represent the C-type thermoelectric converter. There is no substantial differences between these two types when the thickness (t) of semiconductors is relatively large. A certain type-dependent difference is however observed when the thickness (t) of semiconductors becomes small.

As is apparent from these diagrams, there is a correlation among the thickness (t) of semiconductors and the current density required to obtain an area of 0.6 and greater in COP. When the thickness (t) of semiconductors is relatively large, for example, 0.3 cm or 0.5 cm, it is necessary to limit the current density to a low range. On the other hand, when the thickness (t) of semiconductors is relatively small, for example, 0.03 cm, 0.08 cm or 0.16 cm, it is necessary to limit the current density to a high range.

Figure 46:
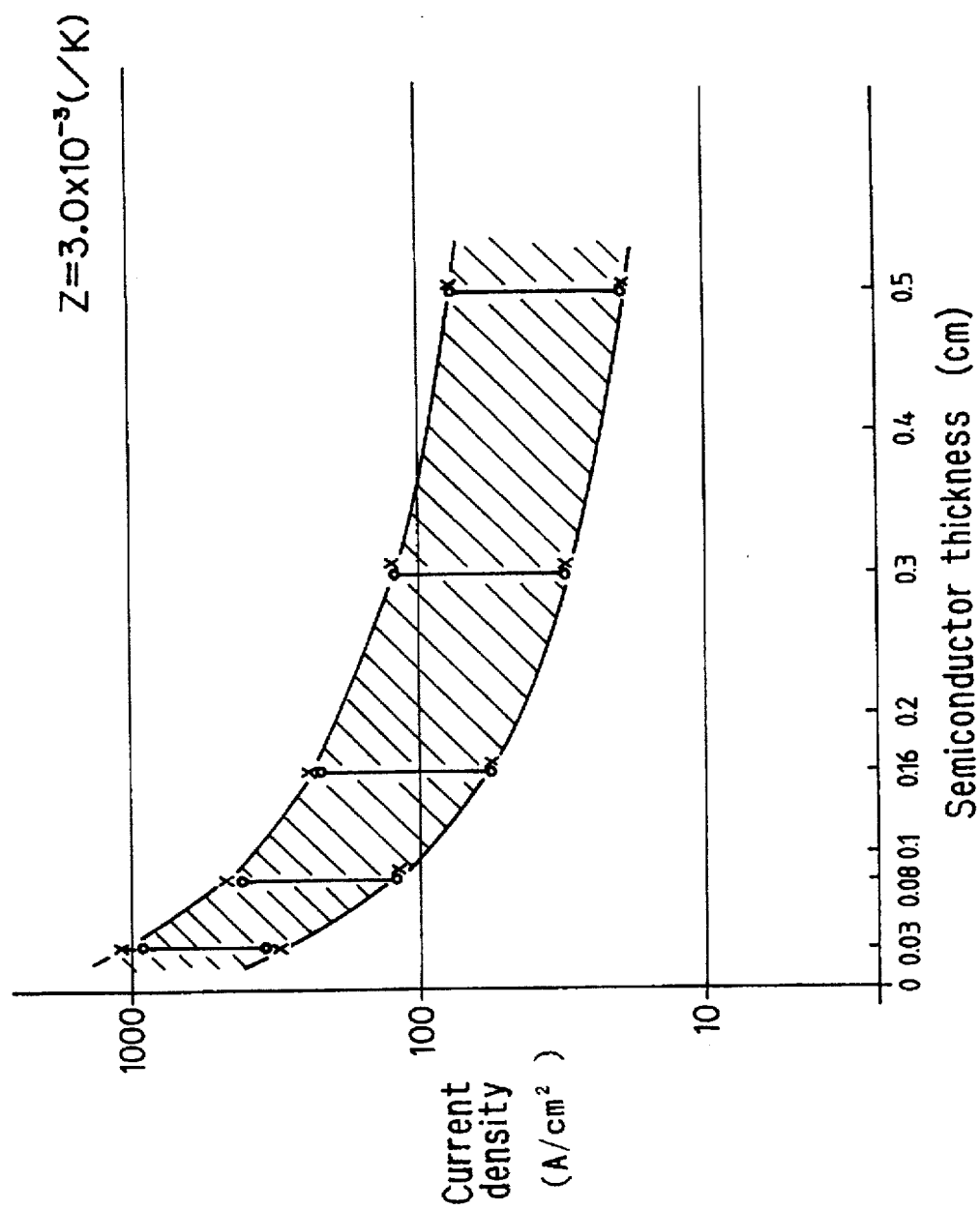
FIG. 46 is a characteristic diagram showing a relationship between semiconductor thickness and current density at an average figure of merit Z of $3.0 \times 10^{-3}$ (/K) in the B-type thermoelectric converter, in which an area of 0.6 and greater in COP is indicated by shading.
Figure 47:
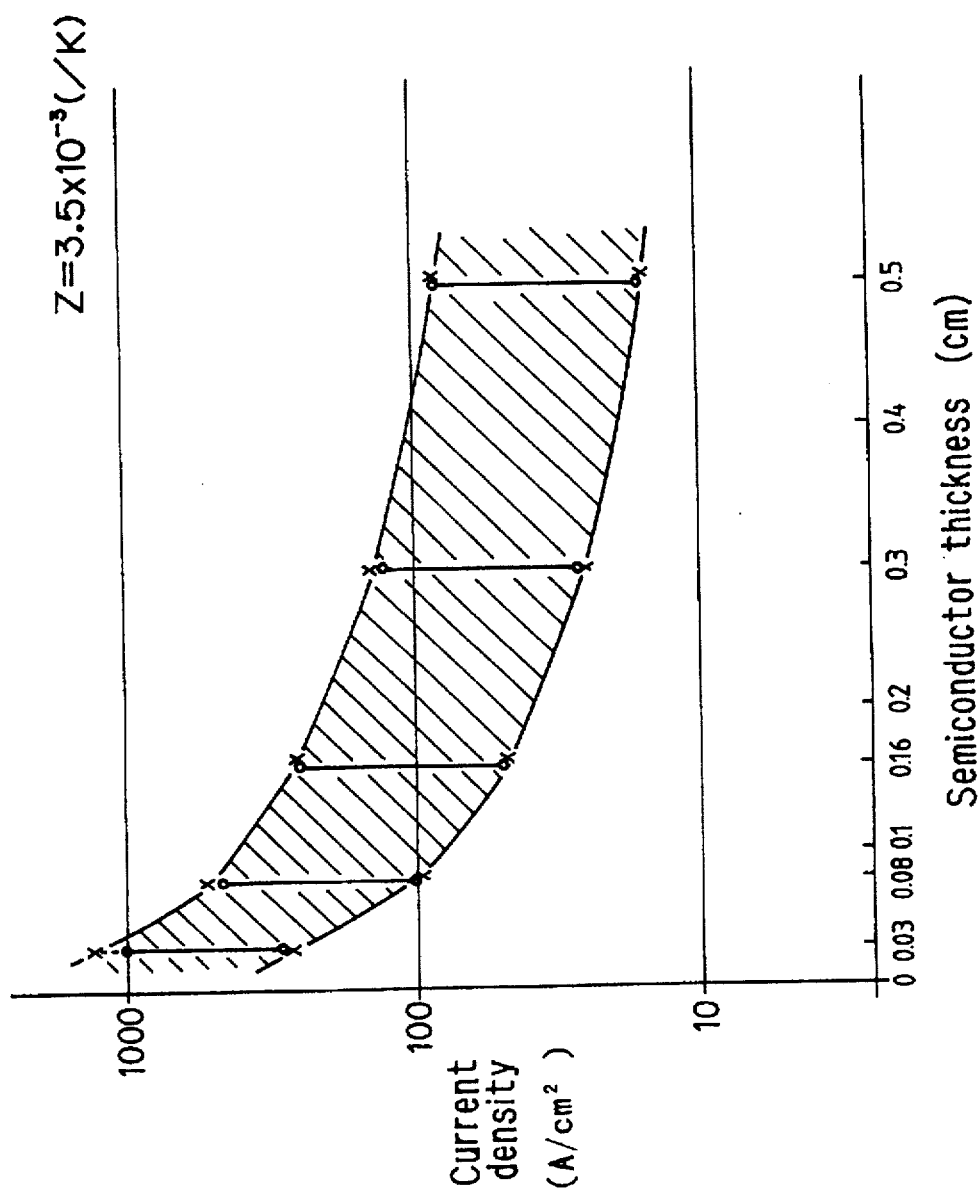
FIG. 47 is a characteristic diagram showing a relationship between semiconductor thickness and current density at an average figure of merit Z of $3.5 \times 10^{-3}$ (/K) in the B-type thermoelectric converter, in which an area of 0.6 and greater in COP is indicated by shading.
Figure 48:
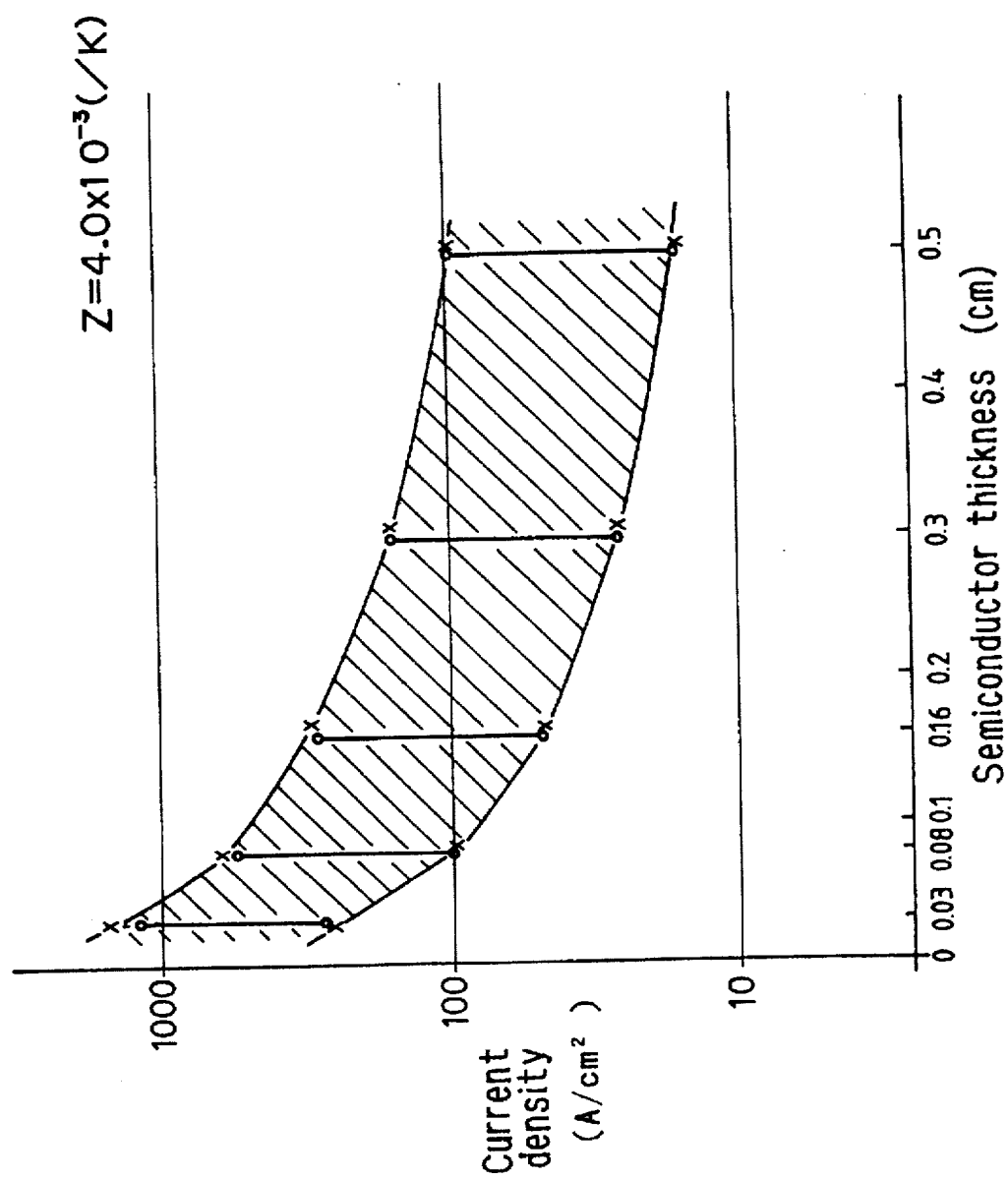
FIG. 48 is a characteristic diagram showing a relationship between semiconductor thickness and current density at an average figure of merit Z of $4.0 \times 10^{-3}$ (/K) in the B-type thermoelectric converter, in which an area of 0.6 and greater in COP is indicated by shading.

This will be described using a specific example. In a thermoelectric converter in which Z and the thickness (t) of its semiconductors are, for example, $3.0 \times 10^{-3}$/K and 0.03 cm, respectively, as shown in FIG. 46, limitation of the current density to a range of from 310 to 1,100 A/cm² can achieve a COP of 0.6 or greater. Even in the case of semiconductors having the same Z value, an increase in the semiconductor thickness (t) to 0.3 cm requires to limit the current density to a range of from 31 to 120 A/cm² if one wants to achieve a COP of 0.6 or greater.

As is evident from a comparison among FIG. 44 through FIG. 48, an adequate range of current densities for a semiconductor thickness (t) somewhat varies depending on the value of Z. Upon designing a thermoelectric converter, it is therefore necessary to specifically choose a current density value in accordance with the value of Z and the thickness (t) of semiconductors.

Figure 49:
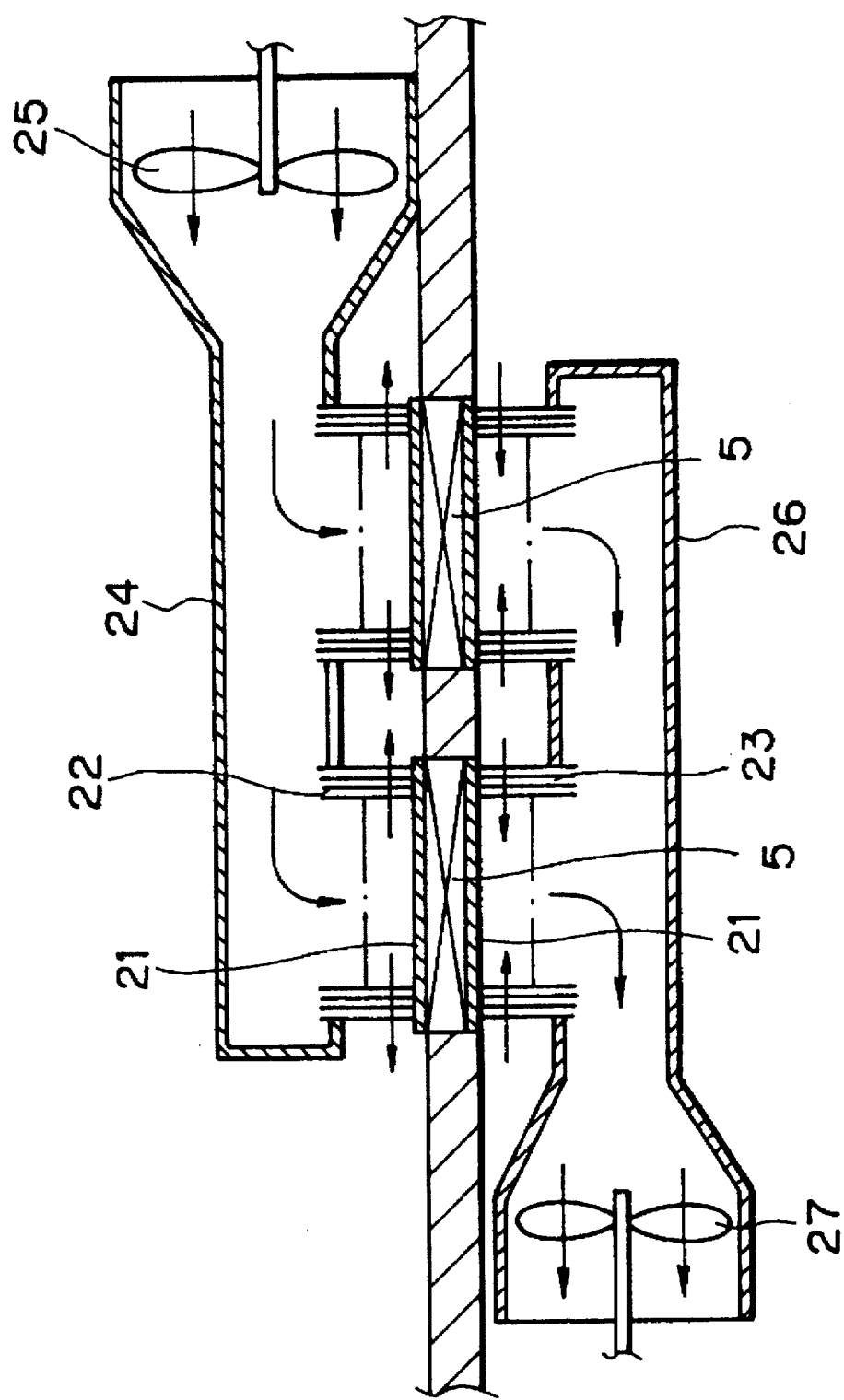
FIG. 49 is a cross-sectional view of a thermoelectric converter according to a second embodiment of the present invention.

The thermoelectric converter according to the second embodiment of the present invention will next be described with reference to FIG. 49. As is shown in this drawing, heat-absorbing-side fins 22 formed of numerous pin-shaped fins arranged on a base board 21 are bonded on one side (upper side) of each thermoelectric cooling chip series 5. On the other side (lower side) of the thermoelectric cooling chip series 5, heat-dissipating-side fins 23 formed of numerous pin-shaped fins disposed on a base board 21 are bonded. Each thermoelectric cooling chip series 5 is of the same construction as those employed in the first embodiment. A silicone grease or heat-conducting gel (not shown) similar to that mentioned above is interposed between each thermoelectric cooling chip series 5 and its associated base board 21.

The heat-absorbing-side fins 22 are enclosed within a heat-absorbing-side duct 24 so that air can be forcedly fed axially of the heat-absorbing-side fins 22 by a heat-absorbing-side fan 25. On the other hand, the heat-dissipating-side fins 23 are enclosed within a heat-dissipating-side duct 26 so that air present around the heat-dissipating-side fins 23 can be forcedly drawn by a heat-dissipating-side fan 27.

A desired heat transfer area can be obtained by choosing an appropriate diameter, pitch and height for the pin fins.

Figure 50:
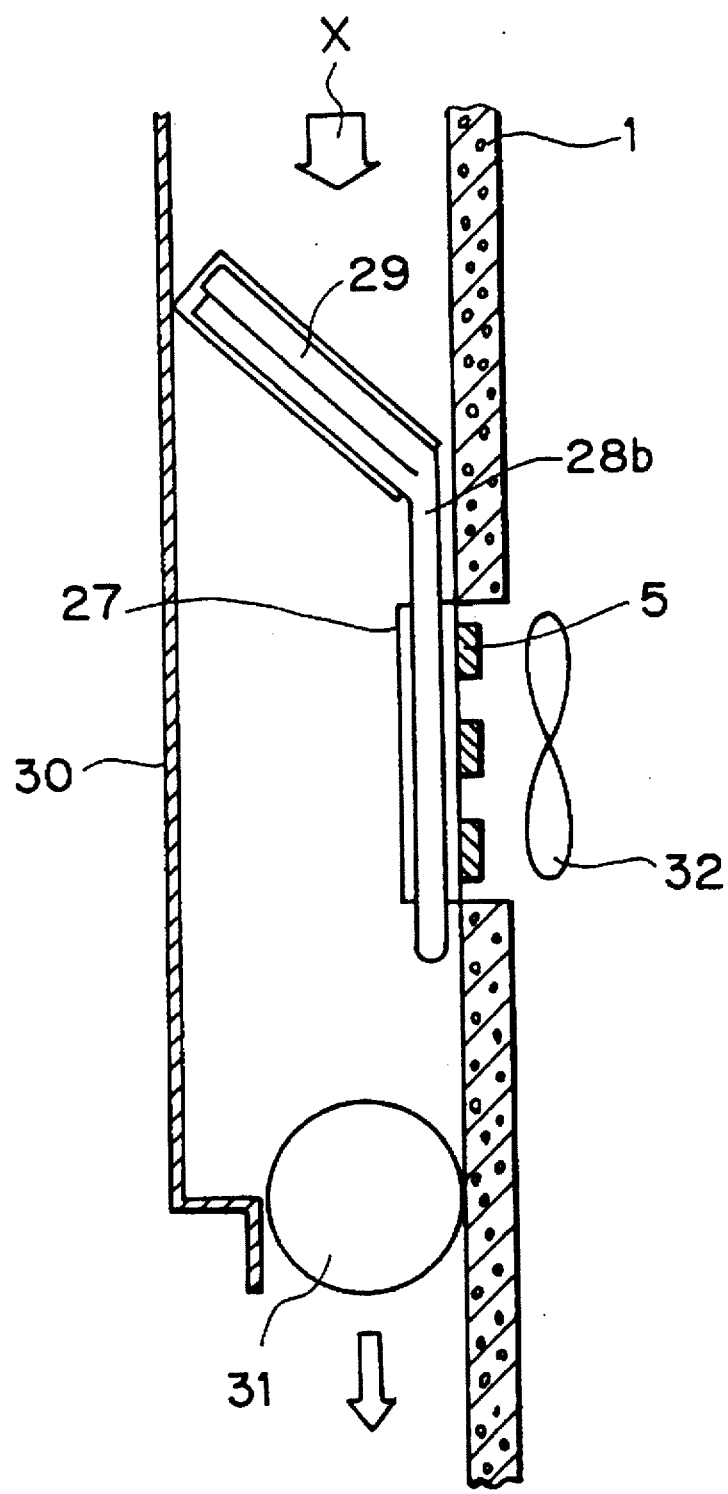
FIG. 50 is a cross-sectional view of a thermoelectric converter according to a third embodiment of the present invention.
Figure 51:
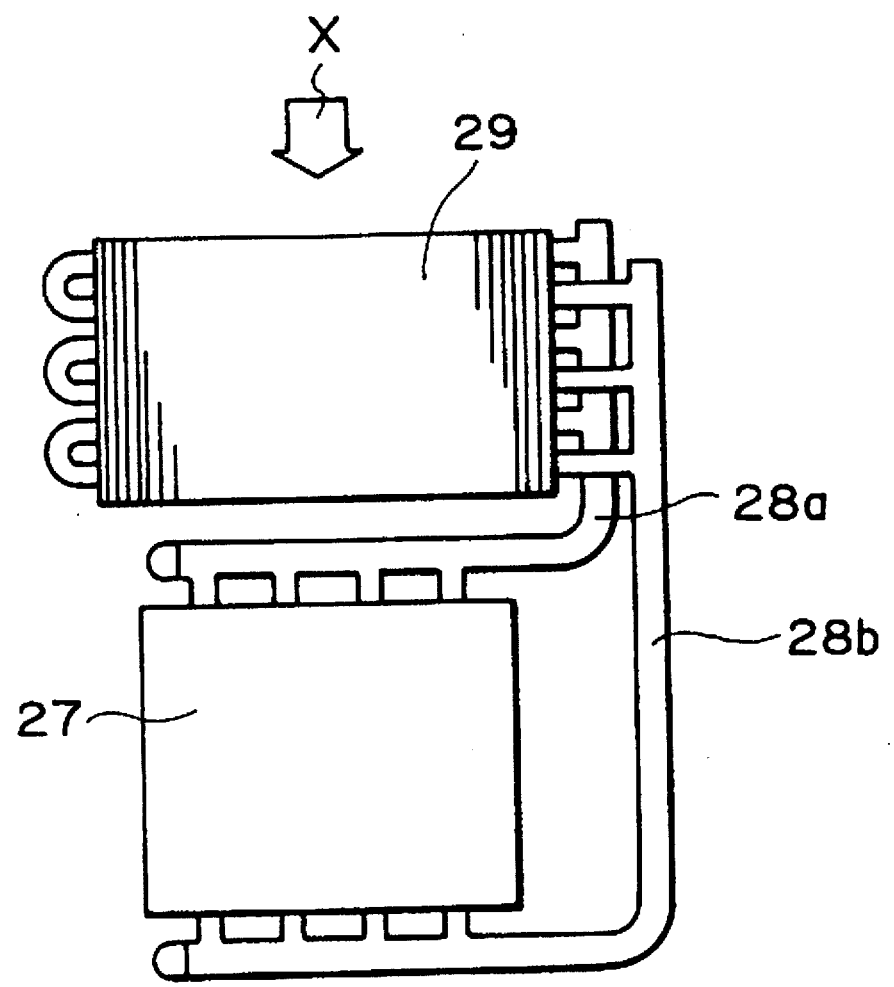
FIG. 51 is a side view of the thermoelectric converter of FIG. 50.

The thermoelectric cooling device according to the third embodiment of the present invention will now be described with reference to FIG. 50 and FIG. 51. As is illustrated in FIG. 50, thermoelectric cooling chip series 5 are mounted on a planar heat-receiving portion 27 of heat pipes via a silicone grease or heat-conducting gel (not shown). Evaporator-side tubing 28a and condenser-side tubing 28b of the heat pipes are connected to the heat-receiving portion 27. Opposite ends of the tubings 28a,28b are connected to a finned, heat-dissipating portion 29 of the heat pipes, which heat-dissipating portion 29 is disposed in an inclined position. The heat pipes include wicks internally formed therein and are filled, for example, with a volatile working medium such as an alcohol. Through repeated evaporation and condensation of the working medium, the heat pipes can absorb heat from the thermoelectric cooling chip series 5 and can dissipate it. The heat-receiving portion 27, the heat-dissipating portion 29, and the like are enclosed within a duct 30. A cooling blower 32 is disposed in a lower part of the duct 30 so that air is fed in the direction indicated by arrow X. Incidentally, numeral 32 indicates an interior fan which blows air toward the heat-absorbing sides of the thermoelectric cooling chip series 5.

Use of flexible ones as the heat pipes makes it possible to reduce impact and vibrations which are applied to the thermoelectric cooling chip series 5.

Figure 52:
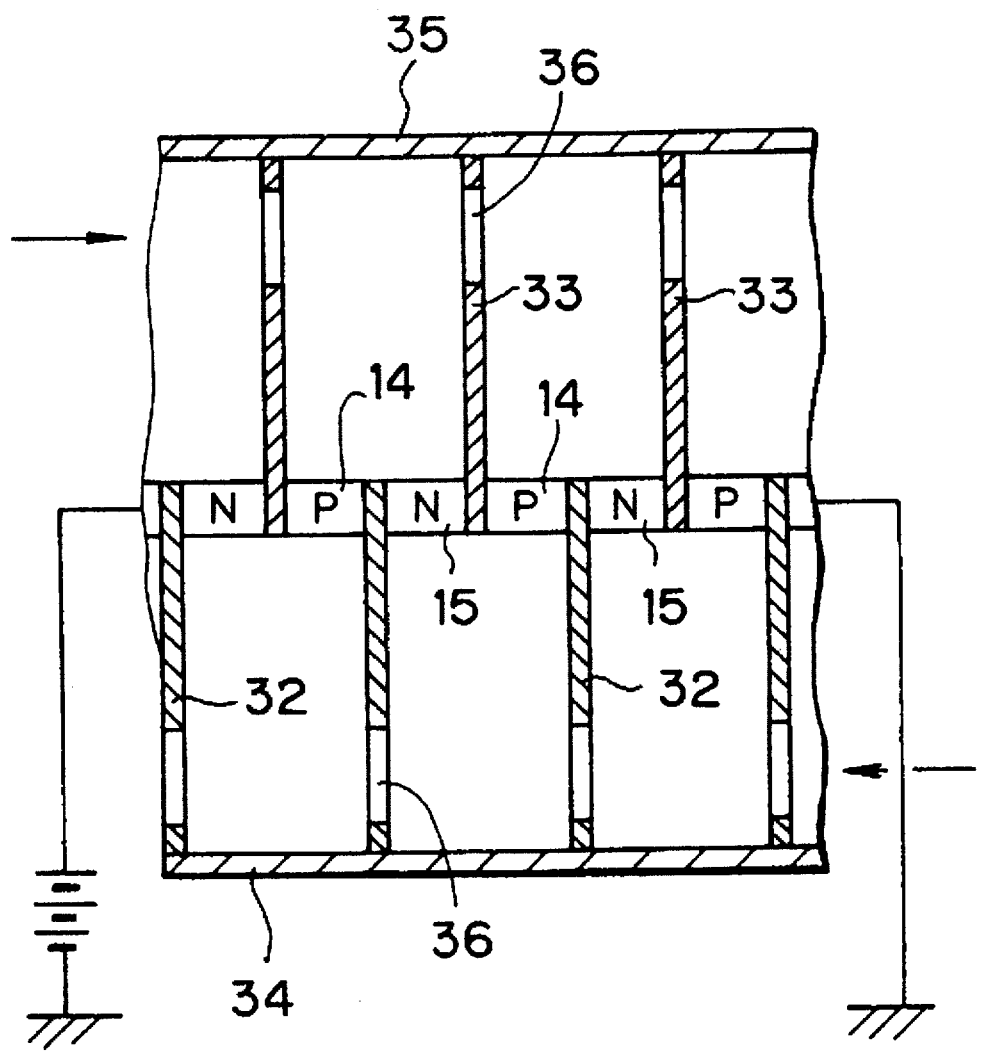
FIG. 52 is a cross-sectional view of a thermoelectric converter according to a fourth embodiment of the present invention.

The thermoelectric converter according to the fourth embodiment of the present invention will next be described with reference to FIG. 52. In this embodiment, heat-absorbing electrodes 32 and heat-dissipating electrodes, which also serve as heat-absorbing-side heat conductors and heat-dissipating-side heat conductors, respectively, are alternately held at base portions thereof between a number of p-type semiconductor chips 14 and a number of n-type semiconductor chips 15.

As is illustrated in the drawing, the heat-absorbing electrodes 32 project toward a heat-absorbing-side duct 34 while the heat-dissipating electrodes 33 extend toward a heat-dissipating-side duct 35. Air-flowing openings 36 are formed through the electrodes 32,33 at intermediate positions thereof.

When a fluid (gas or liquid) flows in a direction perpendicular to the drawing sheet in a structure like that of the fourth embodiment, the openings 36 of the electrodes 32,33 can be omitted.

Figure 53:
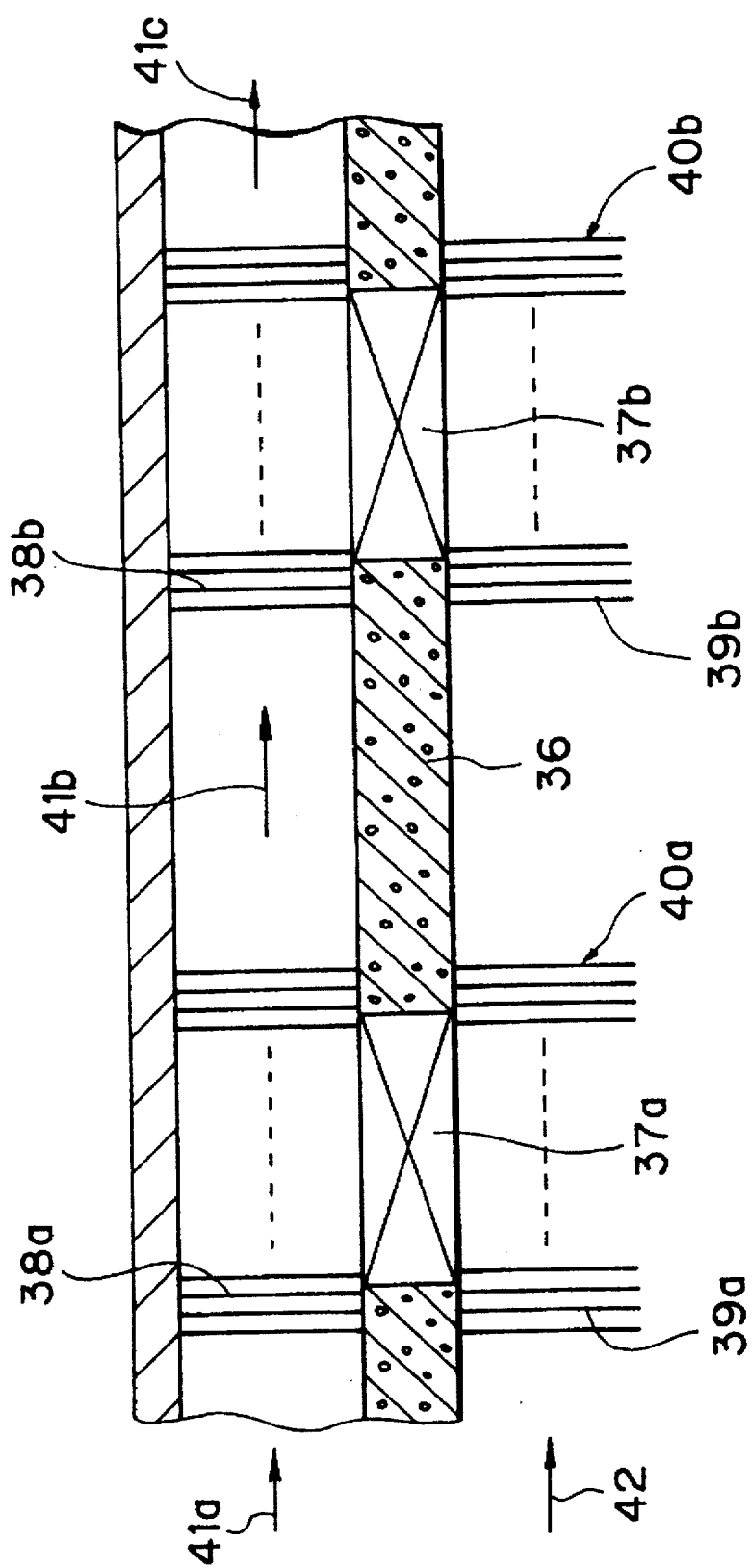
FIG. 53 is a cross-sectional view of a thermoelectric converter according to a fifth embodiment of the present invention.

The thermoelectric converter according to the fifth embodiment is shown in FIG. 53. This embodiment illustrates the thermoelectric converter as applied to an air conditioner. In a partition 36, first thermoelectric cooling chip series 37a and second thermoelectric cooling chip series 37b are arranged at predetermined intervals.

First heat-absorbing fins 38a are connected to an interior side of each first thermoelectric cooling chip series 37a and second heat-absorbing fins 38b are connected to an interior side of each second thermoelectric cooling chip series 37b, both by way of a silicone grease layer or a heat-conducting gel (not illustrated).

Further, first heat-dissipating fins 39a are connected to an exterior side of each first thermoelectric cooling chip series 37a and second heat-dissipating fins 39b are connected to an exterior side of each second thermoelectric cooling chip series 37b, both via a silicone grease layer or a heat-conducting gel (not illustrated).

A first thermoelectric converter 40a is constructed of the first thermoelectric chip series 37a, the first heat-absorbing fins 38a and the first heat-dissipating fins 39a, while a second thermoelectric converter 40b is constructed of the second thermoelectric chip series 37b, the second heat-absorbing fins 38b and the second heat-dissipating fins 39b. These first and second thermoelectric converters 40a,40b are arranged in two stages along a flow of air. Although it is possible to arrange more thermoelectric converters, the arrangement of only one thermoelectric converter may still be practical provided that heat conductors of a high thermal conductance are used.

The COP, heat pumping capacity and power consumption of the first thermoelectric converter 40a are set at 4.7, 120 W and 25.5 W, respectively, while the COP, heat pumping capacity and power consumption of the second thermoelectric converter 40b are set at 2.1, 240 W and 114.3 W, respectively. Accordingly, the overall COP as the air conditioner is 2.58 as calculated below $$Overall\ COP=(120+240)/(25.5+114.3)=2.58$$

When the temperature of air 41a of an exterior 42 and that of air drawn against the first heat-absorbing fins 38a of the first thermoelectric converter 40a are both 30° C. in this embodiment, the temperature of air 41b which is discharged past the first heat-absorbing fins 38a has been lowered by 5° C. to 25° C. The air 41b is then discharged as air 41c past the second heat-absorbing fins 38b. The temperature of the air 41c has been lowered further by 10° C. to 15° C.

Figure 54:
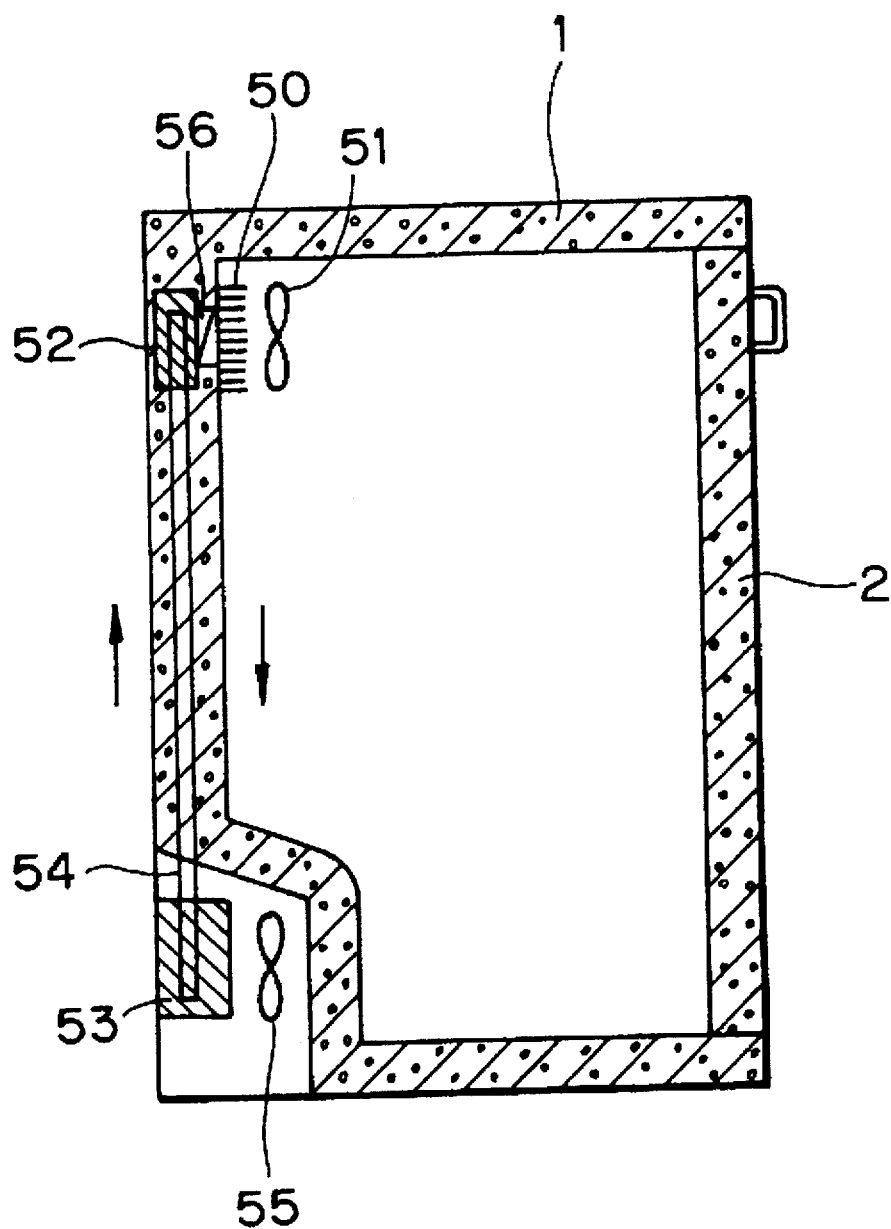
FIG. 54 is a cross-sectional view of a thermoelectric converter according to a sixth embodiment of the present invention.

The thermoelectric converter according to the sixth embodiment of the present invention is shown in FIG. 54. In this embodiment, the thermoelectric converter is applied as a cooling device for a thermoelectric refrigerator. Heat-absorbing-side fins 50 and a heat-absorbing-side fan 51 are arranged on a heat-absorbing side. On the other hand, arranged on a heat-dissipating side are a heat-dissipating-side heat-conducting portion 52, a radiator 53 disposed at a position remote from the heat-dissipating-side heat-conducting portion 52 and adapted to efficiently dissipate transferred heat into the atmosphere, a circulation system filled internally with a circulating fluid such as water (not shown), and a fan 55 disposed in the vicinity of the radiator 53. The radiator 53 and the fan 55 are exposed in the atmosphere. The circulation system 54 is connected at one end thereof to the heat-dissipating-side heat-conducting portion 52 and at an opposite end thereof to the radiator 53. Designated at numeral 56 in the drawing is a thermoelectric cooling chip series which is arranged between the heat-absorbing-side fins 50 and the heat-dissipating-side heat-conducting portion 52.

In this embodiment, the radiator, fan and the like are arranged on the heat-dissipating side. However it is also possible to arranged the radiator and the fan on the heat-absorbing side. In this modification, however, it is necessary to use, as a circulating fluid, an antifreeze or another liquid which does not freeze at low temperatures.

When a heat conductor is provided with a radiator which promotes dissipation or absorption of heat, a still higher heat-exchanging performance can be exhibited.

In the second to sixth embodiments, the current density is also made higher when the semiconductor thickness is small but lower when the semiconductor thickness is large as in the above-described first embodiment.

In each of the above-described embodiments, a silicone grease or heat-conducting gel is interposed between each electrode, which connects individual semiconductor layers together, and its corresponding heat conductor so that the electrode is displaceable relative to the heat conductor. As an alternative, it is also possible to fix the electrode on a substrate having electrically insulating property—such as an alumina substrate, an aluminum nitride substrate or a metal substrate with an insulating film formed on a surface thereof—by soldering or the like and hold the electrode between the substrate and the semiconductor layers.

In the above-described embodiments, the thermoelectric refrigerators and air conditioner were described as applications of thermoelectric converters. It is however to be noted that the present invention is not limited to such applications but can be applied to other applications of thermoelectric converters, for example, to dehumidifiers.

Figure 55:
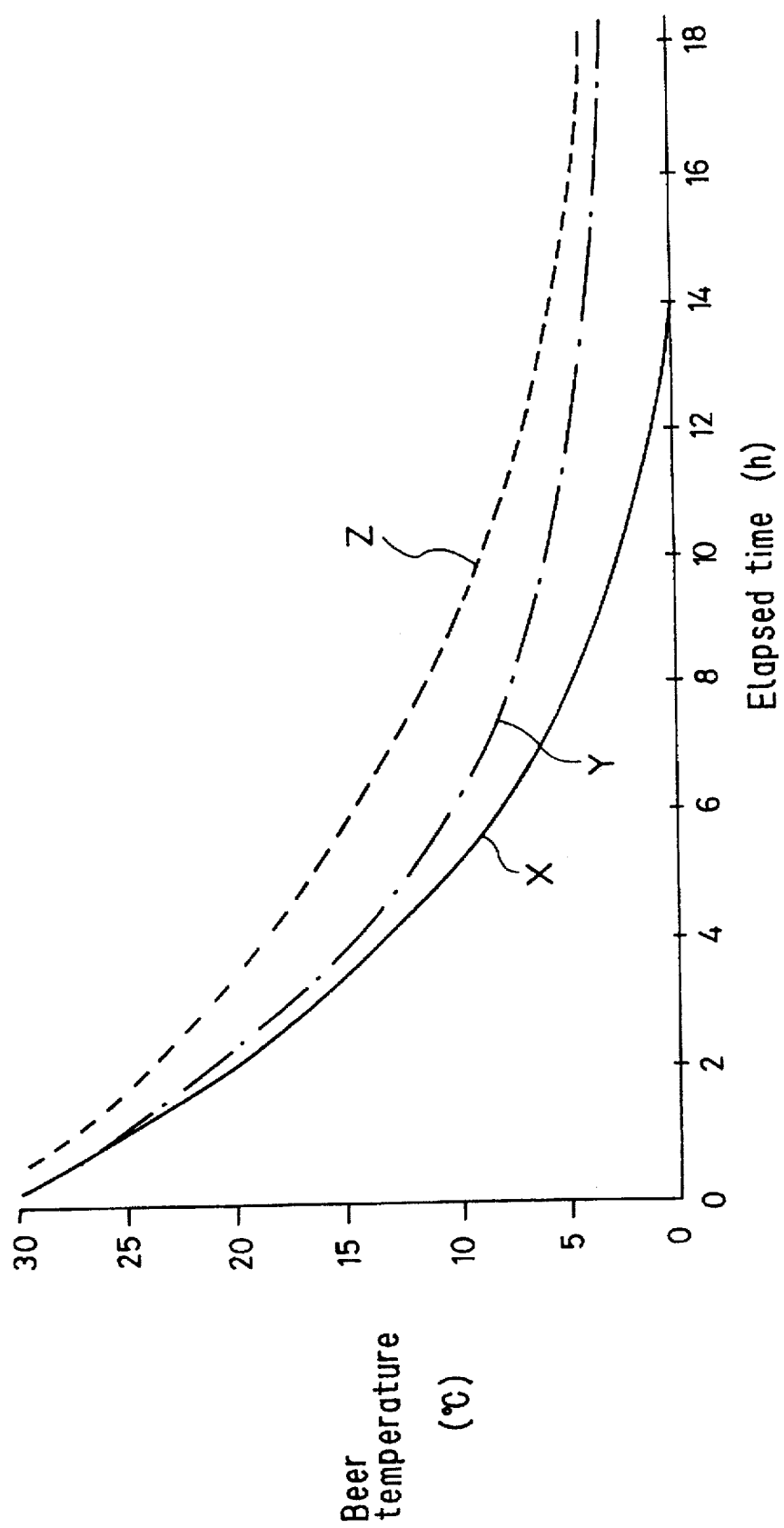
FIG. 55 is a characteristic diagram showing cooling performances of thermoelectric converters (thermoelectric refrigerators) according to the present invention in comparison with that of a conventional compressor-type electric refrigerator.
Figure 56:
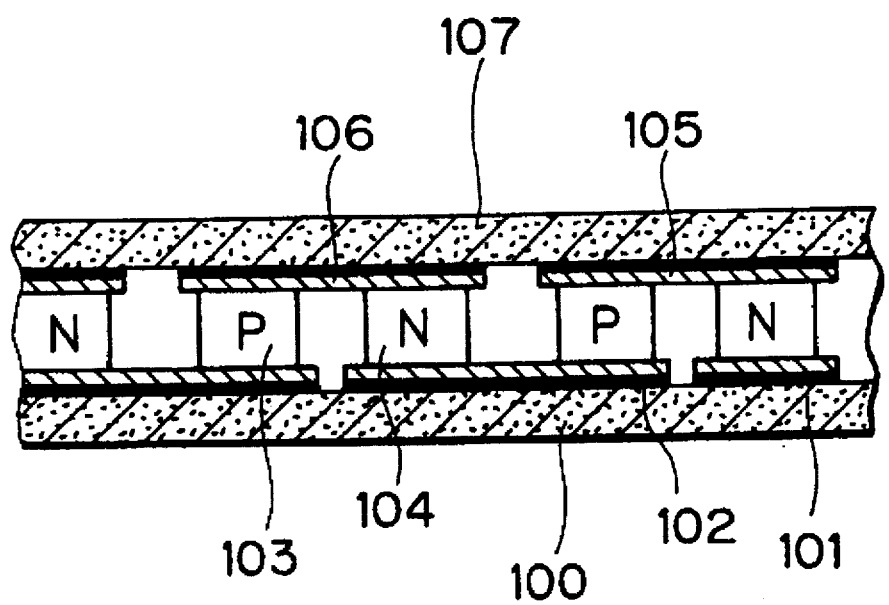
FIG. 56 is an enlarged fragmentary cross-sectional view of a conventional thermoelectric converter.
Figure 57:
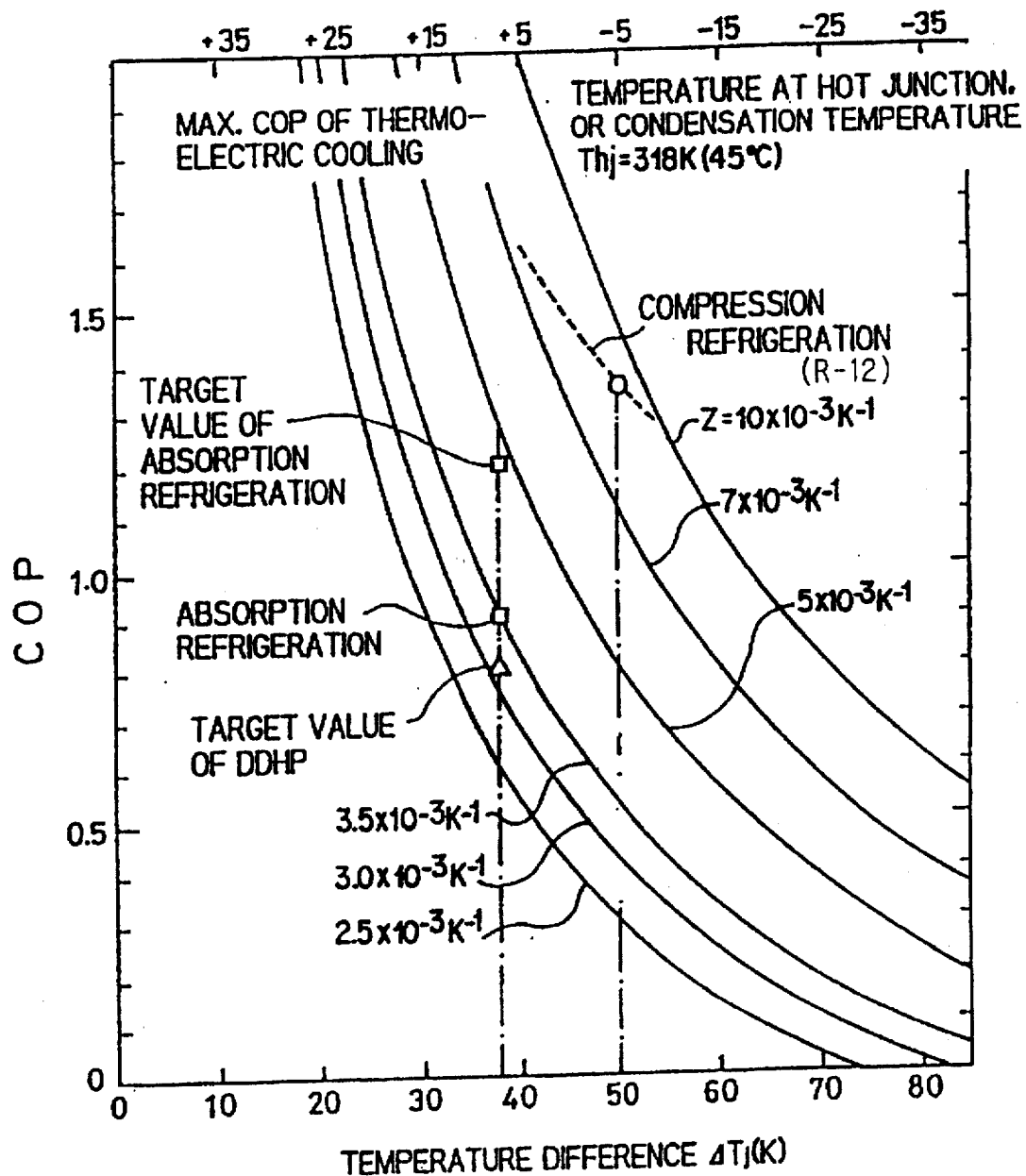
FIG. 57 is a characteristic diagram illustrating relationships between temperature differences and coefficient of performance (COP) in various cooling devices.

FIG. 55 diagrammatically compares in cooling performance between thermoelectric refrigerators similar to that of the first embodiment of the present invention and the conventional compressor-type electric refrigerator.

In this performance test, ten beer bottles (500 ml per bottle) were placed in each refrigerator of 60 liters in capacity. Under the condition that the surrounding temperature was set at 30° C., it was tested how the beer would be cooled.

In the diagram, the curves X,Y correspond to the thermoelectric refrigerators similar to that of the first embodiment of the present invention, while the curve Z corresponds to the conventional compressor-dependent electric refrigerator. The thermoelectric refrigerator corresponding to the curve X employed 512 semiconductor chips and its power consumption was 106 W, while the thermoelectric refrigerator corresponding to the curve Y used the same number of semiconductor chips and its power consumption was 48 W.

As is readily appreciated from the diagram, the thermoelectric refrigerators according to the present invention have been substantiated to have superior cooling performance to the conventional compressor-type electric refrigerator.

What is claimed is:

1. A process for controlling a thermoelectric converter composed of:

a number of p-type semiconductor chips and n-type semiconductor chips arranged side by side and electrically connected in series, a heat-absorbing-side heat conductor arranged on a heat-absorbing side of said p-type and n-type semiconductor chip, a heat-dissipating-side heat conductor arranged on a heat-dissipating side of said p-type and n-type semiconductor chips; and means for feeding a current, the process comprising the steps of: selecting a particular current having a density in a current density range selected depending on a thickness of said p-type and n-type semiconductor chips; and feeding said particular selected current to said p-type and n-type semiconductor chips.

2. A process for controlling current to a thermoelectric converter according to claim 1, wherein said current feeding means makes said density of said current higher within said selected current density range when said thickness of said p-type and n-type semiconductor chips is small but makes said density of said current lower within said selected current density range when said thickness of said p-type and n-type semiconductor chips is large.

3. A process for controlling current to a thermoelectric converter according to claim 1 or 2, wherein heat-absorbing-side and heat-absorbing-side electrodes are arranged to connect said p-type and n-type semiconductor chips together on said heat absorbing and dissipating sides, respectively; and filler-containing silicone grease layers are interposed between said heat-absorbing-side electrode and heat conductor and between said heat-dissipating-side electrode and heat conductor, respectively.

4. A process for controlling current to a thermoelectric converter according to claim 1 or 2, wherein heat-absorbing-side and heat-absorbing-side electrodes are arranged to connect said p-type and n-type semiconductor chips together on said heat absorbing and dissipating sides, respectively; and said heat-absorbing-side and heat-absorbing-side electrodes are fixed on substrates having electrical insulating property, respectively, and are held between the corresponding substrates and said semiconductor p-type and n-type semiconductor chips.

5. A process for controlling current to a thermoelectric converter according to claim 3, wherein said heat-absorbing-side and heat-dissipating-side heat conductors are each provided, on a surface thereof facing the associated silicone grease layer, with a thin electrical insulating layer formed thereon.

6. A process for controlling current to a thermoelectric converter according to claim 1 or 2, wherein said heat-absorbing-side and heat-dissipating-side heat conductors are each provided with fins and a fan for forcedly feeding air against said fins.

7. A process for controlling current to a thermoelectric converter according to claim 6, wherein said thermoelectric converter further comprises heat pipes and said fins are arranged on said heat pipes.

8. A process for controlling current to a thermoelectric converter according to claim 1 or 2, wherein said heat-absorbing-side and heat-dissipating-side heat conductors are each provided with a radiator for the promotion of a transfer of heat.

9. A process for controlling current to a thermoelectric converter according to claim 1 or 2, wherein said thermoelectric converter is a thermoelectric cooling device for a thermoelectric refrigerator and, when said thermoelectric refrigerator has an external temperature of 30° C. and an internal temperature of 5° C., has a coefficient of performance of at least 0.6.

* * * * *